United States Patent [19]
Komori

[11] Patent Number: 5,937,118
[45] Date of Patent: Aug. 10, 1999

[54] QUANTUM SYNTHESIZER, THZ ELECTROMAGNETIC WAVE GENERATION DEVICE, OPTICAL MODULATION DEVICE, AND ELECTRON WAVE MODULATION DEVICE

[75] Inventor: Kazuhiro Komori, Tsukuba, Japan

[73] Assignee: Agency of Industrial Science & Technology, Tokyo, Japan

[21] Appl. No.: 08/832,205

[22] Filed: Apr. 8, 1997

[30] Foreign Application Priority Data

May 30, 1996 [JP] Japan ................................. 8-136864
Dec. 13, 1996 [JP] Japan ................................. 8-333550

[51] Int. Cl.$^6$ .............................. G02B 6/26; H01L 29/15
[52] U.S. Cl. ............................ 385/27; 257/14; 372/45; 385/1; 385/15; 385/39; 385/131
[58] Field of Search ......................... 385/1, 15, 27, 385/39, 131; 372/33, 43–50; 257/14, 25

[56] References Cited

U.S. PATENT DOCUMENTS

| | | | |
|---|---|---|---|
| 4,745,452 | 5/1988 | Sollner | 372/43 X |
| 4,970,563 | 11/1990 | Gaylord et al. | 385/131 X |
| 5,036,371 | 7/1991 | Schwartz | 257/14 |
| 5,457,709 | 10/1995 | Capasso et al. | 372/45 |
| 5,553,090 | 9/1996 | Yamada | 372/45 |

OTHER PUBLICATIONS

K. Leo et al., Coherent Oscillations of a Wave Packet in a Semiconductor Double–Quantum–Well Structure, Phys. Rev. Lett. Vol. 66 (2), 201–204 (Jan. 14, 1991).

H.G. Roskos et al., Coherent Submillimeter–Wave Emission from Charge Oscillations in a Double–Well Potential, Phys. Rev. Lett. vol. 68 (14), 2216–2219 (Apr. 6, 1992).

P.C.M. Planken et al., Terahertz Emission in Single Quantum Wells after Coherent Optical Excitation of aLight Hole and Heavy Hole Excitons, Phys. Rev. Lett Vol. 69 (26), 3800–3803 (Dec. 28, 1992).

J.A. del Alamo and C.C. Eugster, Quantum Field–Effect Directional Coupler, Appl. Phys Lett. 56 (1), 78–80 (Jan. 1, 1990).

N. Tsukada et al. Proposal of Novel Electron Wave Coupled Devices, Appl. Phys Lett. 56 (25), 2527–2529 (Jun. 18, 1990).

K. Komori et al. Fabrication of Coupled Quantum–Wires Toward Ultra–High Speed Optoelectronic Devices, Technical Report of IEICE (Feb. 1996), pp. 13–16.

*Primary Examiner*—John D. Lee
*Attorney, Agent, or Firm*—Workman, Nydegger & Seeley

[57] ABSTRACT

A device capable of obtaining an electromagnetic wave having an arbitrary waveform and an arbitrary frequency, generating an electromagnetic wave with an ultrahigh frequency, generating an electromagnetic wave with a variable frequency, and performing ultrafast optical control and optical modulation is provided. The quantum synthesizer of the present invention has a quantum synthesis portion comprising a number, n (n=an integer of 3 or more), of quantum wells provided in proximity to each other so as to be coupled together quantum-mechanically, each of the n number of quantum wells having the n number or number larger than n of coupled levels as a result of coupling, and is adapted to excite and synthesize the electron waves or polarizations of the respective levels, while controlling their phases and amplitudes, by means of coded light with phases and amplitudes controlled for predetermined frequencies (energies).

10 Claims, 52 Drawing Sheets

QUANTUM SYNTHESIZER

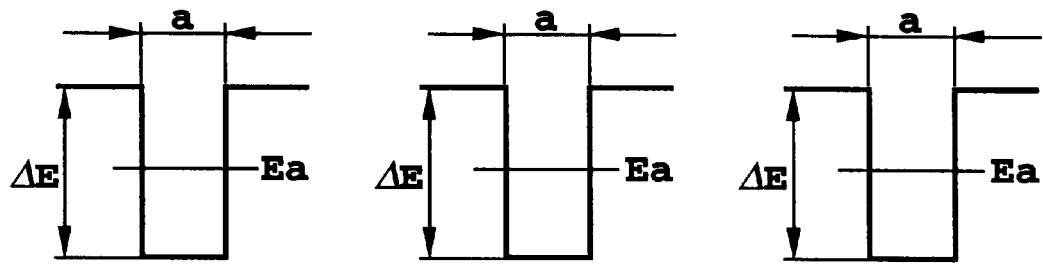
FIG.8A
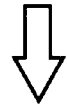
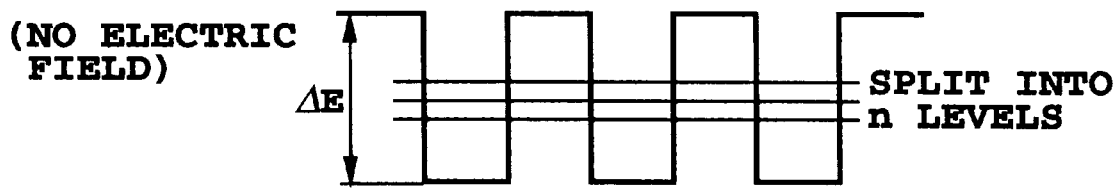
FIG.8B

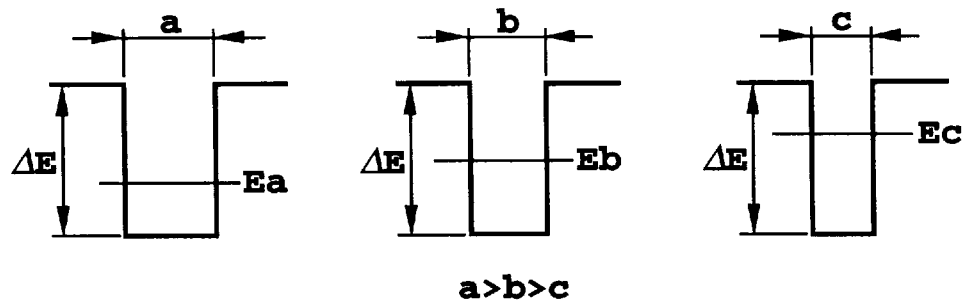
*FIG.9A*
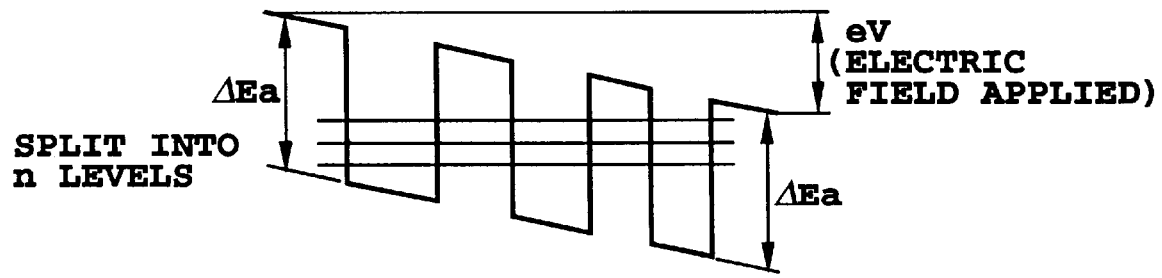
*FIG.9B*

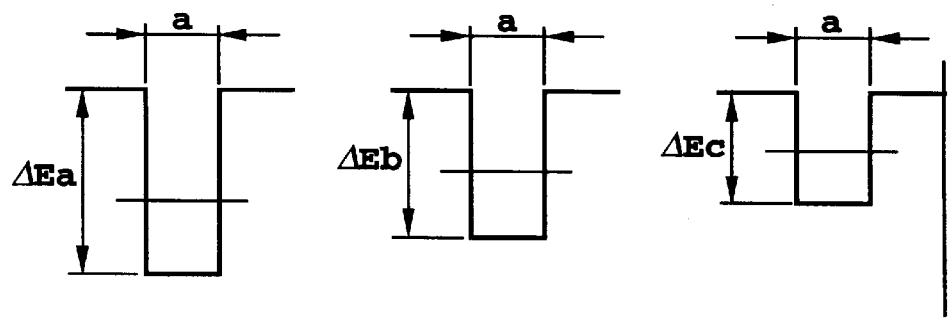
FIG.10A
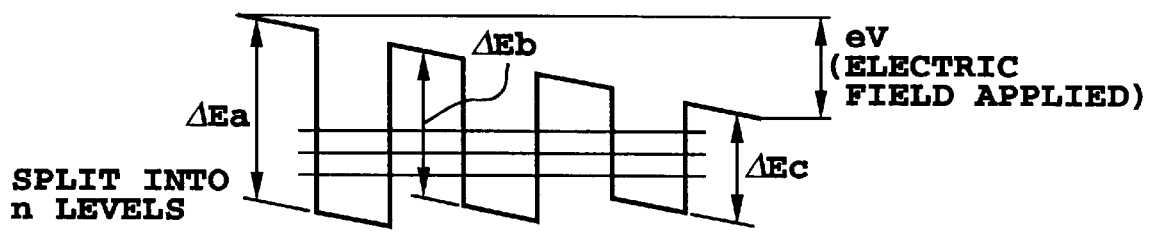
FIG.10B

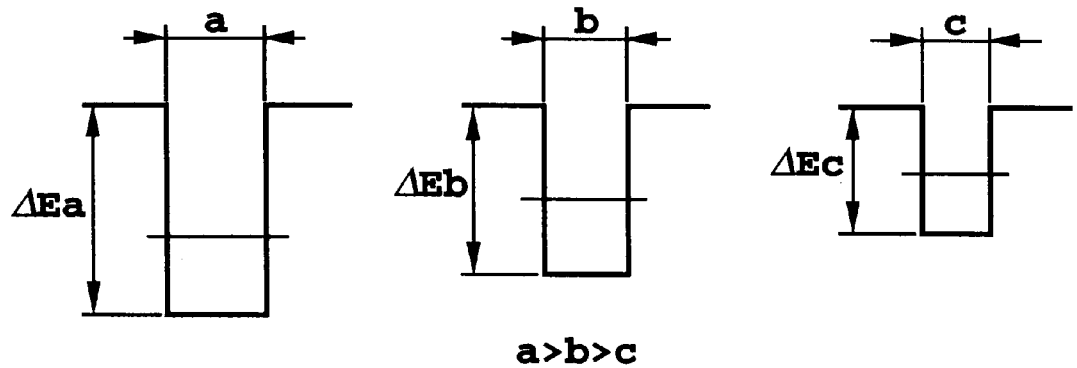
FIG.11A
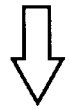
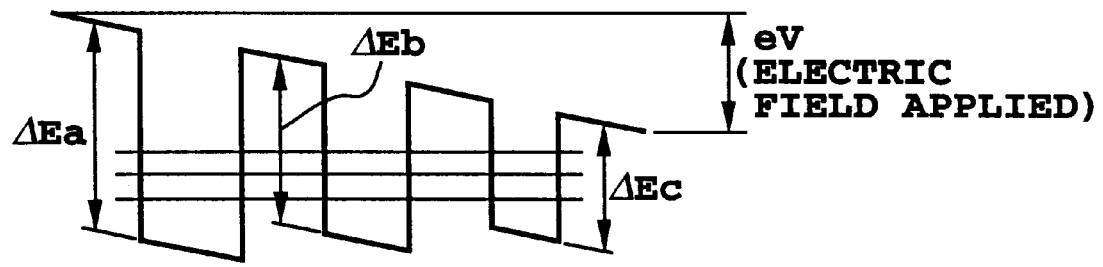
FIG.11B

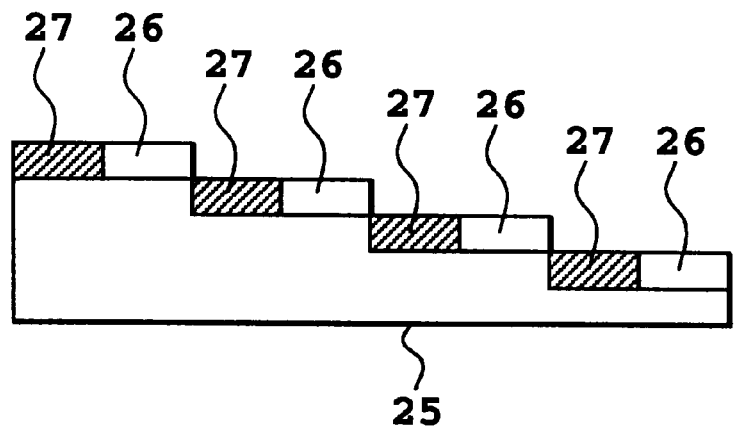
FIG.14A
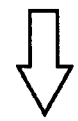
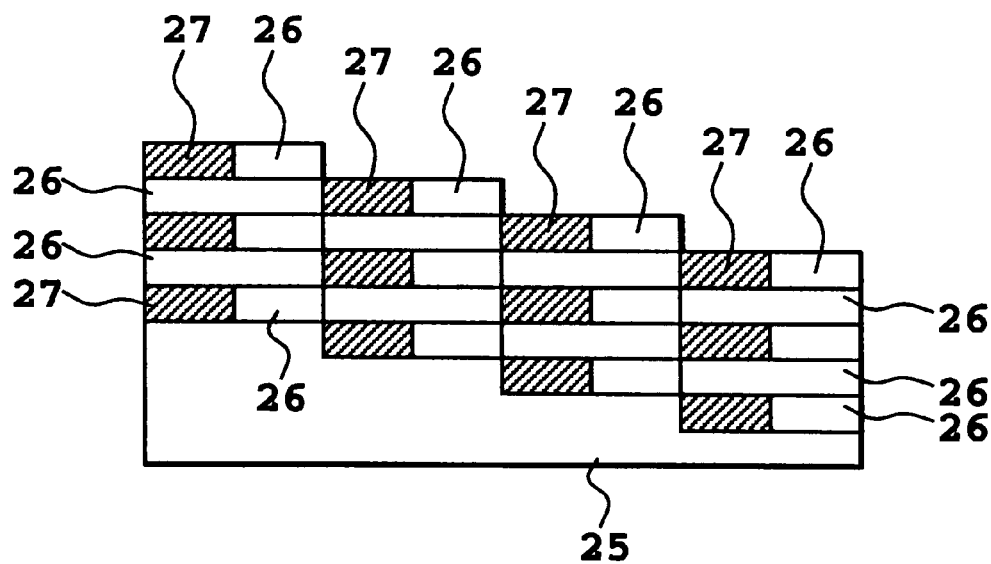
FIG.14B

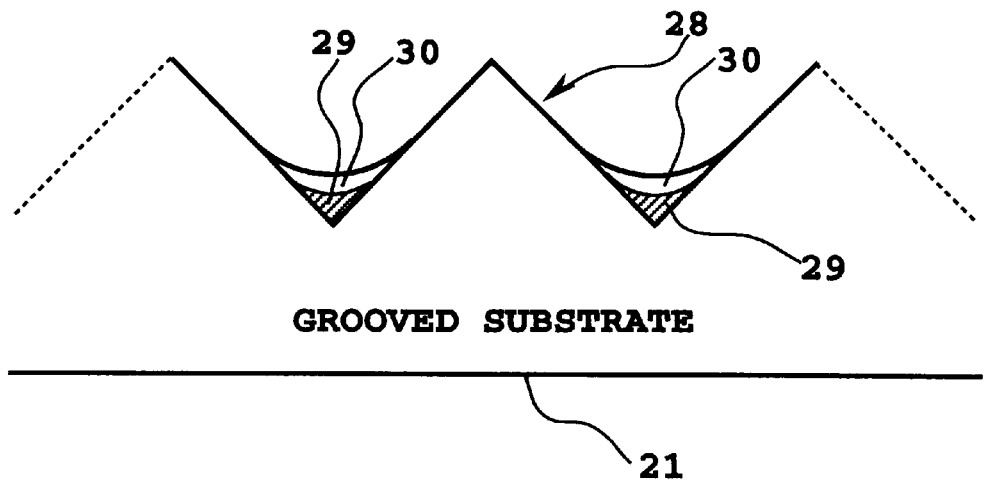
*FIG.15A*
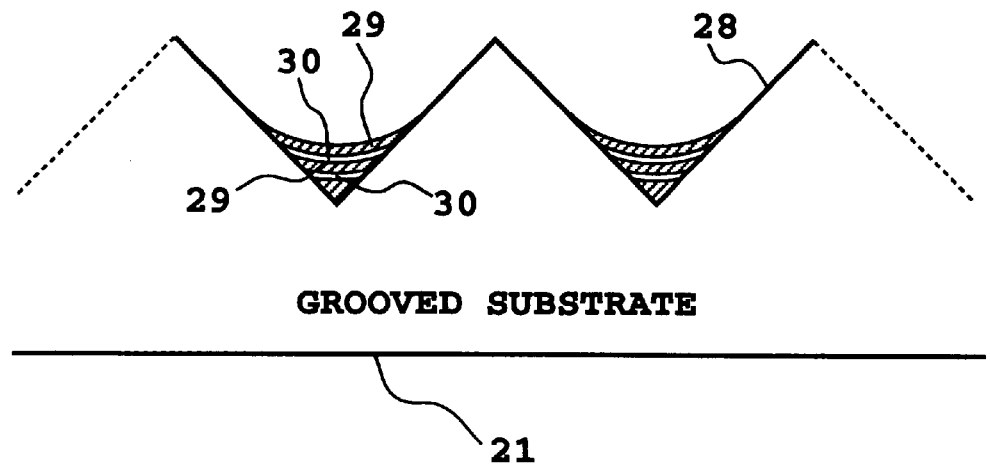
*FIG.15B*

SINGLE ATOM (MOLECULE)

NUMBER(n) OF ATOMS (MOLECULES)

CLOSE n ATOMS (MOLECULES)

QUANTUM SYNTHESIZER

THz ELECTROMAGNETIC WAVE GENERATION DEVICE

QUANTUM SYNTHESIZER

QUANTUM SYNTHESIZER

CODED EXCITATION LIGHT BY FEMTOSECOND LIGHT

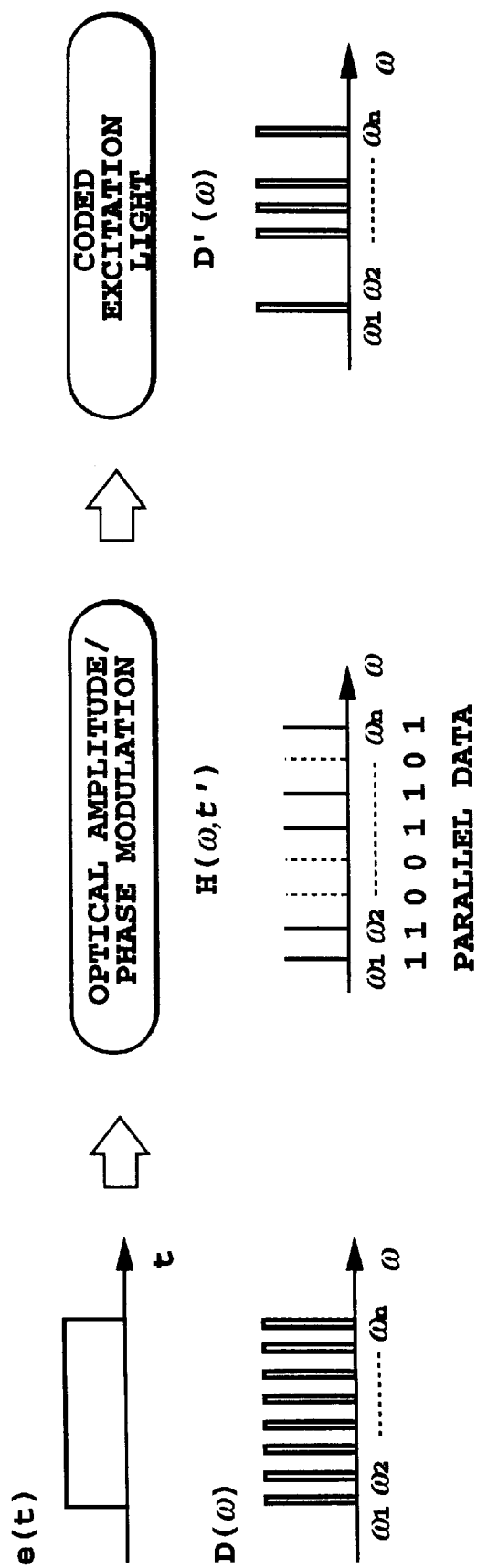

THz ELECTROMAGNETIC WAVE
GENERATION DEICE

QUANTUM SYNTHESIZER

THz ELECTROMAGNETIC WAVE
GENERATION DEICE

INTEGRATED QUANTUM SYNTHESIZER

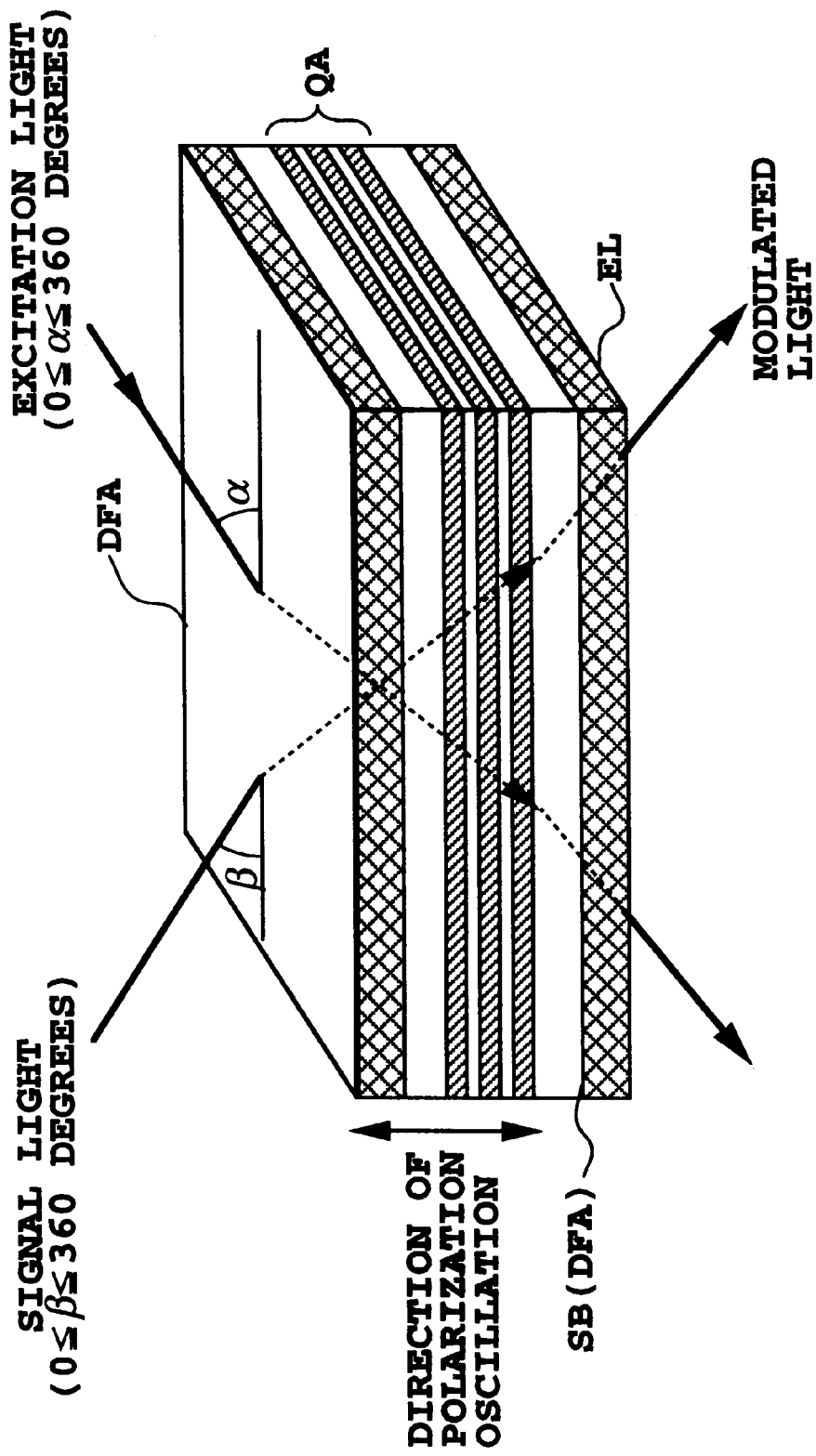

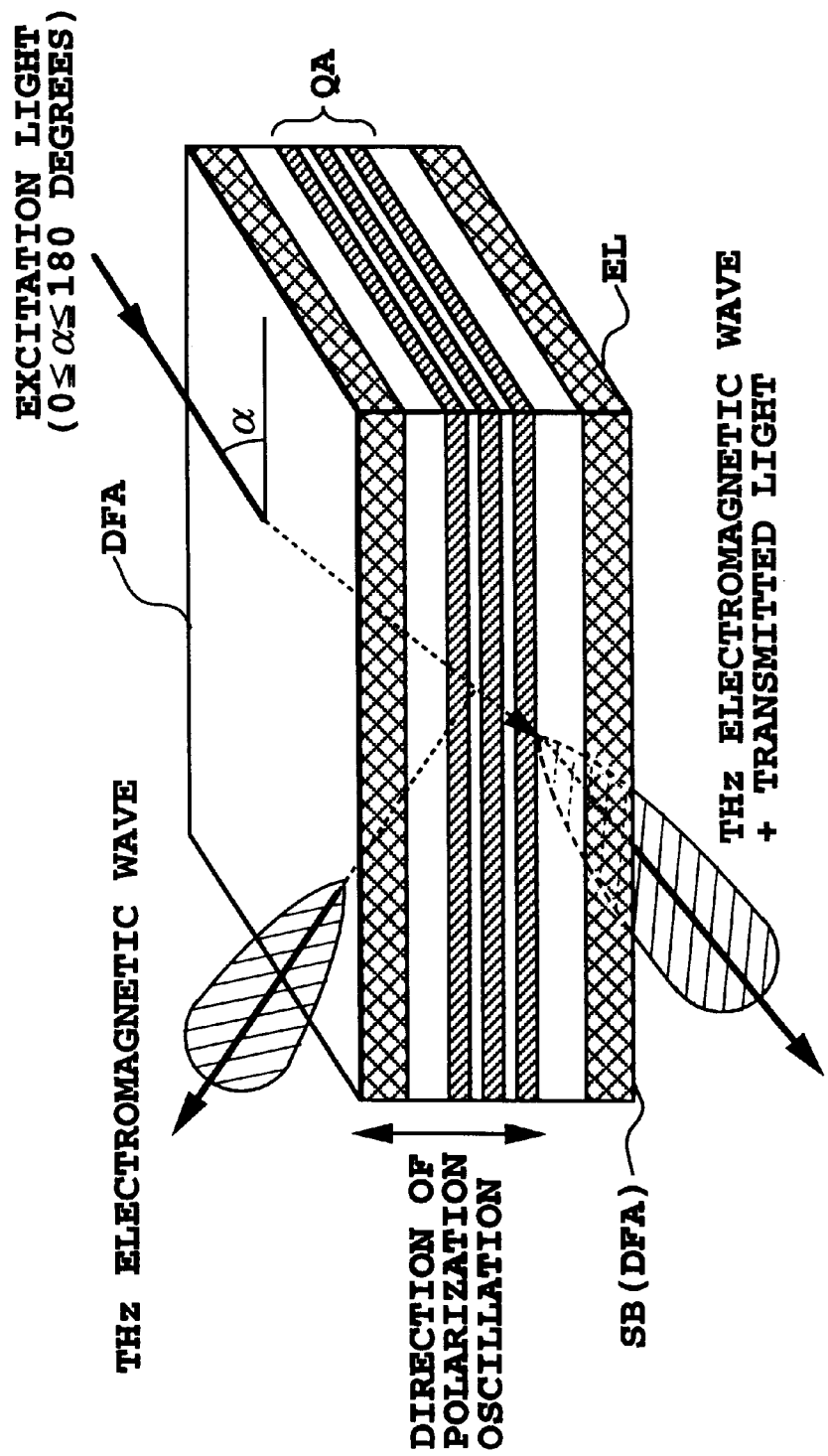
FIG.36B INTEGRATED THz ELECTROMAGNETIC WAVE GENERATION DEVICE

INTEGRATED QUANTUM SYNTHESIZER

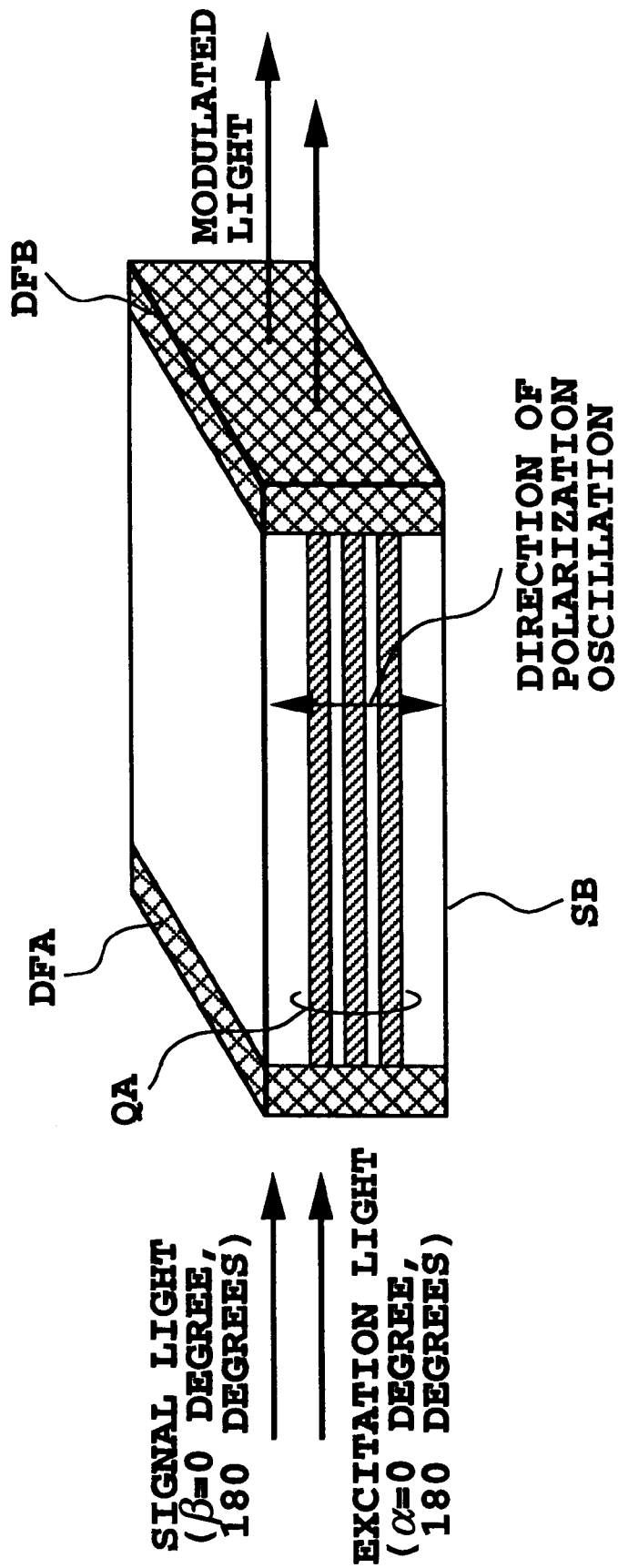
FIG.38A  LIGHT - LIGHT MODULATION DEVICE

THz ELECTROMAGNETIC WAVE GENERATION DEVICE

QUANTUM SYNTHESIZER, THZ ELECTROMAGNETIC WAVE GENERATION DEVICE, OPTICAL MODULATION DEVICE, AND ELECTRON WAVE MODULATION DEVICE

BACKGROUND OF THE INVENTION

1. Field of the Invention

The present invention relates to a novel opto-electronic device capable of generating an electromagnetic wave in the THz region, i.e., an ultrahigh frequency region, as well as controlling and modulating light, and controlling and modulating an electron wave, in the fields of optoelectronic devices.

2. Description of the Related Art

As a high speed phenomenon occurring in a semiconductor, reports have been made of quantum beating, which is an oscillation caused by synthesizing non-scattering, coherent electrons or polarizations during the period from excitation to relaxation. This phenomenon occurs by the following mechanism: Using two coupled levels of semiconductor quantum well structures, the coupled levels in two excited states are simultaneously excited with an ultrashort optical pulse of a duration shorter than the relaxation time. As a result, beating occurs between the two wave functions, and charges present in the wells oscillate between the coupled quantum wells at the frequency of the beat. This oscillation acts as a very small dipole antenna, generating a THz electromagnetic wave of a frequency corresponding to the oscillation period. A THz electromagnetic wave generation device utilizing this beating phenomenon has recently been reported by AT&T Bell Laboratories.

The THz electromagnetic wave generation devices using quantum beating that have thus far been reported are shown in FIGS. 1 to 5.

The quantum well structure of FIG. 1 (K. Leo et al., Phys. Rev. Lett. 66(1991), p.201 and H. G. Roskos et al., Phys. Rev. Lett. 68(1992), p. 2216) is an asymmetric coupled quantum well structure comprising two quantum wells of different layer thicknesses (i.e., a wide well "WW" of a large layer thickness $w_A$ and a narrow well "NW" of a small layer thickness $w_B$) coupled by a thin barrier through which electrons can tunnel. The principle of its action is illustrated in FIG. 2.

That is, in this quantum well structure, when an electric field is applied, the quantized energy level of the wide well "WW" having the well width $w_A$ and the quantized energy level of the narrow well "NW" of the well width wB coincide with each other in the conduction band. This resonant coupling results in the split of the energy level of the conduction band into two energy levels E1 and E2. In the valence band of the quantum well structure, on the other hand, the quantized energy levels of holes, E0, do not coincide between the two quantum wells, so that the holes are separated between the two wells. When, in this state, the two levels are co-excited with an ultrashort pulse having a broad frequency band including the frequencies f1 represented by the equation: f1=(E1−E0)/h and f2 represented by the equation: f2=(E2−E0)/h, the wave functions ψ1 and ψ2 occur respectively at the same time, as shown in FIG. 2. Since their oscillation periods are different, the function obtained by the synthesis of these two wave functions, ψA=ψ1+ψ2, is expressed, at t=0, by the following equation:

$$\psi A(t=0)=\psi 10+\psi 20 \qquad (1)$$

and is expressed, at t=t, by the following equation:

$$\psi A(t)=\psi 10 \cdot \exp(-i2\pi E1 \cdot t/h)+\psi 20 \cdot \exp(-i2\pi E2 \cdot t/h) \qquad (2)$$

This function oscillates at its beat frequency f=(E2−E1)/h. The resulting electron wave packet oscillates between the left and right quantum wells at the beat period. When ΔE=E2−E1=10 meV, the beat frequency f is about 2.4 THz. In this manner, a THz electromagnetic wave is generated.

Another type of quantum well structure is shown in FIG. 3 (P. C. M. Planken et al., Phys. Rev. Lett., 69(1992), p.3800), which is a single quantum well structure and in which beats are generated by simultaneously exciting the two energy levels, E1 and E2, of heavy holes (hh) and light holes (lh) of the valence band.

Instead of optical excitation, injection of an electron wave is under consideration as a means for simultaneously exciting two wave functions. FIGS. 4A to 4C (J. A. Alamo et al., Appl. Phys. Lett. 56(1990), p. 78 and N. Tsukada et al., Appl. Phys. Lett. 56(1990), p. 2527) show an example the electron wave coupled device which generates quantum beats by electron injection, in which FIG. 4A is a top view of the device, and FIGS. 4B and 4C are sectional views illustrating depletion layers with and without an electric field applied, respectively. FIG. 5 is an explanatory drawing for the actions of the device. Its quantum wires are quantum wells where electrons are confined in the direction of the thickness by heterobarriers laid in the direction of the layer thickness. Another dimensional confinement is performed by applying an electric field to part of the quantum well to deplete it so that electrons are confined at the boundaries of the depletion regions. This means that in FIG. 4A, the portions other than the electron waveguide are applied the electric field, and thereby depleted, while only the non-depleted portions of the electron waveguide have electrons confined to guide their propagation. By varying the electric field to be applied to the portion shown in FIG. 4A in comparison with other portions, the confinement potential can be changed to vary the degree of the coupling between the two electron waveguides. When the electric field or voltage (V) is large, as shown in FIG. 4B, the shaded depletion layers (regions) broaden deeply to separate the two electron waveguides. On the contrary, when the electric field or voltage (V) is small, as shown in FIG. 4C, the depletion layers become shallow, so that the distribution of an electron wave in one electron waveguide spreads to the next waveguide, thereby coupling the two electron waveguides. Such control of coupling of electron wave guides by applying by an electric field is described in the paper by M. Okada et al., "Japanese Journal of Applied Physics", Vol. 27, No. 12, pp. L2424, 1988).

Using the foregoing method, as shown in FIG. 4A, two electron waveguides are coupled at the portions A and B to form a coupled electron waveguide device, and an electron wave is injected through port (electrode) C to propagate it to portion A. On this occasion, as shown in FIG. 5, the two electron waveguides are coupled at the portion A, whereby energy levels E1 and E2 having a symmetric wave function ψ1 and an asymmetric wave function ψ2, respectively, are formed. The wave functions ψ1 and ψ2 are formed at the same time with the same phase when the electron wave packets are injected or excited at t=0. The function obtained by the synthesis of these two wave functions, ψA=ψ1+ψ2, is expressed, at t=0, by the following equation:

$$\psi A(t=0)=\psi 10+\psi 20 \qquad (3)$$

and is expressed, at t=t, by the following equation:

$$\psi A(t) = \psi 10 \cdot \exp(-i2E1 \cdot t/h) + \psi 20 \cdot \exp(-i2\pi E2 \cdot t/h) \quad (4)$$

as in the example of FIGS. 1 and 2. As the electron wave packet propagates in the A–A' direction in FIG. 4A, it oscillates between the waveguide A–A' and the waveguide B–B'. In this case, the period of the oscillation (beat frequency) (f) is expressed by the equation: $f=(E2-E1)/h$. As with the previous example, the oscillation leads to the generation of a THz electromagnetic wave.

The inventors have further formed two GaAs/AlGaAs quantum wire structures in proximity to each other, and investigated their luminous properties. As a result, the inventors have found that these quantum wire structures (quantum wells) are coupled in a quantal manner (Technical Report of IEICE, Vol. 95, No. 519, pp. 13–16, and Appl. Phys. Lett. Vol.68, No.24, p.3787, June, 1996).

With the prior art, however, the period of oscillation is determined by the difference in energy between two levels, and the oscillation which will be obtained is limited for polarizations formed from electrons and holes. Thus, it has been difficult to obtain polarizations having an desired oscillation and an arbitrary time course, and it also has been difficult to manipulate the oscillation and polarization. For THz electromagnetic wave radiation accompanying the polarization oscillation, there also has a difficulty in obtaining an electromagnetic wave having an arbitrary frequency and an arbitrary waveform, and an electromagnetic wave having a variable frequency. For an excited electron wave, formation of an arbitrary electron wave has been difficult.

SUMMARY OF THE INVENTION

Accordingly, the object of the present invention is to achieve a device capable of solving the above-described problems with the prior art, and obtaining an electromagnetic wave having an arbitrary waveform and an arbitrary frequency, namely, generating an electromagnetic wave of an ultrahigh frequency and generating an electromagnetic wave of a variable frequency, as well as performing ultrafast optical control and optical modulation.

That is, it is an object of the present invention to provide a quantum synthesizer having a quantum synthesis portion comprising a number, n (n=an integer of 3 or more), of quantum wells provided in proximity to each other so as to be coupled together quantum-mechanically, the quantum synthesis portion having the n number or number larger than n of coupled levels as a result of coupling, the quantum synthesizer being adapted to excite and synthesize the electron waves or polarizations of each of the coupled levels, while controlling the phase and amplitude of the electron wave or polarization in each of the coupled levels, by means of coded light with phases and amplitudes controlled for predetermined frequencies.

Here, each of the n number (n=an integer of 3 or more) of quantum wells may be a quantum wire, or a quantum box, or an atom, or a molecule.

Here, the number of coupled levels will be described. Desirably, the respective quantum wells before coupling each have a single quantum level. In this case, the quantum wells each have the n number of coupled levels after coupling, and these n levels are used for quantum synthesis. Besides, when the respective quantum wells before coupling each have a plurality of quantum levels, particular coupled n levels of them can be used for quantum synthesis. In this case, the level of each quantum well, i, before coupling is designated as Si, which comprises level 1, level 2, level 3 . . . level j . . . level Si, in the order of increasing energy. After coupling, the number of levels of each quantum well is the sum of $S1+S2+ \ldots +Sn = \Sigma Si$. At this time, the level with the same level designation (when the level j is existent throughout the n number of quantum wells), this level is split into the n number of coupled levels as a result of coupling. By utilizing these coupled n levels, quantum synthesis is permitted.

Here, in case of a quantum well (a two-dimensional semiconductor), each level has a spread of energy, tending to result in a overlap between the adjacent levels. To excite the respective levels independently, it is important that the overlap between the adjacent levels be small. Thus, each of the above-described n number of quantum wells should desirably be a quantum wire (a one-dimensional semiconductor) or a quantum box (a zero-dimensional semiconductor). However, even a quantum well can be fully used, if cooled to such a low temperature as to bring about an excitonic state, thereby suppressing the extension of electronic energy. At low temperatures, the electrons and holes in the quantum well form a stable state, the excitonic state. The spread of energy in this state is very limited. The quantized energy level in the quantum box is similar to that in the atom or molecule. In the light of these facts, an n-atom structure or an n-molecule structure comprising atoms or molecules coupled together n-fold is also usable as a quantum synthesizer.

It is another object of the present invention to provide a THz electromagnetic wave generation device having a quantum synthesis portion comprising a number, n (n=an integer of 3 or more), of quantum wells provided in proximity to each other so as to be coupled together quantum-mechanically, the quantum synthesis portion having the n number or number larger than n of coupled levels as a result of coupling, the quantum synthesizer being adapted to excite and synthesize the electron waves or polarizations of each of the coupled levels, while controlling the phase and amplitude of the electron wave or polarization in each of the coupled levels, by means of coded light with phases and amplitudes controlled for predetermined frequencies, thereby generating a THz electromagnetic wave having a frequency distribution or waveform corresponding to the coded light.

Here, each of the n number of quantum wells may be a quantum wire, a quantum box, an atom or a molecule.

It is still another object of the invention to provide an optical modulation device having:

a quantum synthesis portion comprising a number, n (n=an integer of 3 or more), of quantum wells provided in proximity to each other so as to be coupled together quantum-mechanically, the quantum synthesis portion having the n number or number larger than n of coupled levels as a result of coupling, the quantum synthesizer being adapted to excite and synthesize the electron waves or polarizations of each of the coupled levels, while controlling the phase and amplitude of the electron wave or polarization in each of the coupled levels, by means of coded light with phases and amplitudes controlled for predetermined frequencies;

means for inputting signal light into the quantum synthesizer; and means for inputting control light for modulating the signal light into the quantum synthesizer, the control light being a coded ultrashort light pulse or a coded phase-locked multiwavelength light.

Here, each of the n number of quantum wells may be a quantum wire, a quantum box, an atom or a molecule.

It is still another object of the present invention to provide a quantum synthesizer having a quantum synthesis portion comprising a number, n (n=an integer of 3 or more), of electron waveguides provided in proximity to each other so as to be coupled together quantum-mechanically, the quantum synthesis portion having the n number or number larger than n of coupled levels as a result of coupling, the quantum synthesizer being adapted to input excitation electron waves with phases and amplitudes controlled for predetermined energies into at least one of the electron waveguides of the quantum synthesis portion and then synthesize the excitation electron waves.

It is still another object of the invention to provide a THz electromagnetic wave generation device having a quantum synthesis portion comprising a number, n (n=an integer of 3 or more), of electron waveguides provided in proximity to each other so as to be coupled together quantum-mechanically, the quantum synthesis portion having the n number or number larger than n of coupled levels as a result of coupling, the THz electromagnetic wave generation device being adapted to input excitation electron waves with phases and amplitudes controlled for predetermined energies into at least one of the electron waveguides of the quantum synthesis portion and then synthesize the excitation electron waves, thereby generating a THz electromagnetic wave.

It is still another object of the invention to provide an electron wave modulation device comprising:

a quantum synthesizer having a quantum synthesis portion comprising a number, n (n=an integer of 3 or more), of electron waveguides provided in proximity to each other so as to be coupled together quantum-mechanically, each of the n number of electron waveguides having the n number or number larger than n of coupled levels as a result of coupling, the quantum synthesizer being adapted to input excitation electron waves with phases and amplitudes controlled for predetermined energies into at least one of the electron waveguides of the quantum synthesis portion and then synthesize the excitation electron waves;

means for inputting an electron wave as a signal wave into the quantum synthesizer; and means for inputting a control electron wave for modulating the signal electron wave into the quantum synthesis portion, the control electron wave being an electron wave with controlled phases and amplitudes.

The above and other objects, effects, features and advantages of the present invention will become more apparent from the following description of embodiments thereof taken in conjunction with the accompanying drawings.

BRIEF DESCRIPTION OF THE DRAWINGS

FIGS. 4A to 4C are views showing an example of a conventional coupled electron wave device, which can be used to generate quantum beats, in which FIGS. 4A to 4C are a top view, a sectional view showing an isolated state and a sectional view showing a coupled state of the device, respectively;

FIGS. 7A to 7D are views illustrating a structural example of the quantum synthesizer according to the invention, in which FIG. 7A is a sectional view of the structure, FIG. 7B is a view showing the energy level of the quantum synthesis portion, FIGS. 7C and 7D are views illustrating the coupled energy level of the quantum synthesis portion;

FIGS. 8A and 8B are views illustrating the energy level of a symmetric quantum synthesizer, in which FIG. 8A shows the energy level before coupling and FIG. 8B shows the energy level after coupling;

FIGS. 9A and 9B are views illustrating the energy levels of an asymmetric quantum synthesizer, in which FIG. 9A shows the energy level before coupling and FIG. 9B shows the energy level after coupling;

FIGS. 10A and 10B are views illustrating the energy levels of another type of asymmetric quantum synthesizer, in which FIG. 10A shows the energy level before coupling and FIG. 10B shows the energy level after coupling;

FIGS. 11A and 11B are views illustrating the energy levels of still another type of asymmetric quantum synthesizer;

FIGS. 12A to 12C are perspective views showing a structural example of a quantum synthesizer according to the invention, in which FIG. 12A shows the multi-coupled quantum well structure of FIG. 7, FIG. 12B shows a multi-coupled quantum wires and FIG. 12C shows a multi-coupled quantum boxes;

FIGS. 14A and 14B are views showing another fabrication method of quantum-wires for quantum synthesizer according to the invention;

FIGS. 15A and 15B are views showing still another fabrication method of quantum-wires for quantum synthesizer according to the invention, in which FIG. 15A shows a single-layer structure and FIG. 15B shows a multi-layer structure;

FIGS. 19A and 19B are views showing an example of the band structure of a quantum synthesizer according to the invention for synthesizing electron waves or polarizations by optical excitation of the quantum synthesizer according to the invention, in which FIG. 19B is an partially enlarged view of the band structure of FIG. 19A;

FIGS. 20A and 20B are views showing an example of the band structure of an excited electron wave or polarization synthesis portion for generating a THz electromagnetic wave by optical excitation of the quantum synthesizer according to the invention, in which FIG. 20B is a partially enlarged view of the band structure of FIG. 20A;

FIGS. 21A and 21B are perspective views illustrating a quantum synthesizer according to the invention, in which FIG. 21A shows an example of incidence on the substrate surface and FIG. 21B shows an example of incidence on the end facet;

FIGS. 22A and 22B are perspective views illustrating a THz electromagnetic wave generation device according to the invention, in which FIG. 22A shows an example of incidence on the substrate surface and FIG. 22B shows an example of incidence on the end facet;

FIGS. 23A to 23C are views illustrating an optical modulation device according to the invention, in which FIG. 23A is a block diagram of the device, FIG. 23B shows an example of concrete placement of the signal light and the control light, and FIG. 23C shows an example of inputting of signal light and excitation light from one end facet;

FIGS. 24A and 24B are views showing an example of the band structure of the excited electron wave or polarization synthesis portion for illustrating the actions of the device of FIG. 23, in which FIG. 24A shows an example of the band structure and FIG. 24B is a partially enlarged view of the synthesis portion;

FIGS. 26A to 26C are diagrams illustrating the actions of an excitation light coding portion using phase-locked multi-wavelength continuous light;

FIGS. 31A and 31B are schematic top views illustrating an embodiment of a quantum synthesizer based on electron wave excitation, in which FIG. 31A shows the entire structure of the device and FIG. 31B shows the quantum synthesis portion of the device;

FIGS. 32A and 32B are schematic top views illustrating an embodiment of THz electromagnetic wave generation by electron wave excitation, in which FIG. 32A shows the entire structure of the device and FIG. 32B shows the quantum synthesis portion of the device;

FIGS. 36A to 36C are perspective views of embodiments of an integrated optically controlled optical modulation device and an integrated THz electromagnetic wave generation device according to the invention, in which FIG. 36A shows an integrated optically controlled optical modulation device, FIG. 36B shows an integrated THz electromagnetic wave generation device and FIG. 36C shows a photonic band structure;

FIGS. 38A and 38B are perspective views of embodiments of an end-facet input type of optically controlled optical modulation device and a THz electromagnetic wave generation device according to the invention, in which FIG. 38A shows an end-facet input type optically controlled optical modulation device and FIG. 38B shows an end-facet incidence type THz electromagnetic wave generation device.

DETAILED DESCRIPTION OF THE INVENTION

Figure 1:
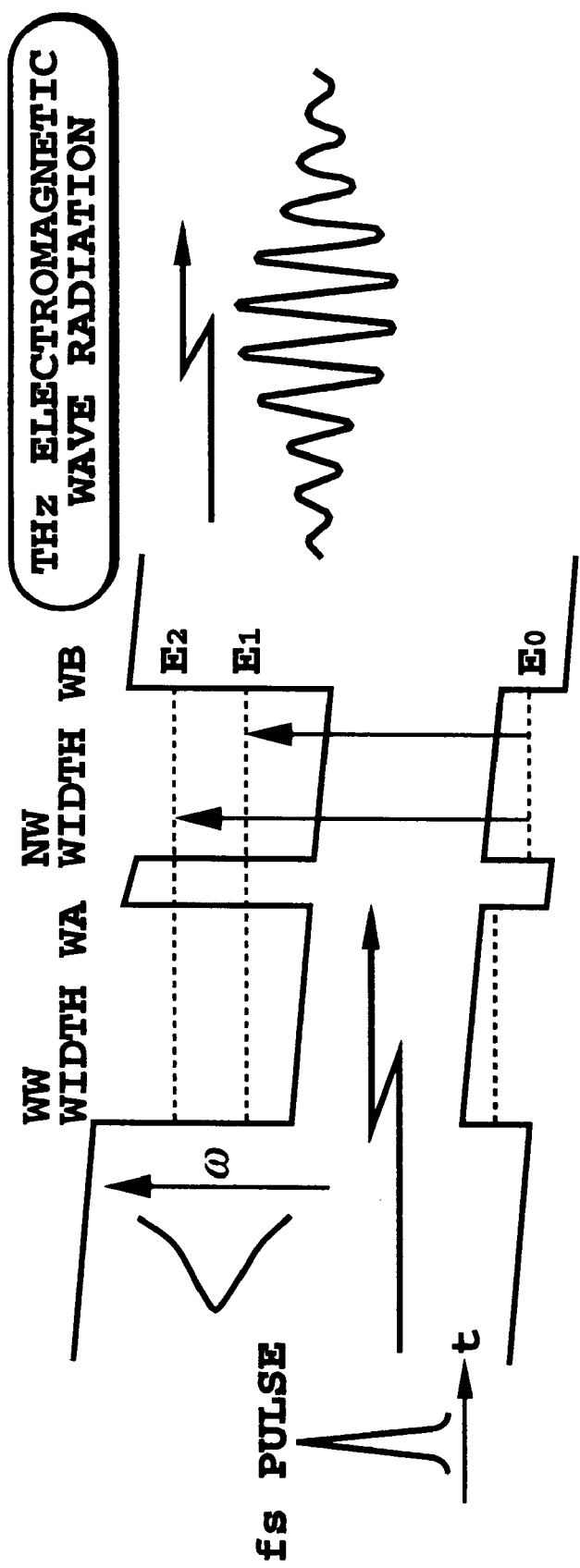
FIG. 1 is a schematic view showing the double quantum well structure of an example of a conventional THz electromagnetic wave generation device.
Figure 2:
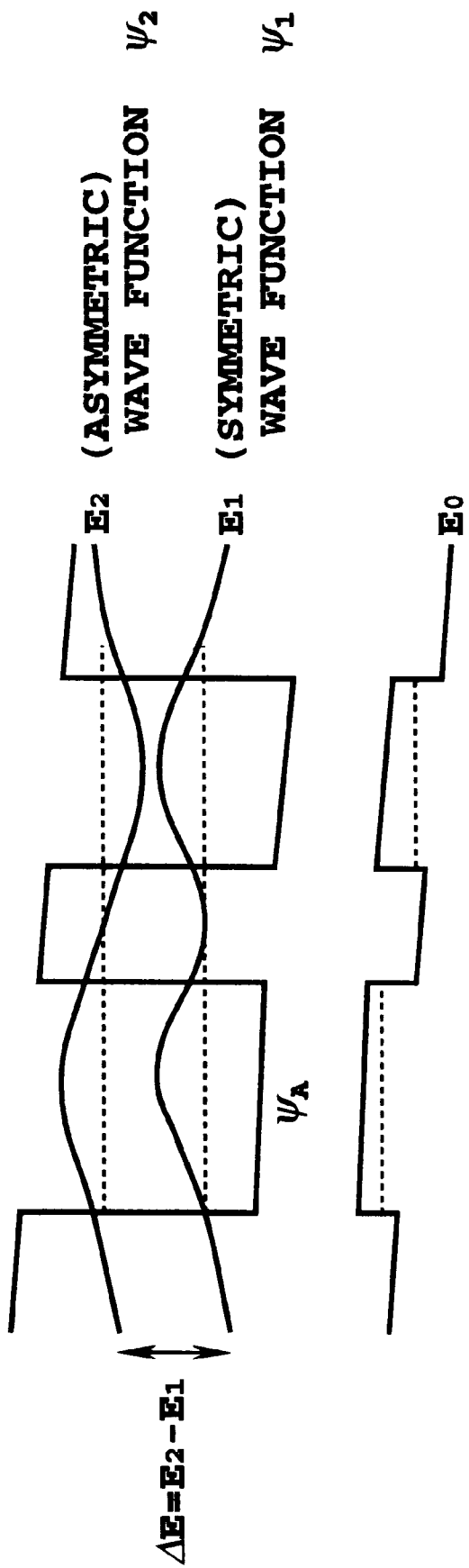
FIG. 2 is an explanatory view illustrating the actions of the device of FIG. 1.
Figure 3:
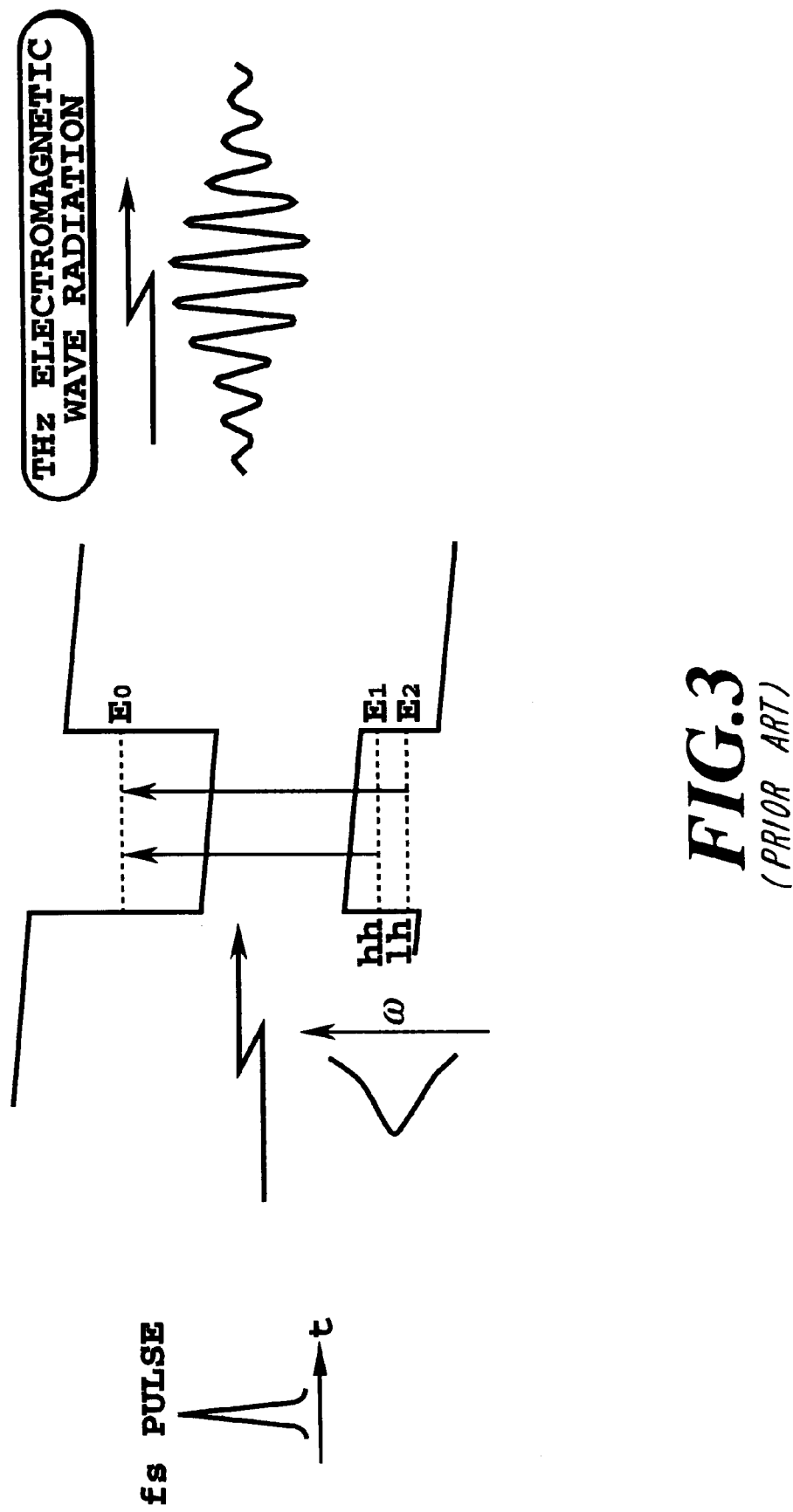
FIG. 3 is a schematic view showing the single quantum well structure of another example of a conventional THz electromagnetic wave generation device.
Figure 4A:
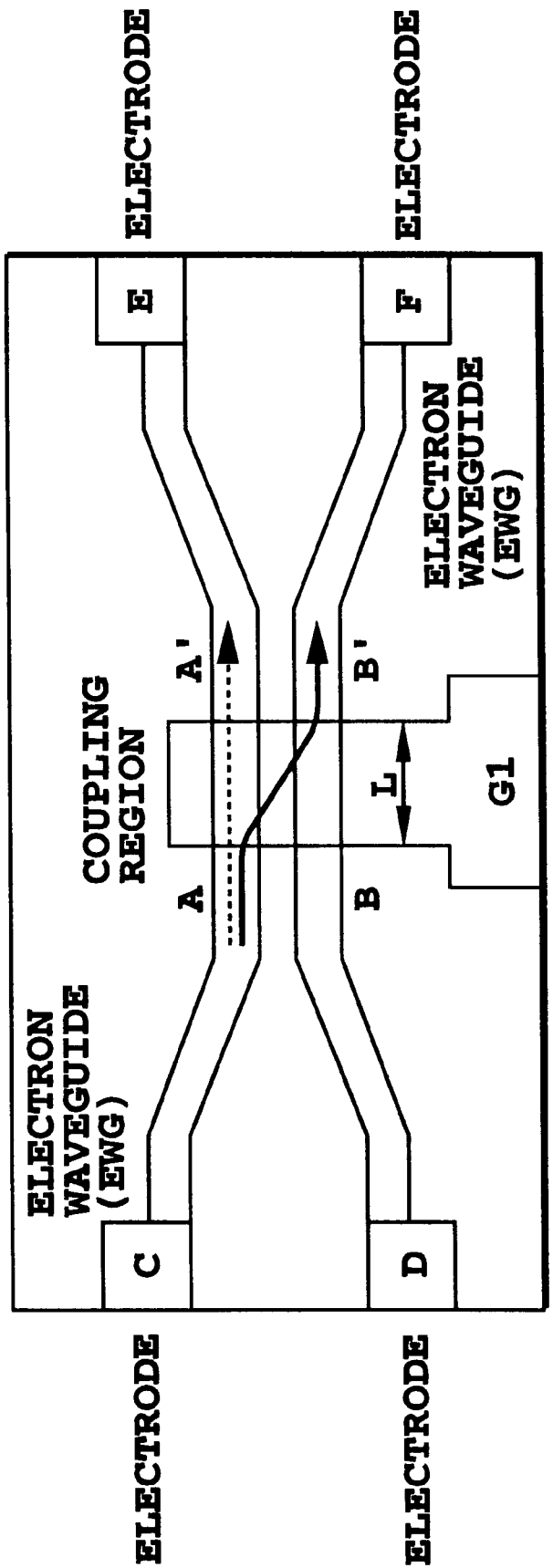
Figure 4B:
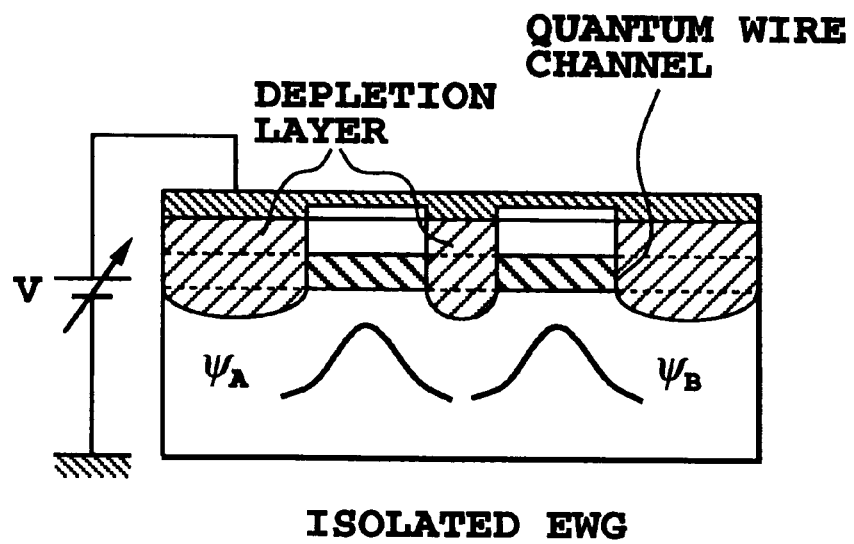
Figure 4C:
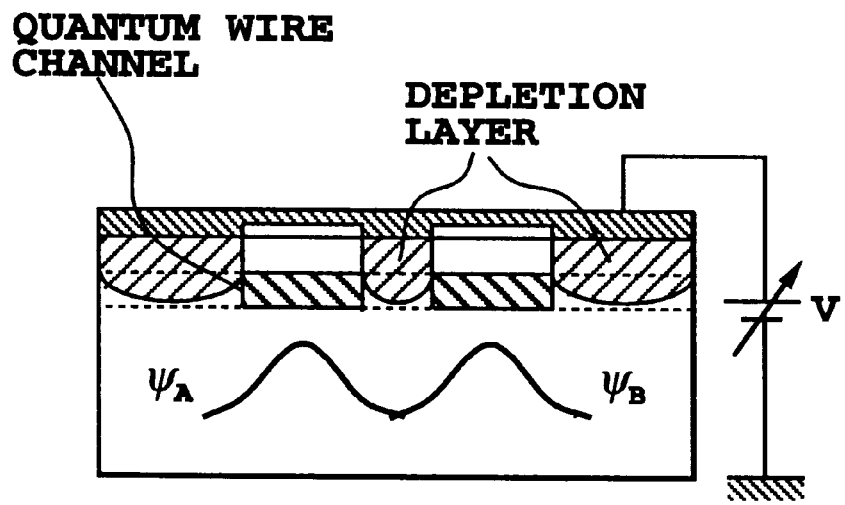
Figure 5:
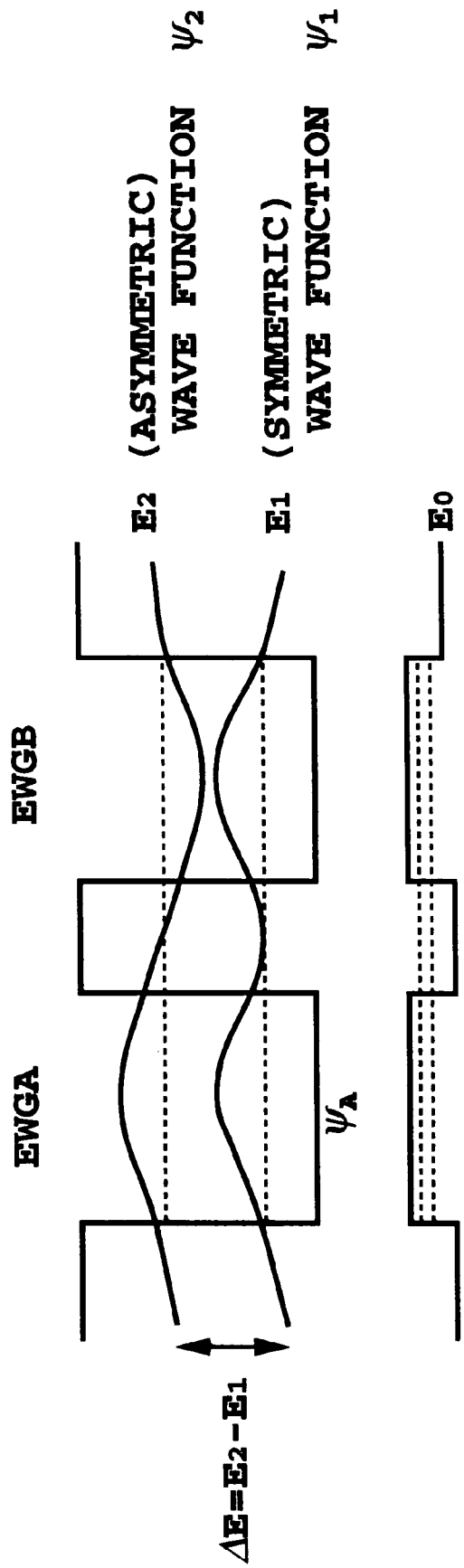
FIG. 5 is a view illustrating the actions of the device of FIGS. 4A to 4C.

To solve the problems with the conventional two-excitation level system, the invention uses a multi-excitation level system comprising a number, n (n=an integer of 3 or more), of excitation levels. According to the invention, in exciting electrons up to each of the excitation levels, the electrons are excited by using the controlling light wave or electron wave in which the phase and amplitude are controlled for each excitation level, thereby enabling the n number of excited wave functions to be generated and synthesized simultaneously.

In the fields of electromagnetic wave and laser technologies, this method is called a synthesizing technique for use in generating an electromagnetic wave having an arbitrary waveform and an arbitrary oscillation period. This technique can synthesize an arbitrary wave function, thus making it possible to generate an electromagnetic wave having an arbitrary waveform and an arbitrary frequency, and generate an electromagnetic wave having a variable and tunable frequency. The quantum synthesizer according to the present invention synthesize the electron wave or polarization of electron (electronic polarization) is synthesized instead of electromagnetic wave. Since arbitrary polarizations formed by electrons and holes can also be generated and synthesized by the technique described in this specification, arbitrary linear and nonlinear optical constants can be obtained. Ultrafast optical control and optical modulation can be realized accordingly.

The quantum synthesizer of the invention is a device in which the electron wave or polarization of electron (electric polarization) is synthesized as follows. Firstly, an ultrashort optical pulse or phase-locked multi-wavelength light is converted at a coding portion (phase/amplitude control portion) into coded light with phases and amplitudes controlled for predetermined frequencies (energies). Secondly, this coded light is used to excite and synthesize electron waves or polarizations of the respective electron levels of a quantum synthesis portion having n number or number larger than n of coupled levels. As a result of the excitation using the coded light, the electron wave or polarization is synthesized. Unlike a conventional semiconductor superlattice or multicoupled quantum structure without excitation control, the device of the invention excites the n number of energy levels with coded light, thereby giving one synthesized excited state (one synthesized electron wave state or one synthesized polarization state) responsive to one coded light. By selecting the form of coding variously, various synthesized excited states can be obtained in response to the selected form of coding.

The THz electromagnetic wave generation device of the invention can artificially synthesize electron waves or polarizations by exciting its quantum synthesis portion with coded light with phases and amplitudes controlled for predetermined frequencies (energies). In accordance with this polarization oscillation, the device can generate a THz electromagnetic wave having an arbitrary waveform that is artificially controllable.

A conventional THz electromagnetic wave generation device generates only a THz electromagnetic wave of a frequency determined by its quantum structure. (For example, Bloch's oscillation device hitherto reported changes in the band structure under application of an electric field, and thus can produce a variable electromagnetic wave of a peak frequency different according to the intensity of the electric field applied; however, because the excited state does not change, this device fails to obtain an electromagnetic wave having an arbitrary oscillation period or an arbitrary waveform.) On the contrary, the THz electromagnetic wave generation device of the invention generates a THz electromagnetic wave having one frequency distribution responsive to one form of coding. By selecting various forms of coding, it can produce a THz electromagnetic wave having various frequency distributions in response to the various forms of coding.

First, the use of optical excitation will be described. For simplified explanation, assume that there is only one level in each quantum well before coupling. As a first step, n number of layers of quantum well structures or n number of low-dimensional quantum well structures (e.g., quantum wells or quantum boxes) are coupled together quantum-mechanically to form the n number of excitation levels. These quantum wells are named as "n-fold coupled quantum wells". An ultrashort pulse on the time axis is the light having a bread frequency distribution with uniform phases on the frequency axis. Thus, the source of excitation light used is ultrashort pulsed light with a pulse width, including all frequencies of the n number of excitation levels, of 10 to 100 femtoseconds (corresponding to a frequency broadening of 10 to 100 nm). This excitation light is separated into the respective frequencies of the excitation levels, and the resulting components of light with the respective frequencies are coupled after the amplitudes and phases of the light in each frequency are modulated. The resultant coupled light is irradiated on the n-fold coupled quantum well structures, whereby electron waves (polarizations) can be excited with the phases and amplitudes being controlled for the respective energies. As a result, n number of excited wave functions can be simultaneously generated and synthesized, so that the synthesis of an arbitrary wave function becomes possible. In accordance with the spatial oscillation of this arbitrary wave function, an electromagnetic wave having an arbitrary waveform and an arbitrary frequency can be generated. An electromagnetic wave of a variable frequency can also be generated. Since arbitrary polarizations formed of electrons and holes can also be generated and synthesized, arbitrary linear and nonlinear optical constants can be obtained. Ultrafast optical control type optical modulation (optically controlled optical modulation) can be realized accordingly.

Next, excitation by electron wave injection will be described. As described previously, n number of low-dimensional quantum well structures are coupled together quantum-mechanically to form the n number of excitation levels. Electron waves having energies corresponding to these respective excitation levels are selected by means of electron wave filters (diffraction gratings), and guided to waveguides different according to energies. After the phases and amplitudes of the electron waves are controlled in the respective electron waveguides, the electron waves are injected to the excitation levels, whereby an arbitrary wave function can be synthesized. This synthesis of the arbitrary frequency results in the spatial oscillation of a wave packet, thus permitting the generation of an electromagnetic wave having an arbitrary waveform and an arbitrary frequency, as well as the generation of an electromagnetic wave having a variable frequency. This is an example of using n number of coupled levels formed by coupling together the n number of quantum wells each having a single level. Besides, when the respective quantum wells before coupling each have a plurality of quantum levels, particular coupled n levels of them can be used for quantum synthesis. In this case, the level of each quantum well, i, before coupling is designated as Si, which comprises level 1, level 2, level 3 . . . level j . . . level Si, in the order of increasing energy. At this time, the level with the same level designation (when the level j is existent throughout the n number of quantum wells), this level is split into the n number of coupled levels as a result of coupling. By utilizing these coupled n levels, quantum synthesis is permitted.

DETAILED DESCRIPTION OF THE PREFERRED EMBODIMENTS (I) Examples of Quantum Synthesizer and Related Devices (Discrete Type)

Quantum Synthesizer, Generation of THz Electromagnetic Wave and Optical Modulation Based on Optical Excitation.

Figure 6:
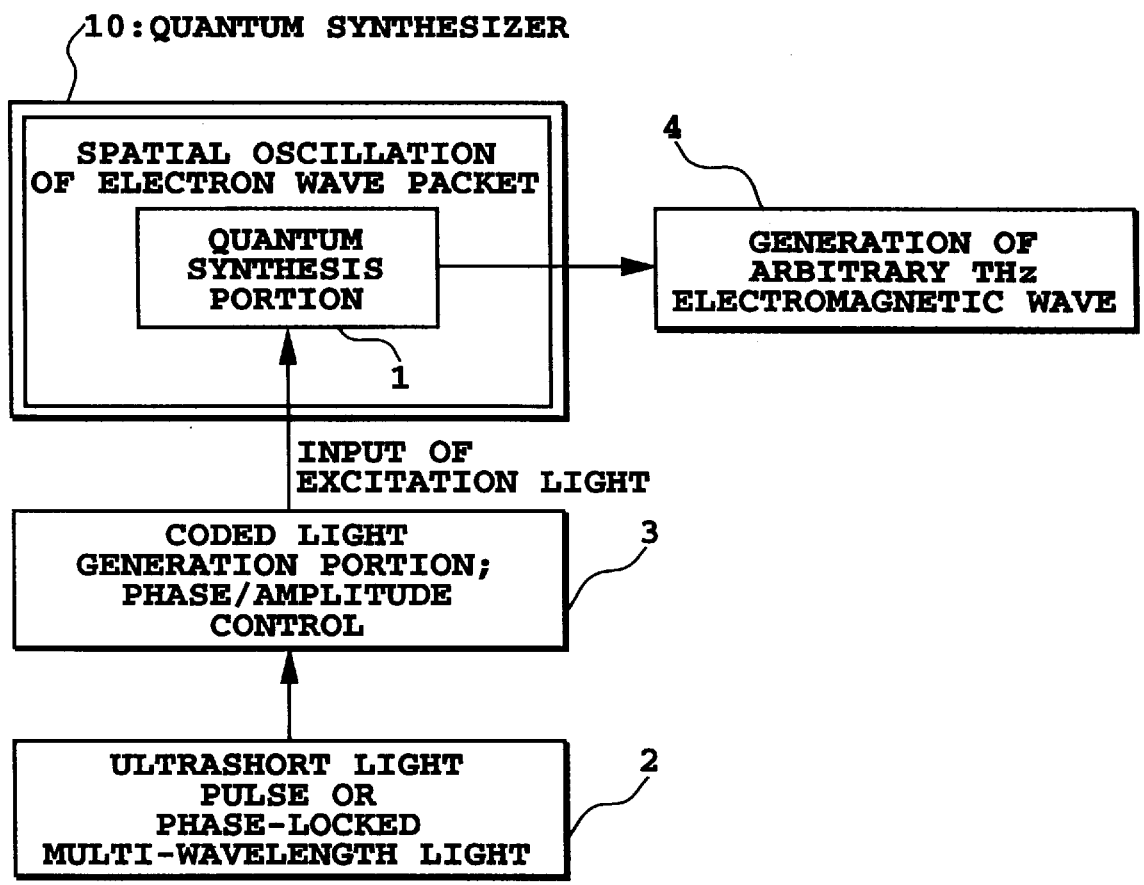
FIG. 6 is a block diagram illustrating a quantum synthesizer according to the present invention.
Figure 7A:
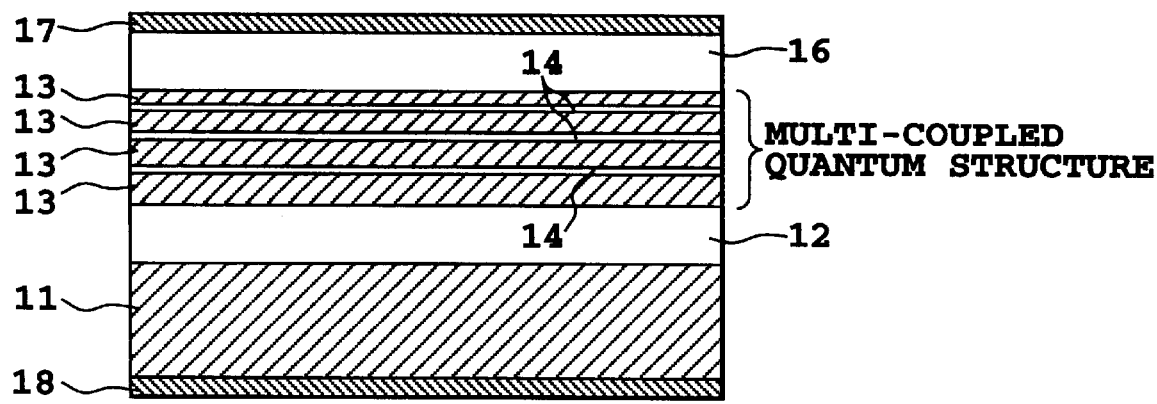
Figure 7B:
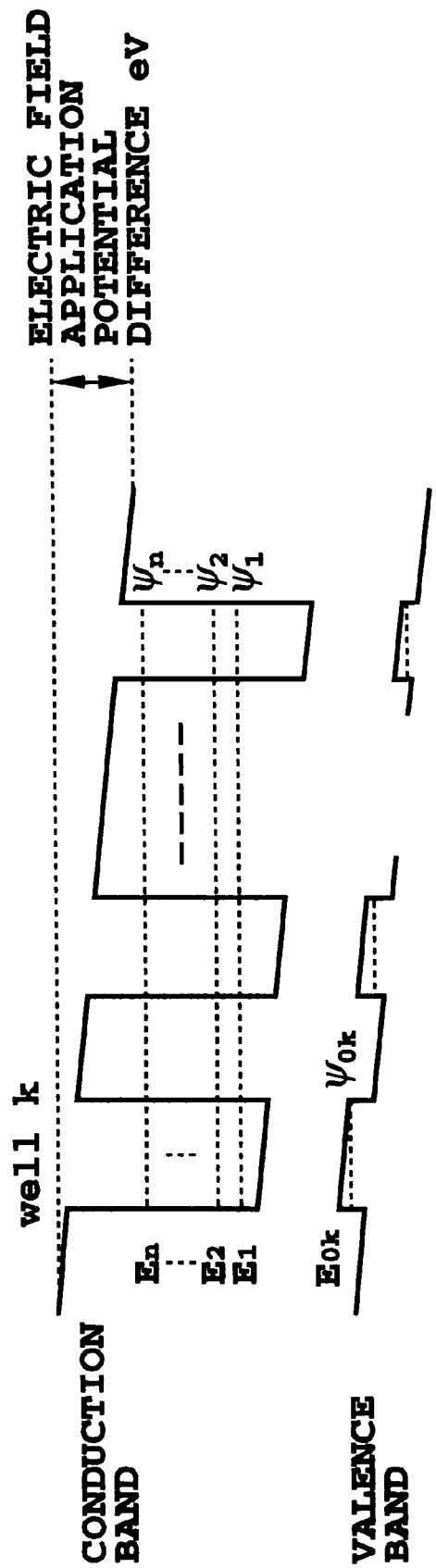
Figure 7C:
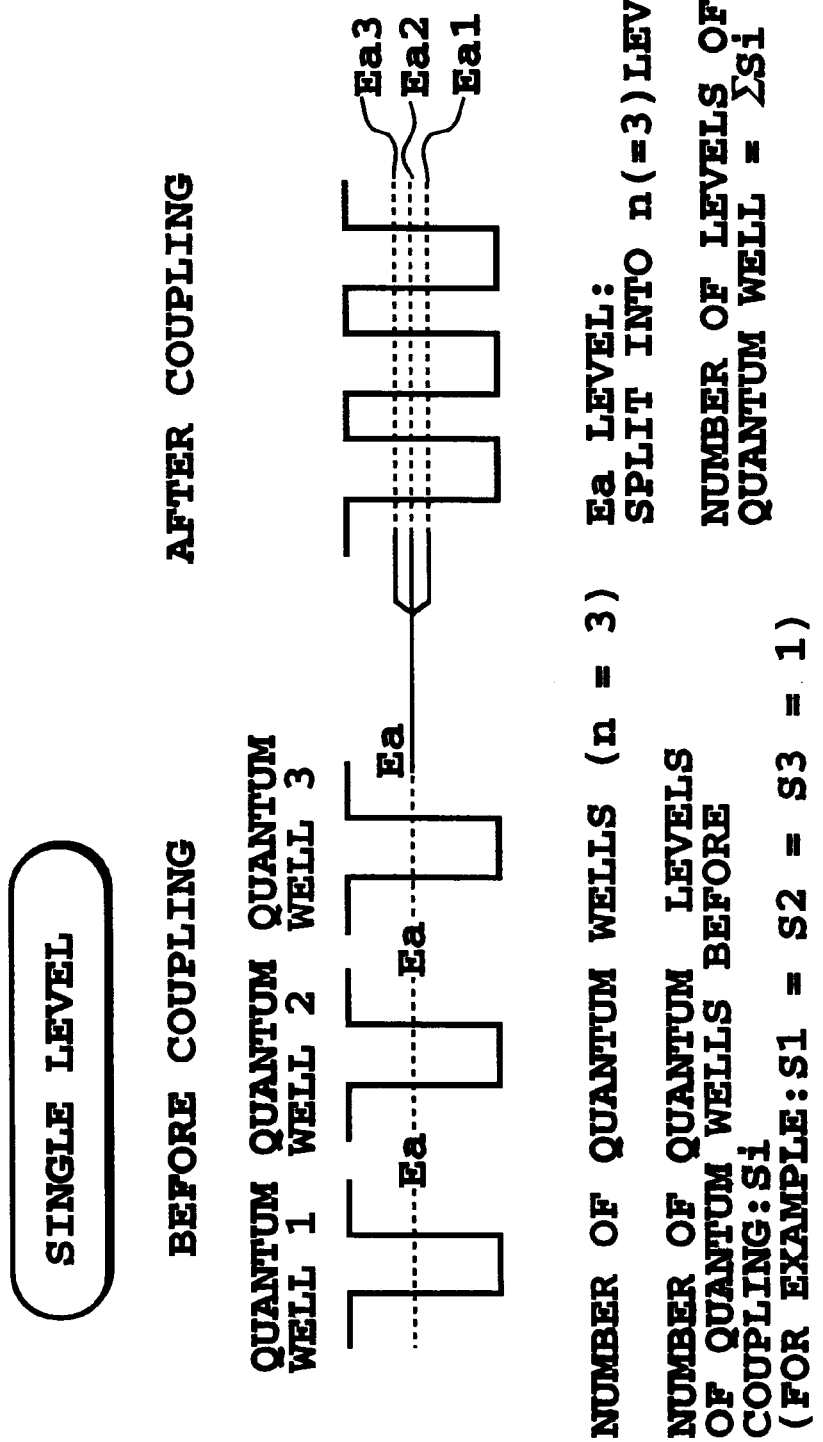
Figure 7D:
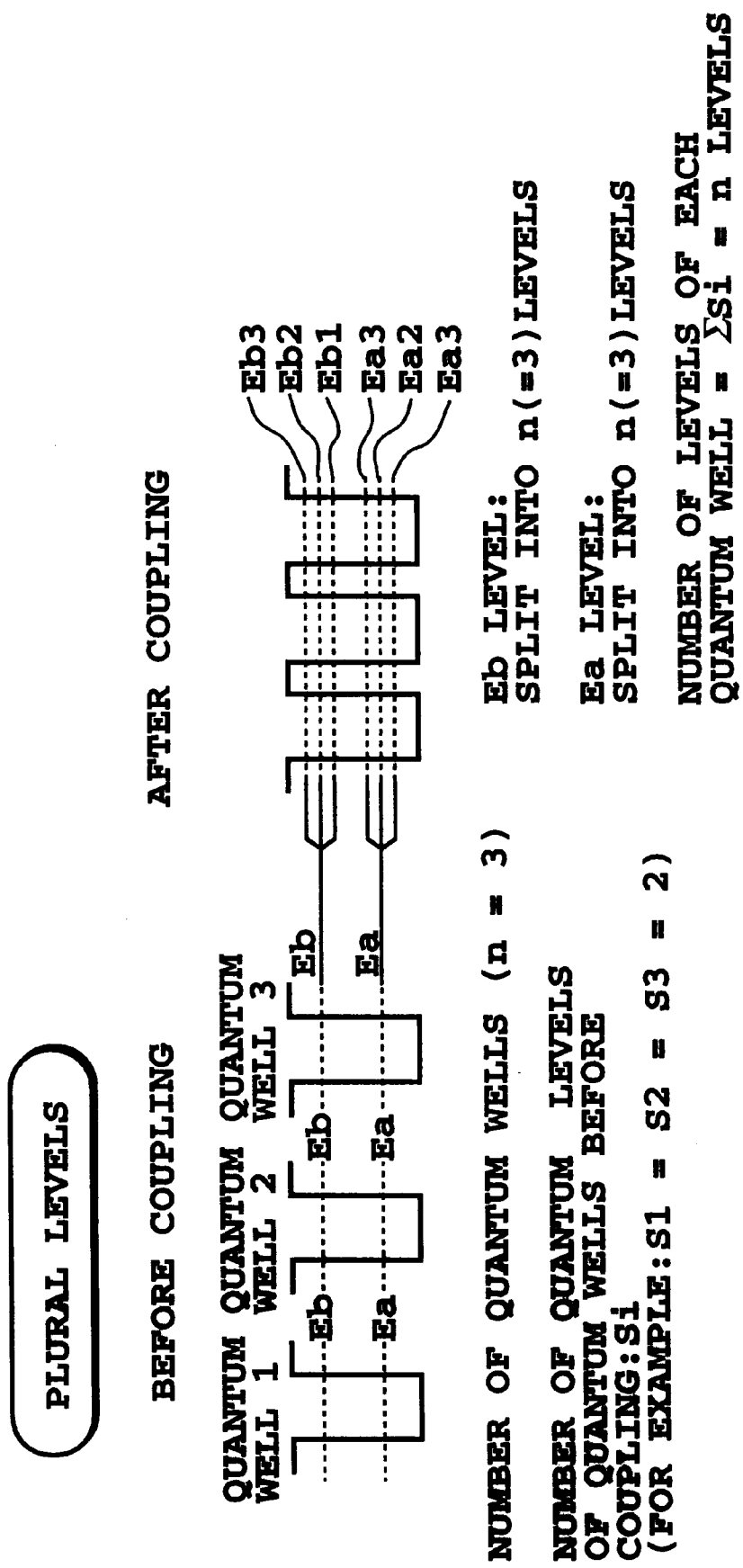

FIG. 6 is a block diagram illustrating embodiments of a quantum synthesizer and an electromagnetic wave generation device according to the present invention. An ultrashort light pulse or a phase-locked multi-wavelength light 2 is made incident on a coded excitation light generation portion 3, where the phases and amplitudes of the incident light are controlled responsive to its frequencies to obtain coded excitation light. The coded excitation light is inputted into a quantum synthesizer 10 having a quantum synthesis portion 1. By this procedure, an arbitrary polarization is synthesized in the case of a quantum synthesizer, or a THz electromagnetic wave 4 having an arbitrary frequency is generated in the case of a THz electromagnetic wave generation device. FIG. 7A and FIGS. 12A to 12C to be given later show structural examples of a quantum synthesizer. FIG. 7A is a schematic sectional view of the quantum synthesis portion of the quantum synthesizer which comprises a GaAs substrate 11, an AlGaAs buffer layer 12 formed thereon, n number of GaAs quantum well layers 13 and AlGaAs barrier layers 14 alternately grown thereon to form a multi-coupled quantum well structure 15, an AlGaAs cladding layer 16 formed thereon, and electrodes 17, 18 provided as both sides of the device. The electrode 17 is translucent to light for input of excitation light. Concretely, this electrode is composed of a metal layer several tens of nanometers or less thick. FIG. 7B shows the energy levels of the quantum synthesis portion. As an example, n number of quantum wells each having a single level before coupling are coupled to form the n number of coupled levels. As shown in the drawing, moreover, an electric field is applied to the coupled quantum well structure to change the energies of the respective quantum levels, thereby controlling coupling. FIG. 7C is an explanatory drawing for the coupled levels of the quantum synthesis portion, showing a case in which the respective quantum wells before coupling each have a single quantum level. Whereas FIG. 7D shows a case in which the respective quantum wells before coupling each have a plurality of quantum levels. In the former case, the quantum wells each have the n number of coupled levels after coupling, and they perform quantum synthesis using these n levels. With the latter case, the respective quantum wells each have the plurality of quantum levels, and permit quantum synthesis using particular coupled n levels of these levels. In this case, the levels of each quantum well, i, before coupling are collectively designated as Si, which comprises level 1, level 2, level 3 . . . level j . . . level Si, in the order of increasing energy. After coupling, the number of levels of each quantum well is the sum of $S1+S2+ \ldots j \ldots +Sn=\Sigma Si$. At this time, the level with the same level designation (when the level j is existent throughout the n number of quantum wells), this level is split into the n number of coupled levels as a result of coupling. The use of these coupled n levels enables quantum synthesis.

As disclosed in the cited publications (K. Leo et al., Phys. Rev. Lett. 66(1991), p.201 and H. G. Roskos et al., Phys. Rev. Lett. 68(1992), p. 2216), there may be a design in which the quantum levels of the respective quantum wells before coupling are different before application of an electric field, while the quantum levels of the respective quantum wells become consistent when a specific electric field is applied. With such a design, the electron-hole transition energy differs from quantum well to quantum well, so that only the n levels of one quantum well can be excited. When the levels of the respective quantum wells are designed to coincide without application of an electric field, the electron-hole transition energy becomes identical in all quantum wells after coupling; hence, which of the quantum wells to excite cannot be selected. In this case, the quantum synthesizer gives an arbitrary quantum oscillation. However, the excitation of the quantum well i may be counteracted by the quantum well j. Since the efficiency may be lowered or excited states may be counteracted among the different quantum wells, there may be the problem of difficulty with excitation control and synthesis control.

Under these circumstances, the quantum synthesis portion of the quantum synthesizer may come in two types, (A) a symmetric quantum synthesis portion designed such that the energies of the respective quantum wells are in agreement when no electric field is applied, and (B) an asymmetric quantum synthesis portion designed such that the energies of the respective quantum wells are in agreement when an electric field is applied. An example of the symmetric quantum synthesis portion (A) is shown in FIGS. 8A and 8B. FIG. 8A shows the energy levels before coupling, while FIG. 8B shows the energy levels after coupling. The asymmetric quantum synthesis portion (B) with n=3 is described in FIGS. 9A, 9B, 10A, 10B, 11A and 11B along with the energy levels. FIGS. 9A and 9B show an asymmetric quantum synthesis portion with the same band offset $\Delta E$ for all quantum wells, but the layer thickness being varied like a, b and c. FIGS. 10A and 10B show one with the same layer thickness a, but the band offsets for the quantum wells being varied like $\Delta Ea$, $\Delta Eb$ and $\Delta Ec$. FIGS. 11A and 11B show one with varying band offsets, $\Delta Ea$, $\Delta Eb$ and $\Delta Ec$, for the quantum wells, and varying layer thicknesses, a, b and c. FIGS. 9A, 10A and 11A show the energy levels before coupling, whereas FIGS. 9B, 10B and 11B show the energy levels after coupling and under application of an electric field. With the symmetric type, the energy level is identical among the quantum wells, so that the tunnel probability is the highest, and the coupling is the strongest, without application of an electric field (a resonant coupling state). With the asymmetric type, the energy level is inconsistent among the quantum wells before coupling, so that the tunnel probability is the highest, and the coupling is the strongest, when an electric field is applied to bring the respective quantum levels into agreement (a resonant coupling state).

The symmetric type and the asymmetric type can both be used as the quantum synthesizer, but the asymmetric type (B) is desirable in consideration of the efficiency and the ease of control of the excited state. Thus, FIG. 7B shows an embodiment of the asymmetric type quantum synthesizer. (Although the quantum wells differ in layer thickness and energy level, the energy levels come into agreement when an electric field is applied, thereby producing a resonant coupling state.)

Hereinbelow, a description of the invention will be offered with an easy-to-explain symmetric type without application of an electric field being taken as an example. Even in the case of the asymmetric type whose energy levels agree under application of an electric field, the same principle of action holds true, and the same embodiment applies.

Figure 12A:
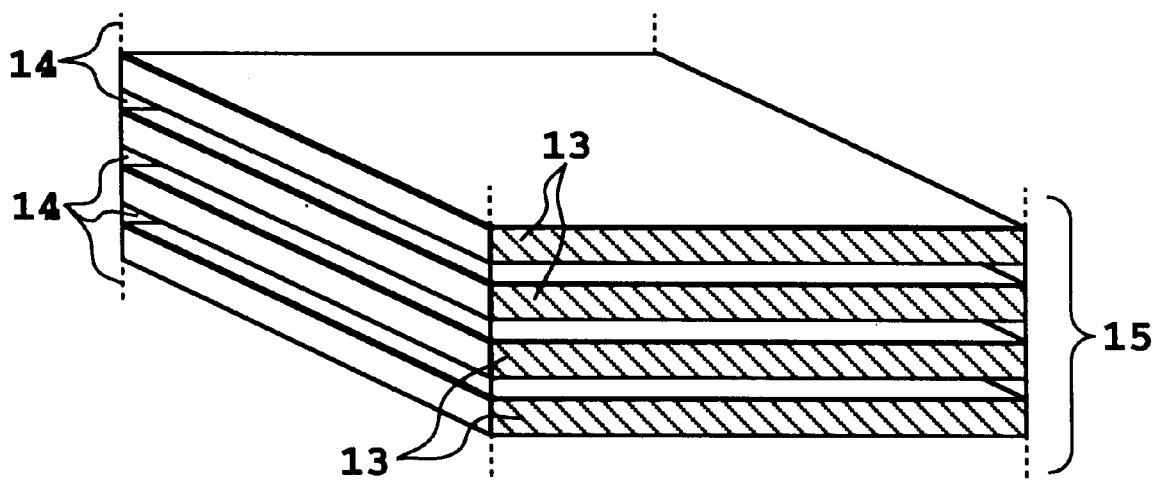
Figure 12B:
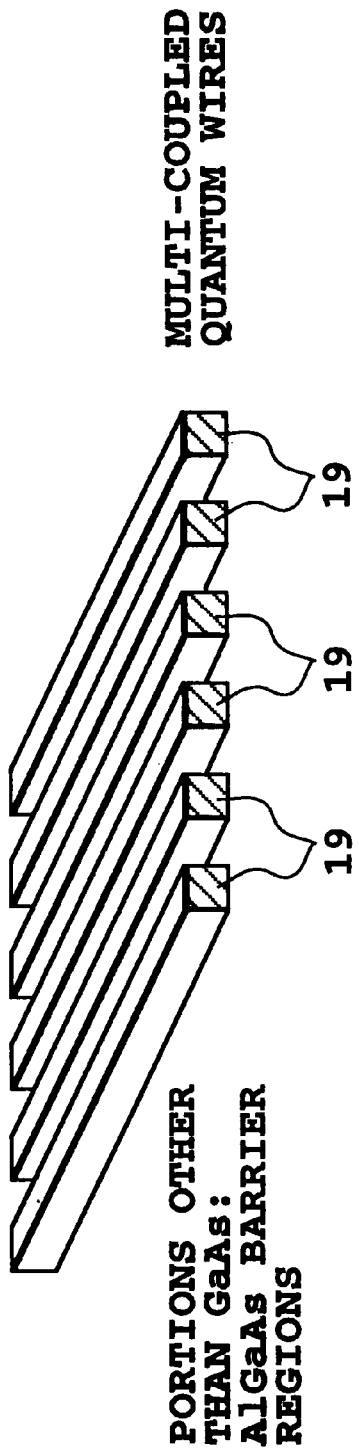
Figure 12C:
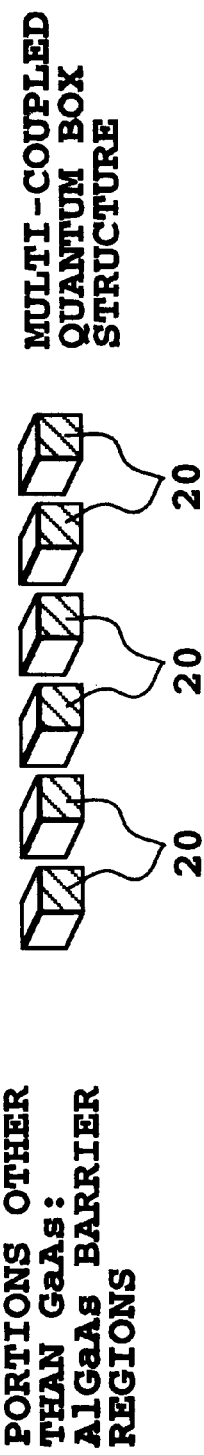

FIG. 12A is a perspective view of only the multi-coupled quantum well structure of FIG. 7A, while FIGS. 12B and C are schematic perspective views of multi-coupled quantum wires and multi-coupled quantum boxes, respectively. In FIGS. 12B and C, the portions other than GaAs quantum wires 19 and GaAs quantum boxes 20 are AlGaAs barrier layers.

Figure 13:
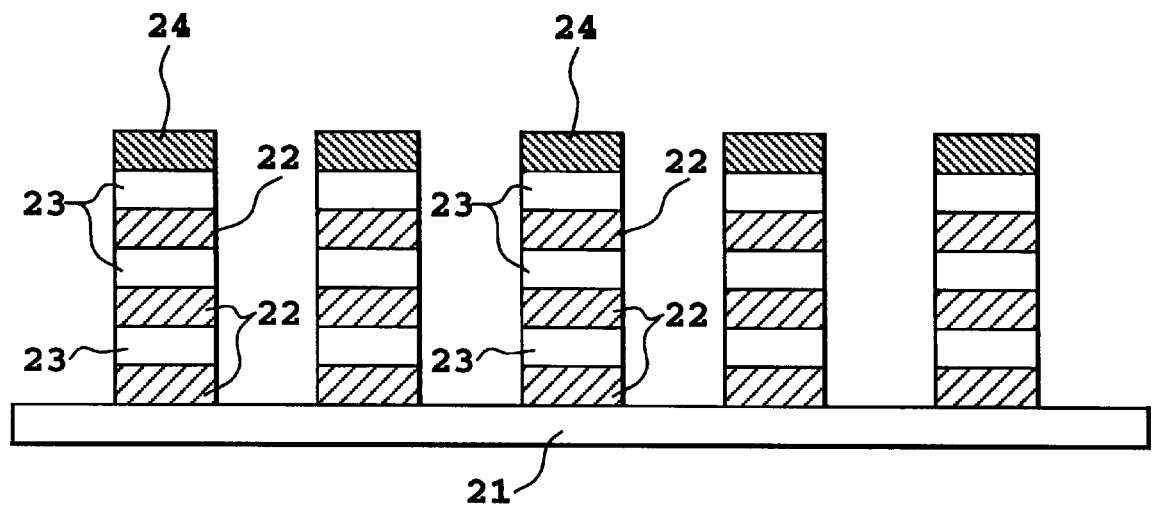
FIG. 13 is a view showing a fabrication method of quantum-wires for quantum synthesizer according to the invention.
Figure 19A:
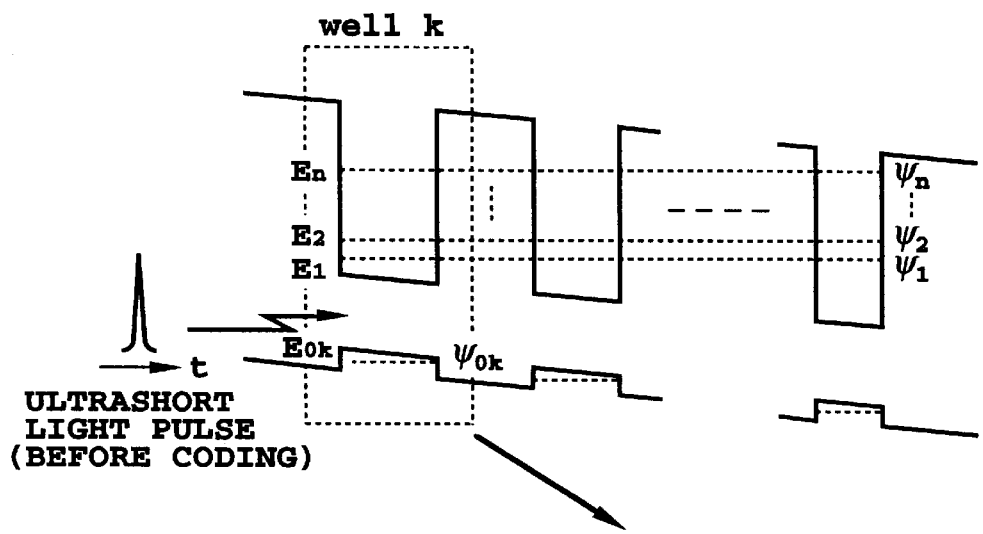
Figure 19B:
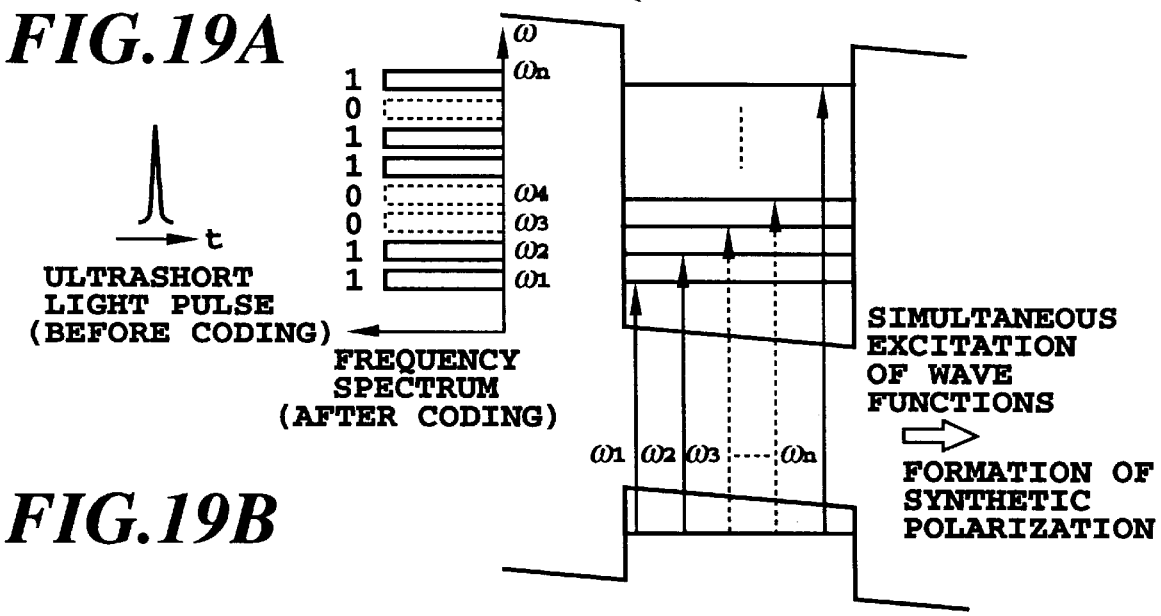

FIG. 13 shows an example of the method of fabricating the quantum synthesis portion of the quantum synthesizer according to the invention. Quantum well layers 22 and barrier layers 23 are alternately grown on a semiconductor substrate 21 to form multi-quantum-well structures. Thus, the quantum synthesis portion of the quantum well type is produced. Then, a mask 24 is formed by lithography, followed by etching to form multi-quantum-wire structures as illustrated, thereby producing the quantum synthesis portion of the quantum wire type. Furthermore, the same process as when preparing quantum wires from quantum wells are used on the multi-coupled quantum wire structures in order to fabricate quantum boxes. That is, lithography is performed to form a mask perpendicular to the quantum wires, followed by etching, to obtain multi-coupled quantum boxes. Thus, the quantum synthesis portion of the quantum box type is produced. The quantum synthesizer is constituted by inputting coded excitation light (to be describe later) into the quantum synthesis portion describe above, as illustrated in FIGS. 19A and 19B.

FIGS. 14A and 14B illustrate another method of fabricating a multi-coupled quantum wire structure. Barrier materials 26 and quantum wire materials 27 are alternately grown on an inclined-surface substrate 25 to form a multi-coupled quantum wire structure. This multi-coupled quantum wire structure is etched perpendicular to the wires to obtain a multi-coupled quantum box structure.

FIGS. 15A and 15B illustrate still another method of fabricating a quantum wire structure, in which FIG. 15A shows a single-layer structure, and FIG. 15B, a multi-layer structure. First, V-grooves 28 are formed in a semiconductor substrate 21, and then quantum well layers 29 and barrier layers 30 are alternately grown in the V-grooves 28 to form multi-coupled quantum wires.

More specifically, V-grooves 28 are formed in a GaAs substrate 21, and a GaAs buffer layer and an AlGaAs buffer layer are formed thereon. Further, n number each of GaAs quantum wire (quantum well) layers 29 and AlGaAs barrier layers 30 are alternately grown. Thus, there is produced a multi-coupled quantum wire structure comprising the n number of very fine quantum wires 5 nm thick and 30 nm wide (effective width 15 nm) and barrier layers 2 nm thick formed at the bottom of the V-groove 28.

Figure 16A:
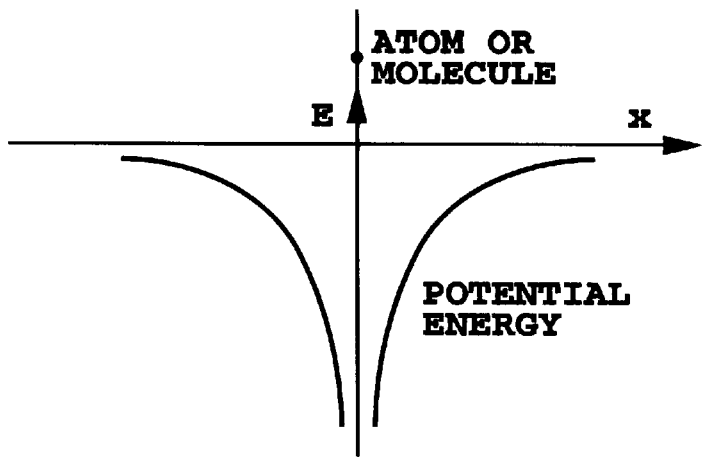
FIGS. 16A and 16B are views showing the energy level of single (16A) and coupled atoms (molecules) (16B), respectively.
Figure 16B:
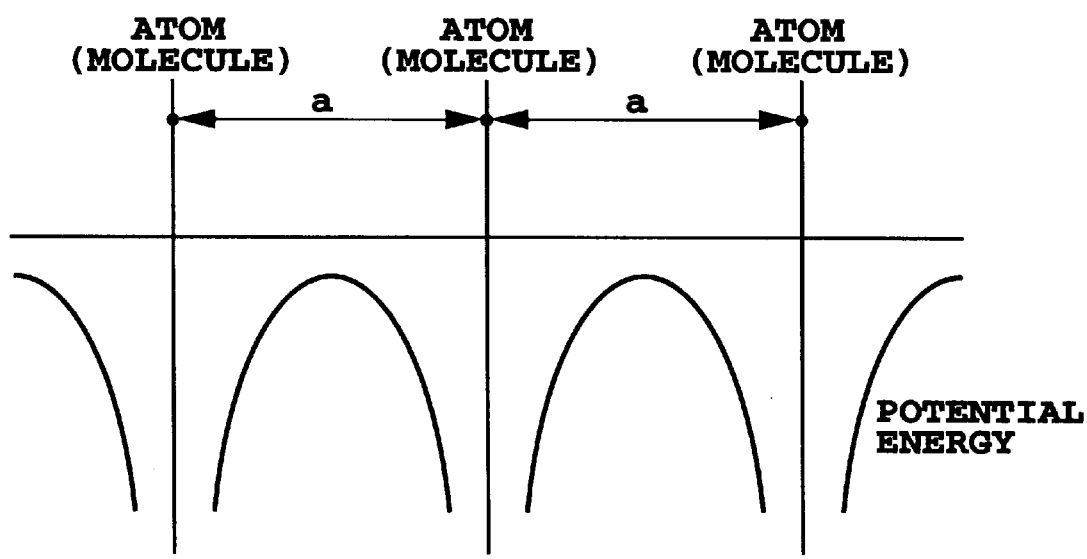
Figure 16C:
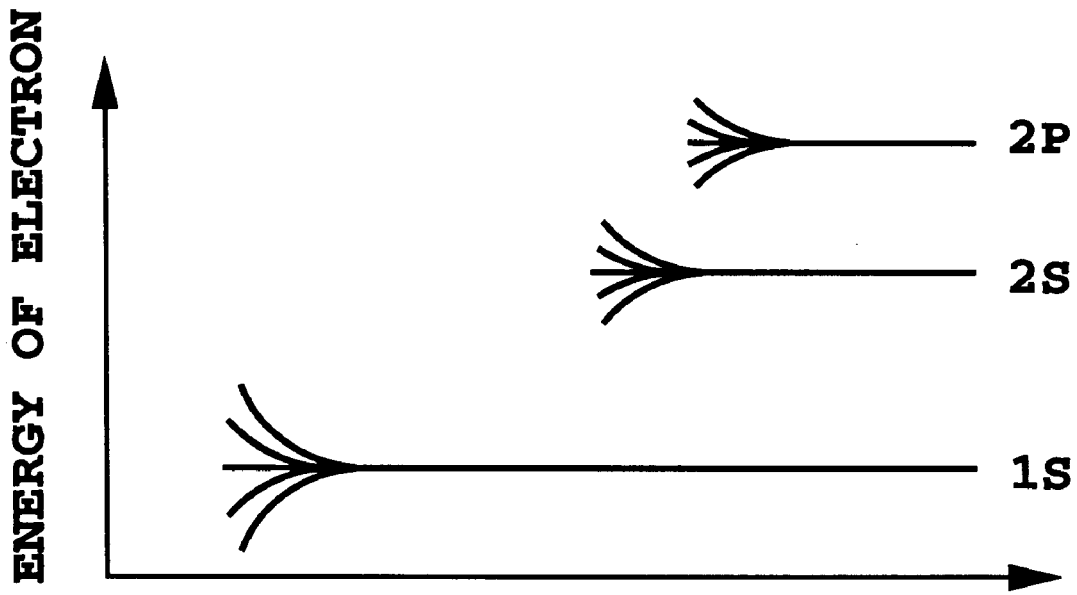
FIG. 16C shows energy level of coupled atoms (molecules)

The foregoing embodiments describe the quantum synthesizer using quantum wells, quantum wires, or quantum boxes. In the light of the fact that the quantized energy level of the quantum box is close to that of an atom or molecule, an n-atom structure or an n-molecule structure having atoms or molecules coupled n-fold can also be used as the quantum synthesizer. FIGS. 16A to 16C show the energy levels of coupled atoms (coupled molecules) having atoms or molecules coupled by n-fold. The respective levels of n number of the same isolated atoms (molecules) (see FIG. 16A) are coupled together when the interatom (intermolecular)

distance, a, is decreased, and this distance becomes smaller than a certain distance (the distance where coupling is possible), as illustrated in FIG. 16B. As a result, one level is split into the n number of levels as in the quantum wells, as shown in FIG. 16C. When the wave functions overlap, a split due to coupling occurs. In the case of the ground level of a hydrogen atom (principal quantum number n=1), for instance, the distribution length, b, of the wave function (considered for the probability density $\geq 0.01$) is about 4 angstroms. The corresponding distribution length is about 6 angstroms for the hydrogen atom (n=2), and about 10 angstroms for the hydrogen atom (n=3), showing the distribution length b increasing with a higher order. Approaching two atoms (molecules) to each other within twice the distribution length of the wave function, therefore, results in the splitting of energy by coupling. This n number of wave functions are excited with their phases and amplitudes being controlled as in the case of the quantum well structure, whereby quantum synthesis can take place. The n-fold coupled atoms are composed of either n number of the same atoms, or n number of different atoms. The splitting into the n number of levels after coupling is common to both these cases, and the use of these n levels permits quantum synthesis. Here, the n-fold coupled atoms (molecules) can be used, say, in the four manners:

(a) The use of the naturally occurring n-fold coupled atoms, or n-fold coupled molecules: The diatomic molecules include $H_2$, $Li_2$, $Na_2$ and $O_2$. The triatomic molecules include $O_3$, $CO_2$, $CS_2$, $N_2O$, $BeCl_2$, $MgCl_2$, $CaCl_2$, $CdCl_2$, $ZnCl_2$ and $HgCl_2$. Among the n-fold molecules are the organic materials such as ethylene $H_2C—CH_2$ and benzene. Metallic atoms (e.g. Na) can easily achieve n-fold coupling, when an n number of them are linearly arranged and metallic-bonded. Here, the n-fold coupling refers to the coupling of the n number of atoms or molecules, rather than the order of chemical bonding.

Figure 17:
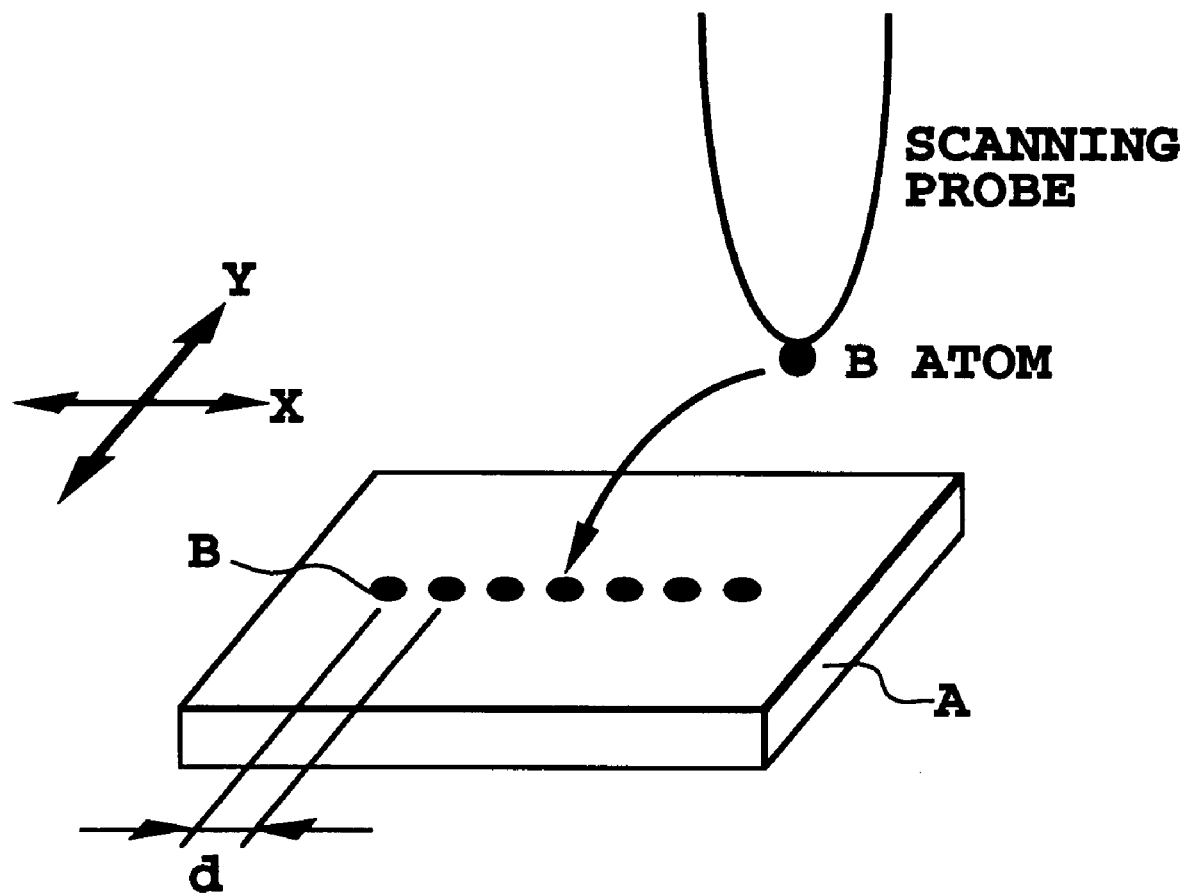
FIG. 17 is a view showing a method of producing n-fold coupled atoms (molecules)

(b) By atomic manipulation, B atoms (molecules) are moved to specific portions of a substrate A composed of A atoms (molecules). As a result, the B atoms (molecules) are arranged on the substrate surface at equal distances (d) where the B atoms (molecules) can be coupled together quantum-mechanically, as illustrated in FIG. 17, whereupon n-fold coupled atoms or molecules are produced. The atomic manipulation can be performed by capturing the B atoms by means of a scanning ultrafine probe (STM or photon STM), and arranging them on the substrate A. The desired substrate material is a semiconductor, such as Si or GaAs, which easily gives a surface where atoms are arranged regularly. However, any substrate may be used, as far as it provides a surface where atoms are arranged regularly on the same plane over the available zone (the interatom distance multiplied by the regions of the n number of atoms). In this case, the lattice constant of the B atoms may be different from the lattice constant of the substrate atoms A, but should be one such that the B atoms are stably bonded to the atoms of the substrate. Concerning the method of capturing the B atom, a single atom (molecule) or a plurality of atoms (molecules) contained in a solid from single crystals composed of B atoms can be captured by use of an ultrafine probe, or a single atom (molecule) or a plurality of atoms (molecules) contained in a gas can be captured by using an ultrafine probe. As for the distance between the adjacent atoms arranged on the substrate, the atoms needs to be brought to within twice the distribution length of the wave function of each atom, that is, within several angstroms. For example, Au atoms are linearly arranged on the surface of an Si substrate with the lattice constant of Si being kept between the adjacent Au atoms, whereby n-fold coupled atoms can be formed.

Figure 18A:
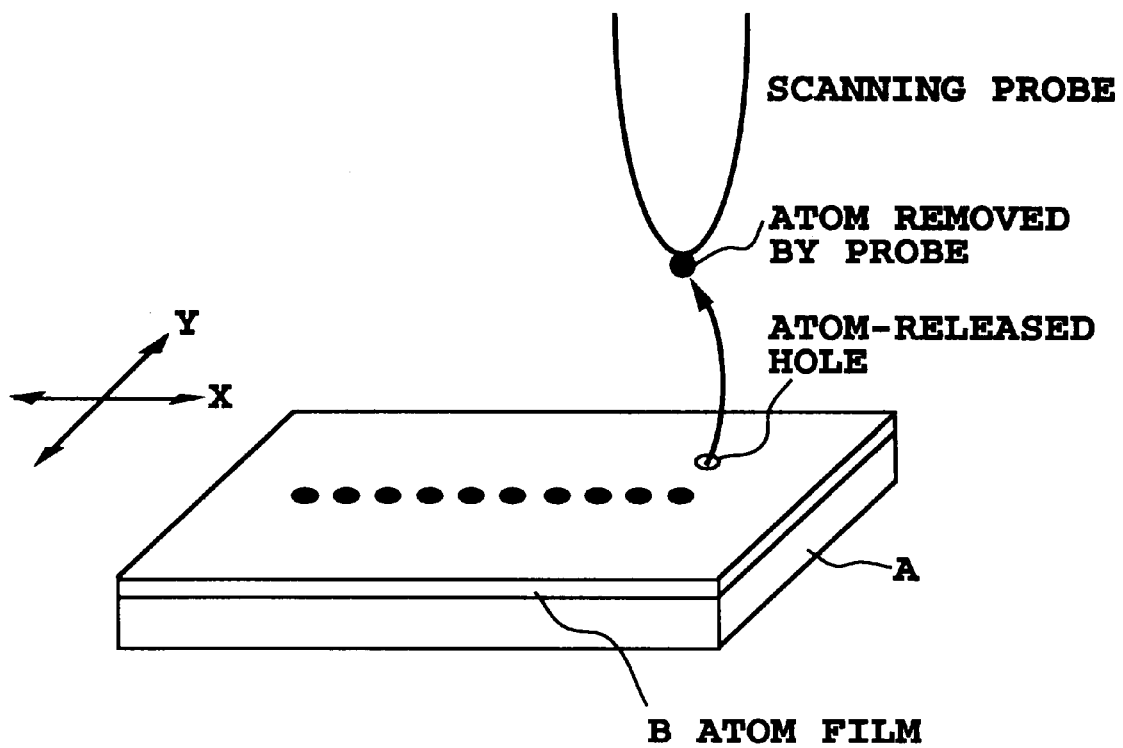
FIGS. 18A and 18B are views showing another method of producing n-fold coupled atoms (molecules)
Figure 18B:
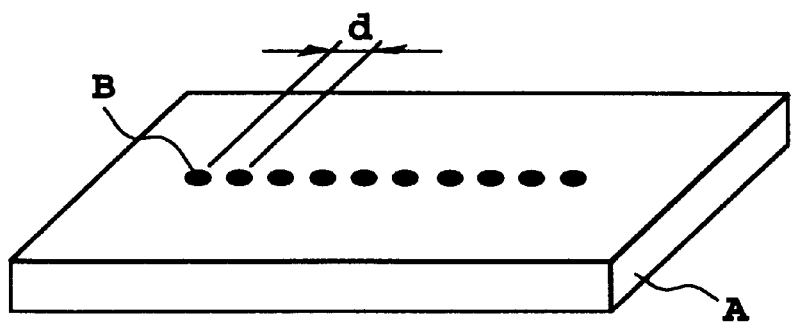

(c) The method of forming a single atom (molecule) layer B' composed of B atoms (molecules) on a substrate A formed of A atoms (molecules), as shown in FIG. 18A, and leaving only a portion where the B atoms (molecules) are arranged linearly at equal intervals while removing the other portion (removal of the unnecessary portion can be performed using a scanning ultrafine probe), as shown in FIG. 18B. The growth of the single atom film can be carried out by a crystal growth technique such as the MBE method, or the production technique for the LB film.

(d) The method using a growth of an atomic or molecular line on grooved or step substrate using the same manner in the quantum wire fabrication in FIGS. 14A, 14B, 15A and 15B.

FIG. 19A shows an example of the band structure of a quantum synthesizer for exciting the quantum synthesis portion of the invention by optical excitation to synthesize an electron wave or polarization. FIG. 19B is a partially enlarged view of the band structure.

Figure 20A:
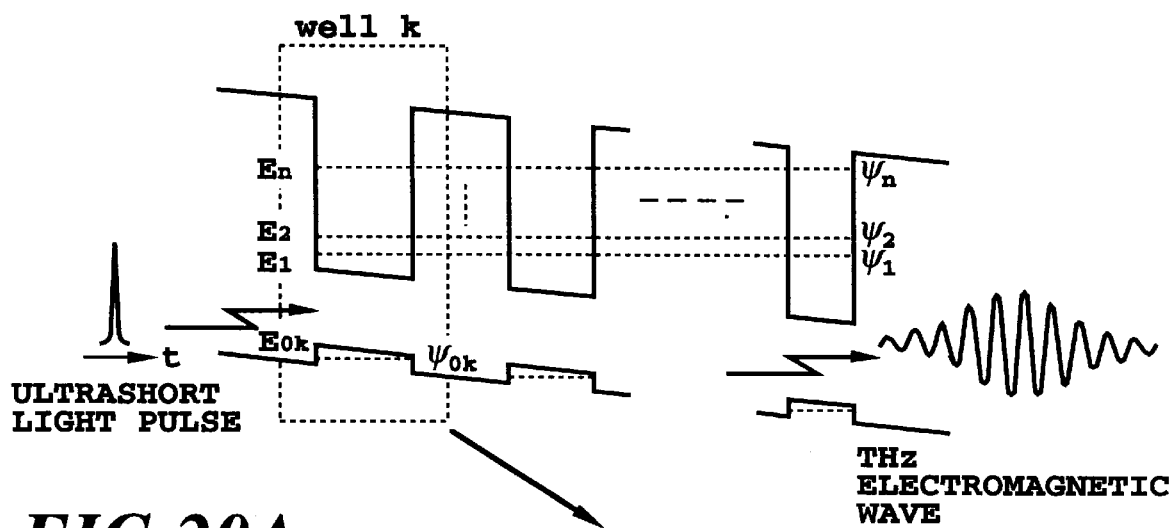
Figure 20B:
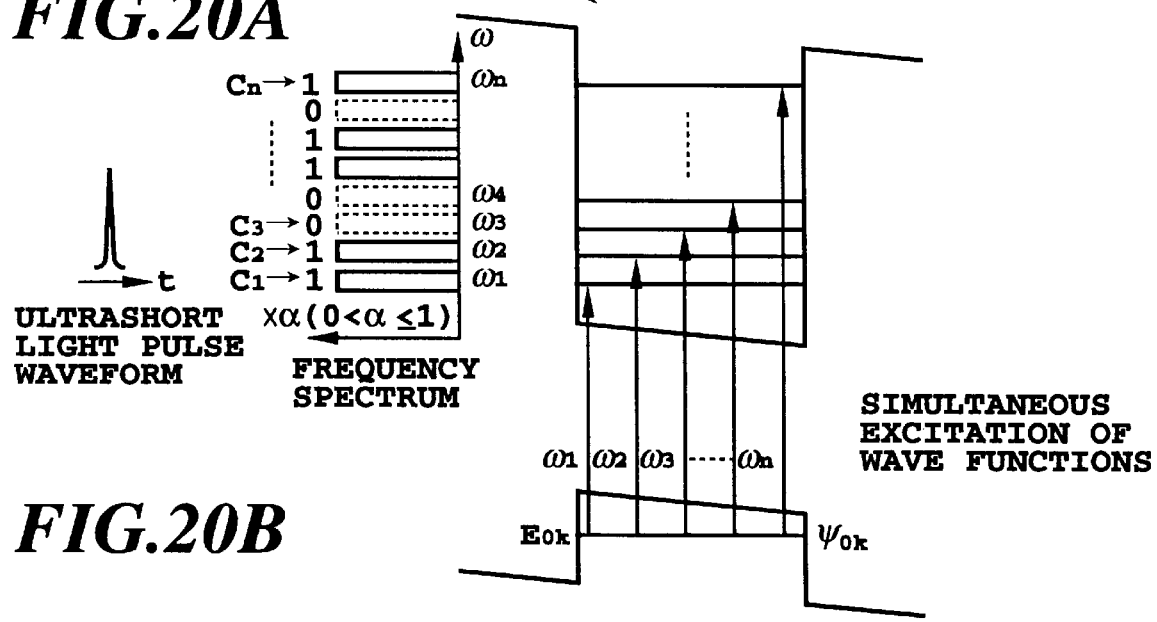

FIG. 20A shows an example of the band structure of a quantum synthesizer (an excited electron wave synthesis portion; corresponding to the numeral 1 of FIG. 6) for exciting the quantum synthesis portion of the invention by optical excitation to generate a THz electromagnetic wave. FIG. 20B is a partially enlarged view of the band structure. As described previously, the n number of quantum well structure or low-dimensional coupled quantum well (quantum wire or quantum box) structures are coupled quantum-mechanically to form a multi-coupled quantum well structure. Thereby, the n number of excitation levels E1, E2, . . . En are formed for the electron. The wave functions corresponding to these energies become $\psi 1$, $\psi 2, \ldots \psi n$. While hole level in well k, which correspond to ground states, has energy of $E_{0k}$ and wave function $\psi k$.

Ultrashort pulsed light (femtosecond light) with phases and amplitudes controlled for the respective frequencies is formed at an excitation light coding portion (corresponding to the numeral 3 in FIG. 6). Using this ultrashort pulsed light, the respective levels are excited with the phases and amplitudes of the electron waves at the respective levels being controlled (an embodiment of the excitation light coding portion will be described later). The ultrashort pulsed light has a broad frequency spectrum covering the frequencies $\omega 1$ to $\omega n$ ($\omega 1, \omega 2, \ldots, \omega i, \ldots \omega n$), and the phases of the respective frequencies are uniform where $\omega i$ is angular frequency of light [$\omega i=(Ei-E0k)\cdot 2\pi/h$, i=1, 2, . . . , n]. Such ultrashort pulsed light is obtained by a commercially available laser, e.g., a Ti-sapphire laser (pulse width: 30 to 100 femtoseconds; 6 femtoseconds based on the top data). The phase/amplitude control coefficients corresponding to the respective frequencies $\omega 1$, $\omega 2$, . . . $\omega n$ are expressed as the complex numbers $c1(\omega 1)$, $c2(\omega 2)$, $c3(\omega 3)$, . . . $ci(\omega i)$, . . . $cn(\omega n)$. The coefficient is expressed as $ci=|ci|\exp(j\psi i)$, and the absolute values of the coefficient being $|ci|=0$ and $0<|ci|\leq 1$ represent nonexcitation and excitation, respectively. The phase $\theta i$, on the other hand, is 0 degree at t=0, and represents the phase of the polarization (wave function) at other level relative to the phase of the polarization (wave function) at a reference level (e.g. $\omega 1$) at t=0 where the polarization of electron in level k is the polarization due to the dipole formed by electron (level Ej) and hole (level E0k). Using these parameters, the resultant synthetic wave function and polarization obtained when the excitation levels are excited with their phases and amplitudes being controlled reads as follows:

For electron wave synthesis, $$\psi = c1(\omega 1)\psi 1 + c2(\omega 2)\psi 2 + c3(\omega 3)\psi 3 + \ldots + ci(\omega i)\psi i + \ldots + cn(\omega n)\psi n \quad (5\text{-}1);$$

and for polarization synthesis, $$\psi = c10(\omega 10)\psi 10 + c20(\omega 20)\psi 20 + c30(\omega 30)\psi 30 + \ldots + \quad (5-2)$$
$$ci0(\omega i0)\psi i0 + \ldots + cn0(\omega n0)\psi n0 + c0k(\omega ok)\psi 0k$$
$$= [c1(\omega 1)\psi 1 + c2(\omega 2)\psi 2 + c3(\omega 3)\psi 3 + \ldots + ci(\omega i)\psi i + \ldots + cn(\omega n)\psi n + 1]c0k(\omega ok)\psi 0k,$$

where $\omega i = \omega i0 - \omega 0k = (Ei - E0k) \cdot 2\pi/h$, $c10 = C1 \cdot c0k$ and $\psi 10 = \psi 1 \cdot \psi 0k$. By selecting its complex vector $C = (c1, c2, \ldots ci \ldots, cn)$, an arbitrary wave function can be synthesized. As a result of the spatial oscillation of the wave packet associated with the synthesis of the arbitrary wave function, it becomes possible to generate an electromagnetic wave having an arbitrary waveform and an arbitrary frequency, and generate an electromagnetic wave of a variable frequency.

Figure 21A:
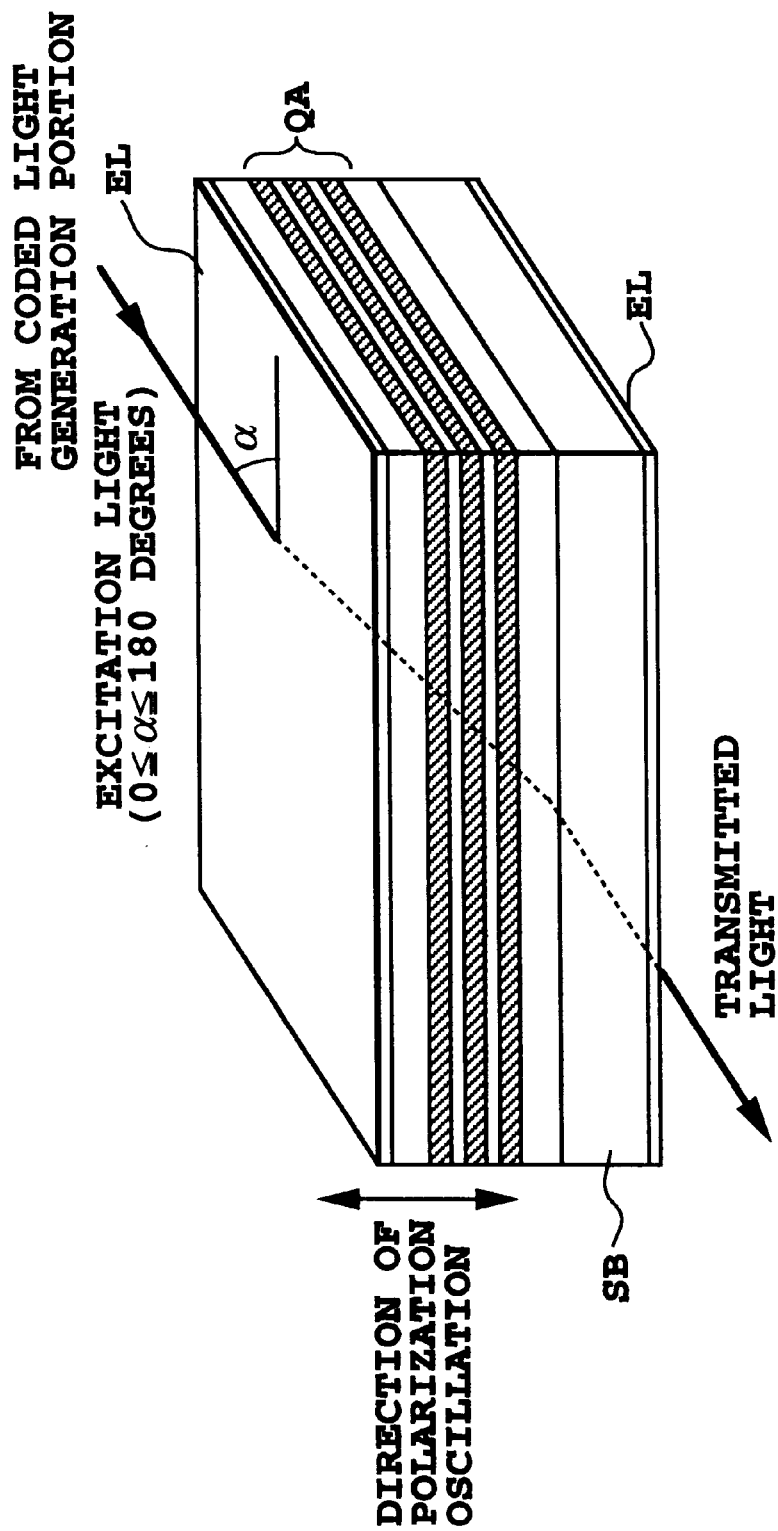
Figure 21B:
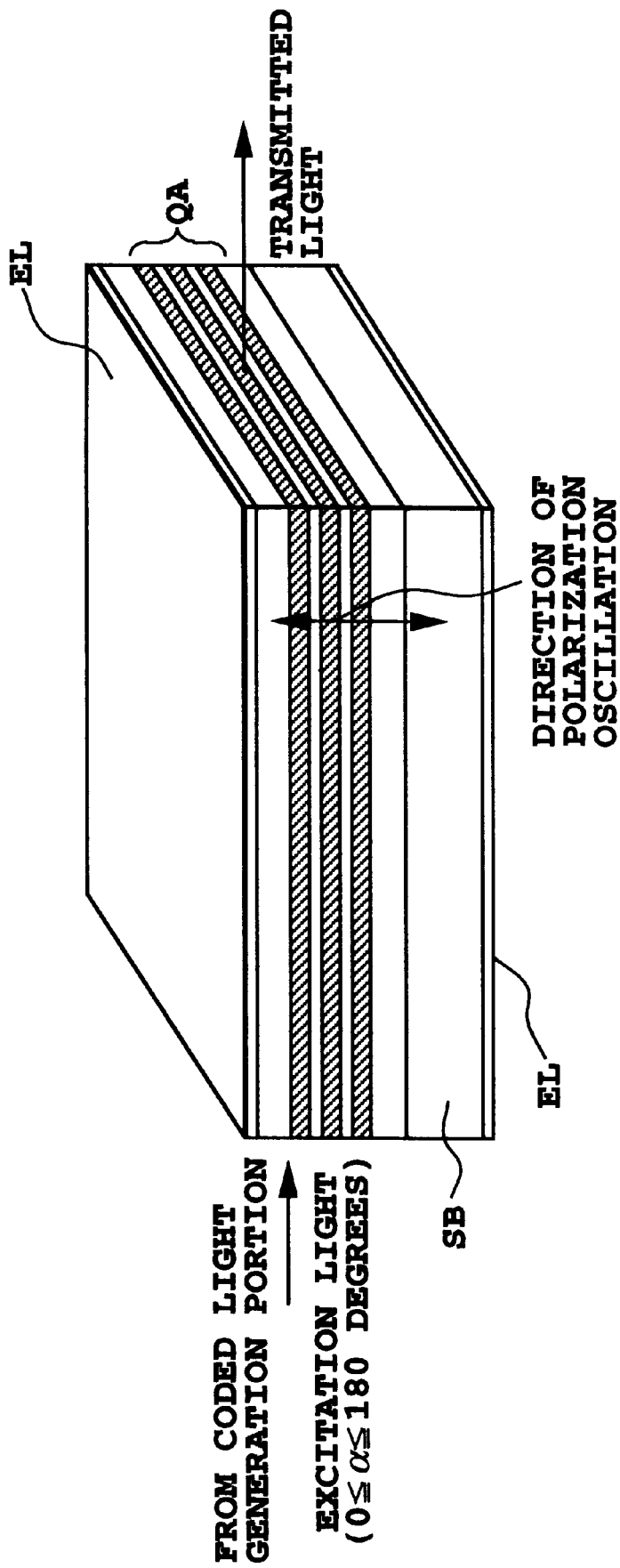

FIGS. 21A and 21B are perspective views of the quantum synthesizer of the present invention, showing an example of the concrete placement of excitation light. This device inputs excitation light of the aforementioned coded ultrashort light pulse into the quantum synthesis portion while controlling its phases and amplitudes at the excitation light coding portion, thereby generating a synthetic polarization. On the surfaces of a quantum synthesis portion QA constructed by preparing a quantum structure on a substrate SB, semi-transparent electrodes EL are formed so as to permit the input and departure of light and a THz electromagnetic wave. FIG. 21A shows an example of incidence on the substrate surface, in which excitation light is incident on the substrate at an angle, α (0≦α≦360 degrees), to the substrate. The polarization excited by excitation light oscillates spatially in the same direction as the direction of coupling of the quantum wells (i.e. perpendicular to the substrate surface).

FIG. 21B exemplifies incidence on the end facet. As shown therein, excitation light is inputted from one end facet of the quantum synthesis portion QA to generate a synthetic polarization. In the case of end facet incidence, the electrodes need not be transparent.

Figure 22A:
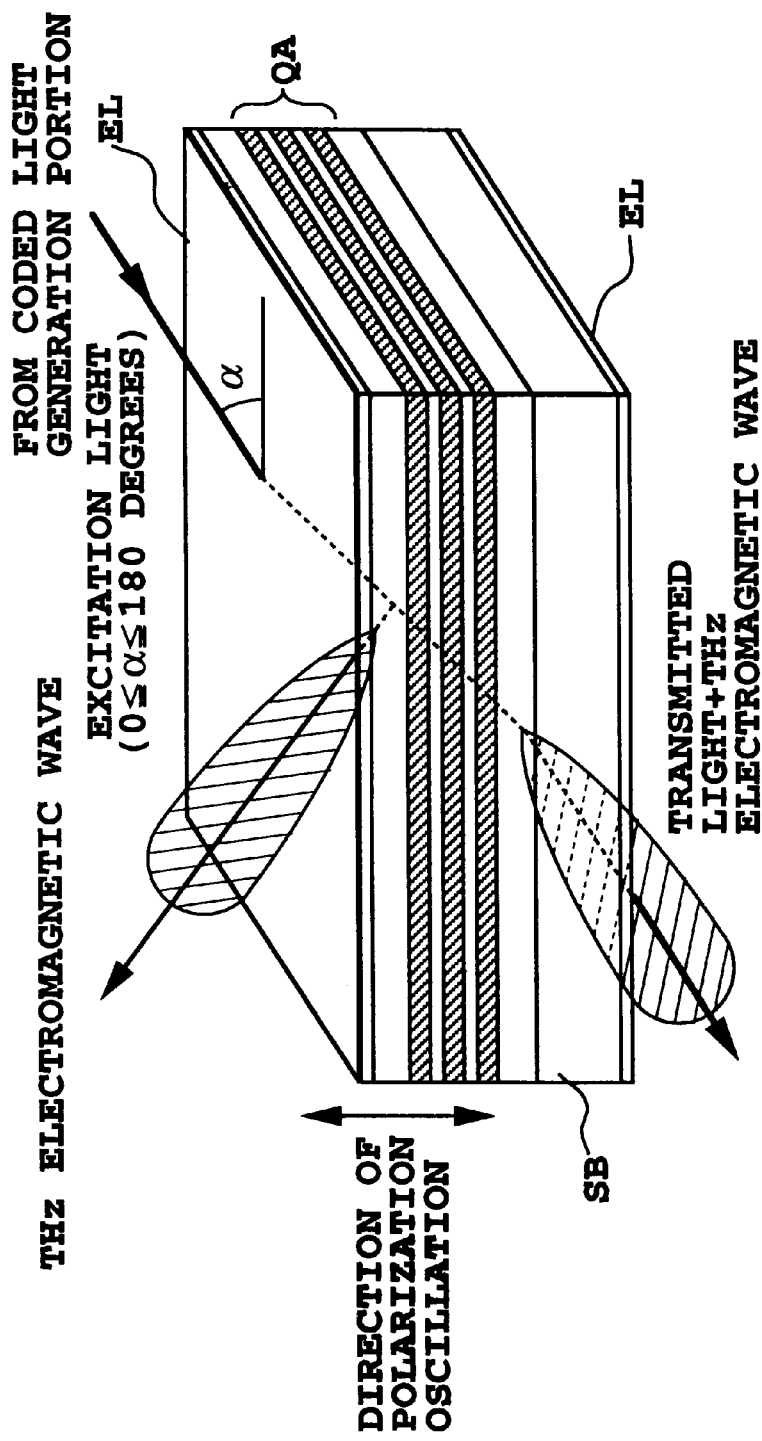
Figure 22B:
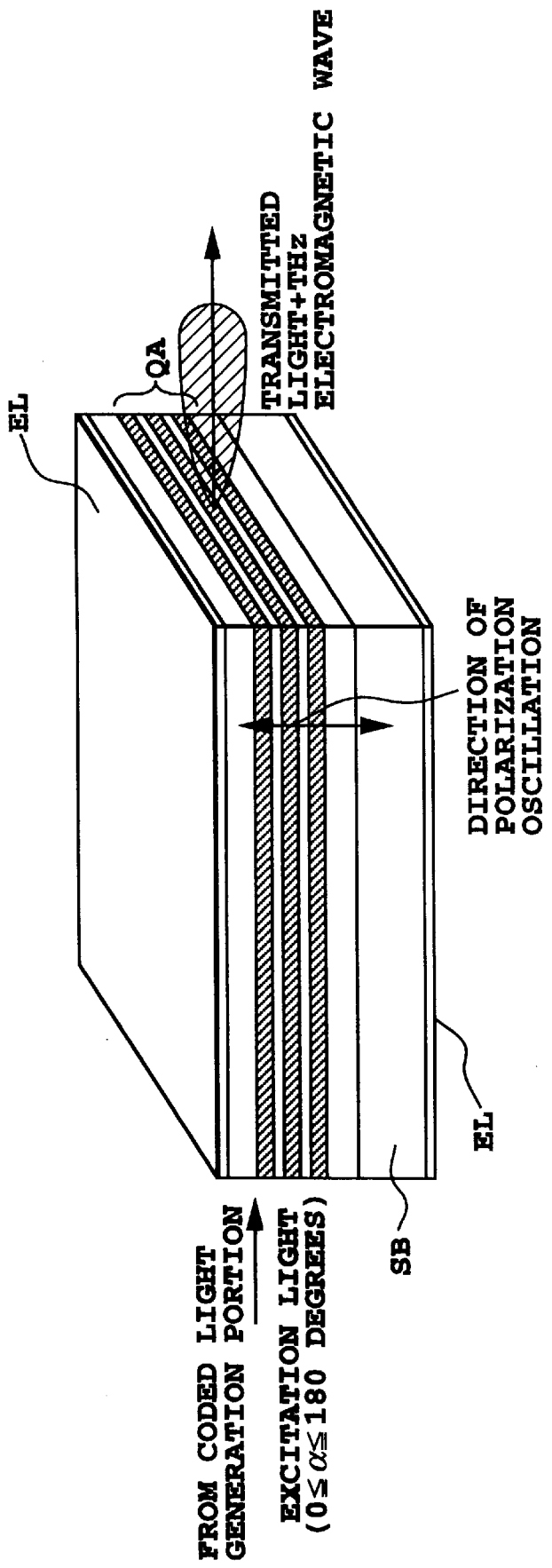

FIGS. 22A and 22B are perspective views of the THz electromagnetic wave generation device of the present invention, showing an example of the concrete placement of excitation light and a THz electromagnetic wave. This device inputs excitation light of the aforementioned coded ultrashort light pulse into the quantum synthesis portion while controlling its phases and amplitudes at the excitation light coding portion, thereby generating a synthetic polarization. On the surfaces of a quantum synthesis portion QA constructed by preparing a quantum structure on a substrate SB, semi-transparent electrodes EL are formed so as to permit the input and output of light and a THz electromagnetic wave. FIG. 22A shows an example of incidence on the substrate surface, in which excitation light is incident on the substrate at an angle, α (0≦α≦360 degrees), to the substrate. A polarization excited by excitation light oscillates spatially in the same direction as the direction of coupling of the quantum wells (i.e. perpendicular to the substrate surface). Perpendicular to this direction of oscillation, a THz electromagnetic wave is radiated strongly, but a THz electromagnetic wave is also radiated in directions other than the direction horizontal to the oscillation. Thus, the use of a lens or focusing mirror for the THz band enables this device to be used as a THz electromagnetic wave generation device.

FIG. 22B exemplifies incidence on the end facet. As shown therein, it is also possible to input excitation light from one end facet of the quantum synthesizer QA, and generate a THz electromagnetic wave from the other end facet. In the case of end facet incidence, the electrodes need not be transparent.

Figure 23A:
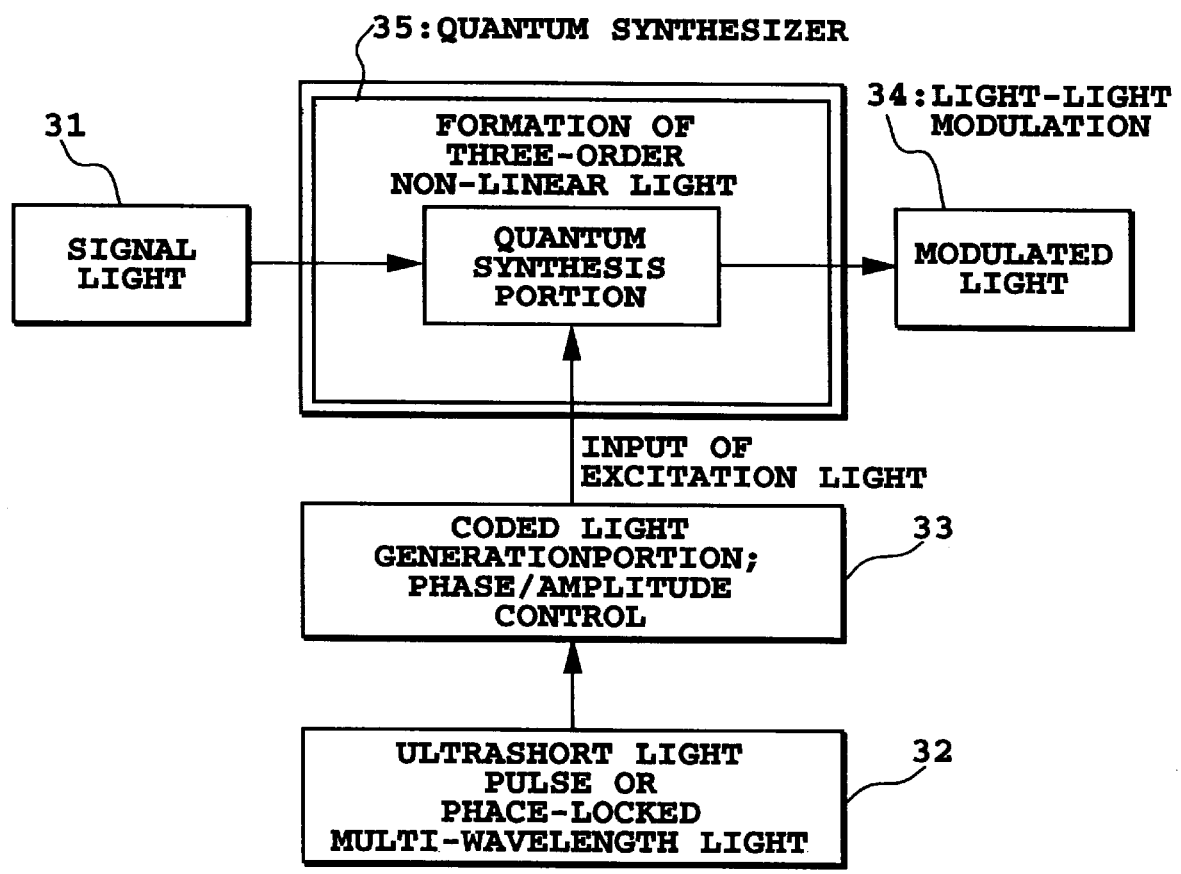

FIG. 23A is a block diagram illustrating an optical modulation device according to the present invention. Input light (signal light) 31 is inputted into a quantum synthesizer 35 having a quantum synthesis portion 1. Separately, control light 32 of the aforementioned coded ultrashort light pulse is inputted into the quantum synthesizer 35 after the phases and amplitudes of the control light are controlled at a control light coding portion 33. The input light 31 is modulated thereby to obtain modulated light 34.

Figure 23B:
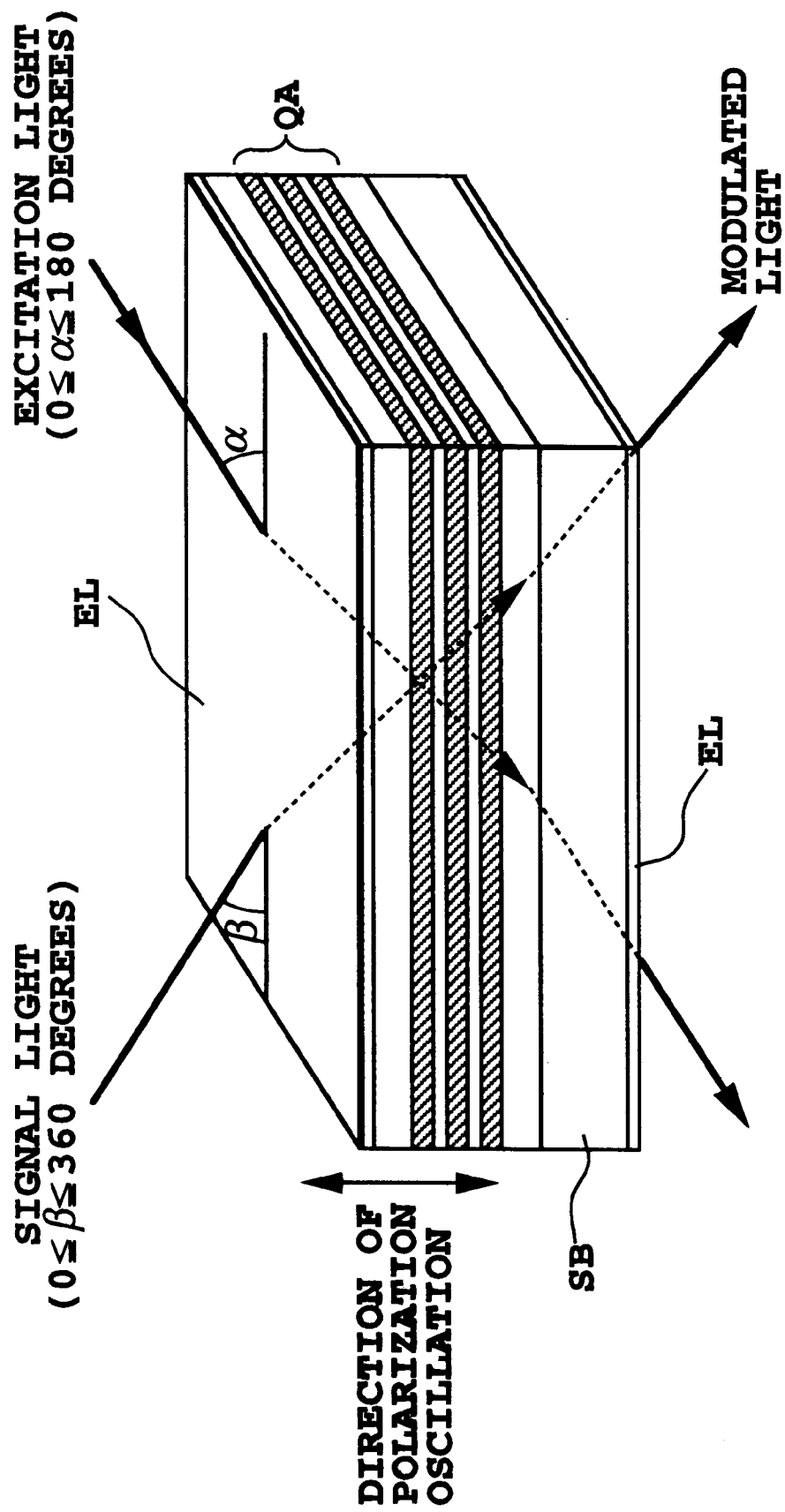

An example of concrete placement of the signal light and the control light is shown in FIG. 23B. On the surfaces of a quantum synthesis portion QA constructed by preparing a quantum structure on a substrate, semi-transparent electrodes EL are formed so as to permit optical input and output. The signal light is incident on the substrate surface at an angle, β (0≦β≦360 degrees). The excitation light is incident on the substrate at an angle, a (0≦a≦360 degrees). At this time, the input of the signal light and the excitation light in the same direction is advantageous because of a large length of interaction. However, if an electric field component of the signal light is existent in the same direction as the direction of polarization oscillation formed by the excitation light, the interaction between this polarization and the signal light (namely, optically controlled optical modulation) can be produced. The polarization excited by the excitation light oscillates spatially in the same direction as the direction of coupling of the quantum wells. By inputting signal light having an electric field component parallel to this direction of oscillation, the signal light can be modulated by this polarization oscillation.

Figure 23C:
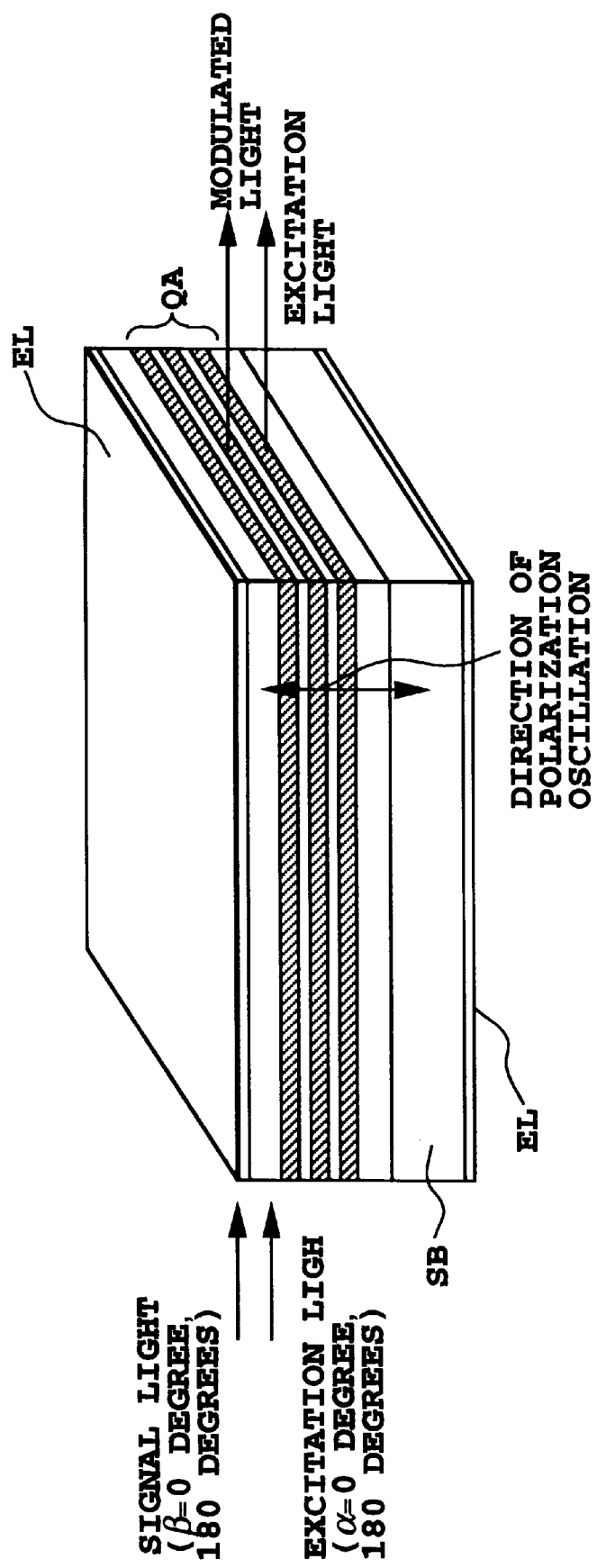

As shown in FIG. 23C, when signal light and excitation light are inputted from one end facet of the quantum synthesis portion, modulated light can be obtained from the other end facet.

Figure 24A:
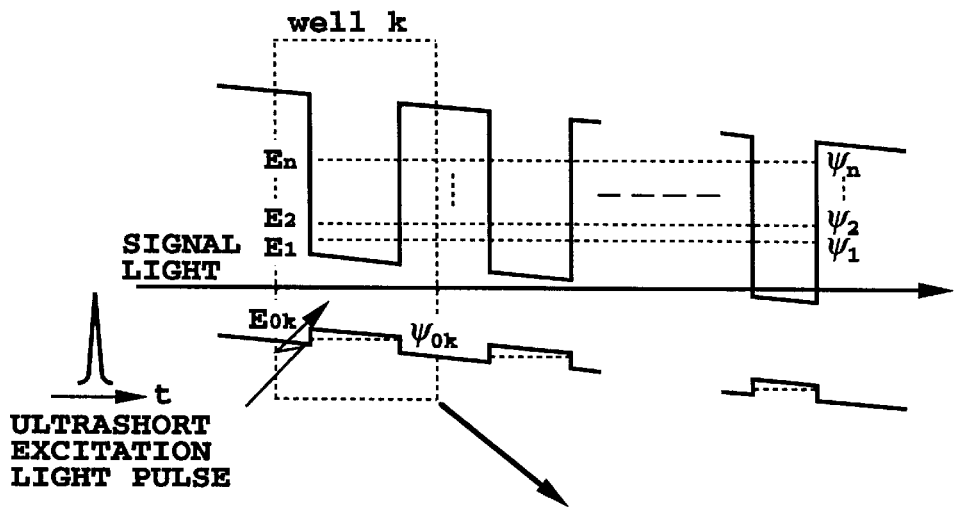
Figure 24B:
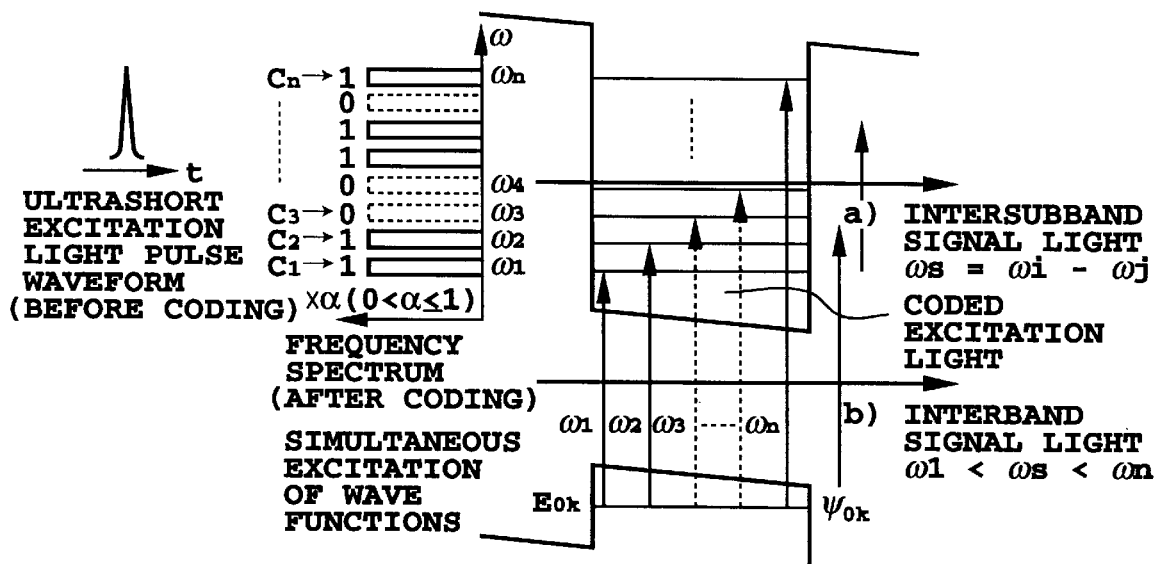

FIG. 24A shows an example of the band structure of an excited electron wave synthesis portion for illustrating the actions of the device. FIG. 24B is a partially enlarged view of the synthesis portion. As in the above-described embodiment, arbitrary wave functions ψ1, ψ2, . . . ψn can be synthesized. The synthetic wave function for electron wave synthesis reads as follows:

$$\psi = c1(\omega 1)\psi 1 + c2(\omega 2)\psi 2 + c3(\omega 3)\psi 3 + \ldots + cn(\omega n)\psi n \quad (6)$$

as in the preceding embodiment. Also the synthetic wave function for the polarization synthesis is expressed in Exp. (5.2). In accordance with the synthesis of this wave function, an arbitrary polarization of the electron-hole type can be formed. In the presence of electrons (holes) at the level, the light inputted is not absorbed. In the absence of electrons (holes) at the level, the light is absorbed. By making use of this nonlinearity of polarization, optically controlled optical modulation can be accomplished. The signal light 31 is available in two forms, light of a frequency, ωs, corresponding to an intersubband transition wavelength ($\omega s=\omega i-\omega j$), and light of a frequency, $\omega s$, corresponding to an interband transition wavelength ($\omega 1 \leq \omega s \leq \omega n$).

An embodiment of the coded excitation light generation portion will be described. Here, the term "coding" means to divide multi-wavelength light with a uniform phase into the respective frequency components, and modulate their phases and amplitudes responsive to the respective frequencies at the phase modulation part and the amplitude modulation part. The coding $c1(\omega 1)$, $c2(\omega 2)$, $c3(\omega 3)=0$, $k2$, 0, for instance, means modulation such that $c1(\omega 1)=0$ at frequency $\omega 1$, $c2(\omega 2)=k2$ ($0 \leq k2 \leq 1$) at frequency $\omega 2$, and $c3(\omega 3)=0$ at frequency $\omega 3$.

This coding can be performed by a method using an ultrashort light pulse, and a method using phase-locked multi-wavelength continuous light.

Figures 25A, 25B, 25C:
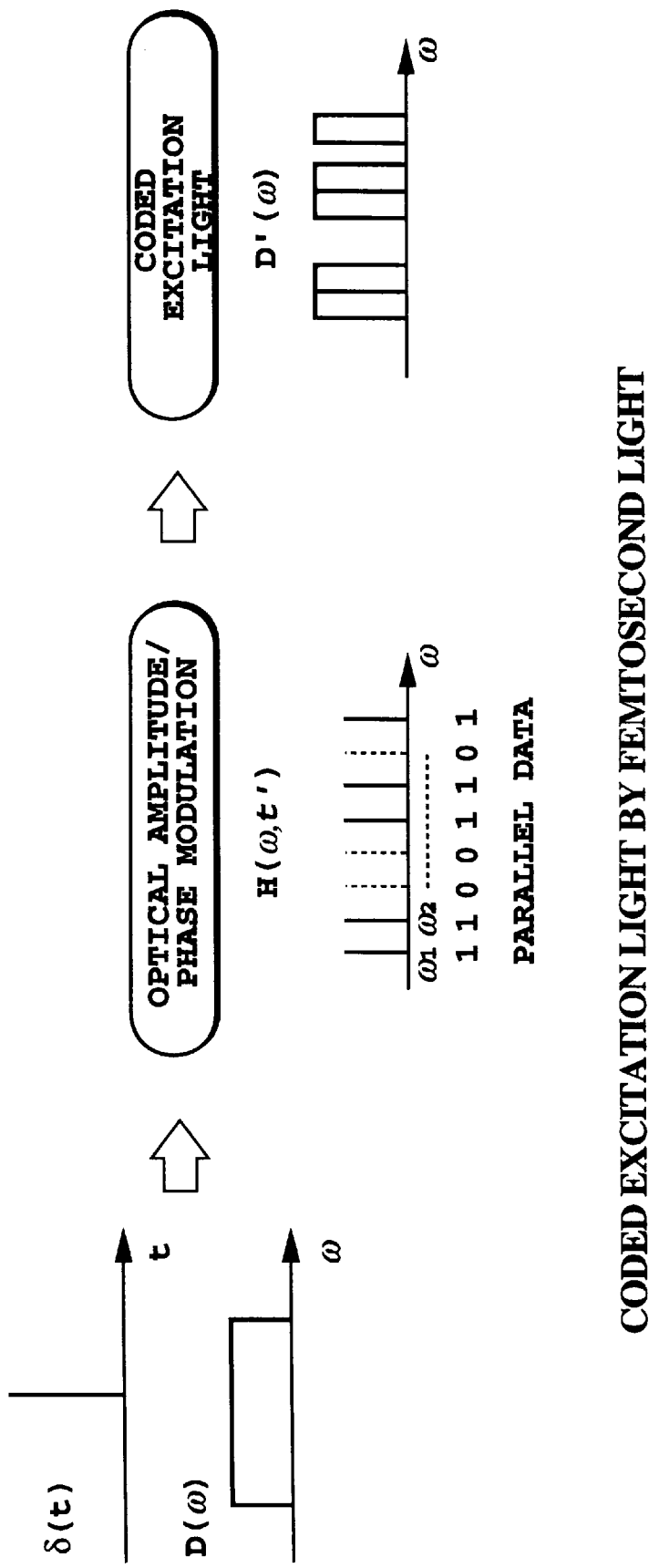
FIGS. 25A to 25C are diagrams illustrating the actions of an excitation light coding portion using an ultrashort optical pulse.

FIGS. 25A to 25C are diagrams illustrating the former method. The ultrashort light pulse, as shown in FIG. 25A, is very short in pulse width, but has a broad frequency spectrum covering the frequencies $\omega 1$ to $\omega n$. In addition, the phases of the respective frequencies are uniform. This light of the respective frequencies is divided, and the respective segments of the light are amplitude and phase modulated for the respective frequencies, as shown in FIG. 25B. FIG. 25B shows an embodiment in which light of the frequencies $\omega 1$, $\omega 2, \ldots, \omega n$ is amplitude modulated so that the amplitudes $(k,k, \ldots 0,0, \ldots k)=k \times (1,1 \ldots 0,0, \ldots 1)$, where $0 \leq k \leq 1$. As a result, coded excitation light as shown in FIG. 25C is inputted into the quantum synthesizer.

FIGS. 26A to 26C are diagrams illustrating the latter method, i.e., one using multi-wavelength continuous light. The respective light components with respective wavelengths of the multi-wavelength continuous light are synchronous in phase (phase locked), and uniform in phase or phase-correlated for one frequency $\omega 1$. This light is phase- and amplitude-modulated for the respective frequency components in the same manner as in FIG. 25B, as shown in FIG. 26B. Thus, phase/amplitude modulated excitation light as shown in FIG. 26C is obtained.

Figure 27A:
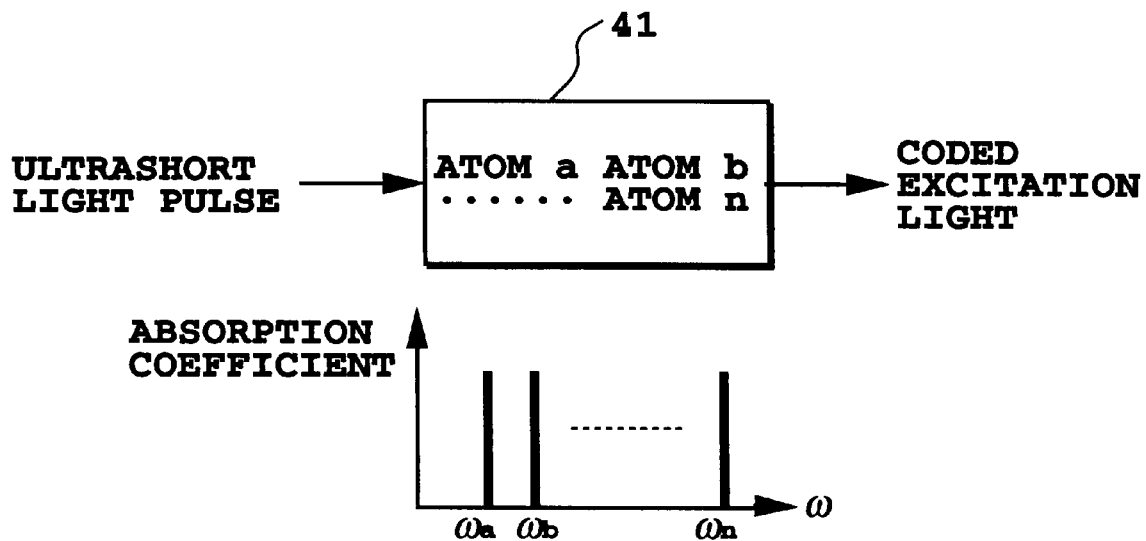
FIGS. 27A to 27C are diagrams illustrating the methods of phase- and amplitude-modulation the respective frequency components of ultrafast optical pulse or phase-locked multi-wavelength light.
Figure 27B:
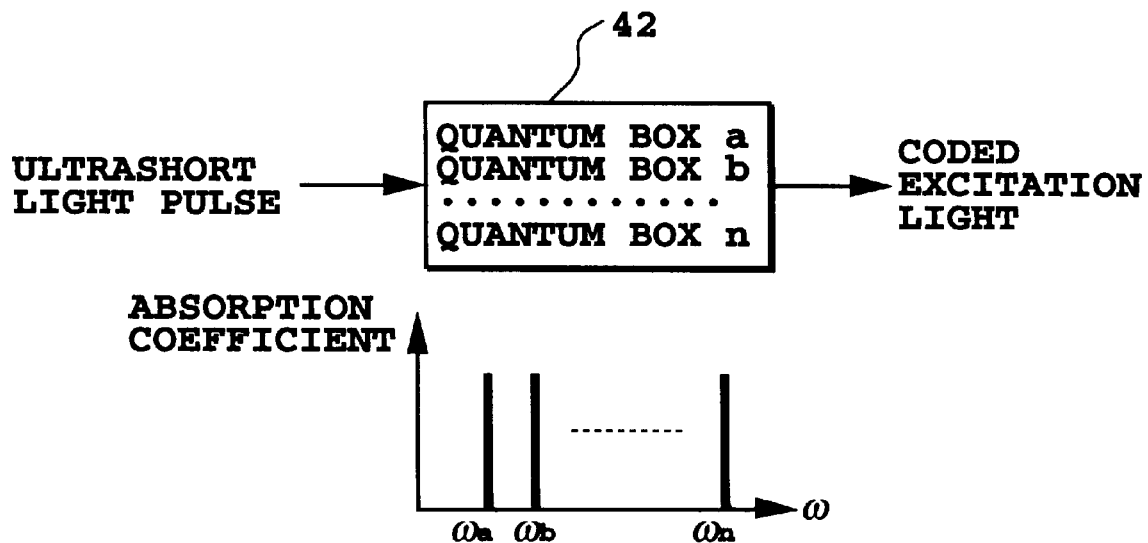

FIGS. 27A and 27B show embodiments in which input light having a broad spectrum of the wavelengths $\omega 1$ to $\omega n$ with same phase or with phase lock is modulated in terms of phase and amplitude in response to the predetermined frequency components in order to obtain coded light.

The embodiment of FIG. 27A is designed to use a space 41 accommodating a plurality of atoms which absorb light of specific wavelengths. The absorption line of these atoms is used as an optical filter to control the amplitudes of the respective frequencies of input light having a broad spectrum of the wavelengths $\omega 1$ to $\omega n$. By selecting the kind of the atom, the amplitude control can be achieved. By providing a slight difference between the absorption line and the frequency components of the incident light, i.e., detuning, phase modulation can be performed.

FIG. 27B shows the use of a space 42 accommodating a plurality of three-dimensionally quantized quantum boxes of different sizes instead of the atoms. By using the absorption lines of the different-sized quantum boxes at the respective quantum levels in the same manner as for the above-described absorption line of the atoms, it becomes possible to control the amplitudes of the respective frequencies of the input light.

Figure 27C:
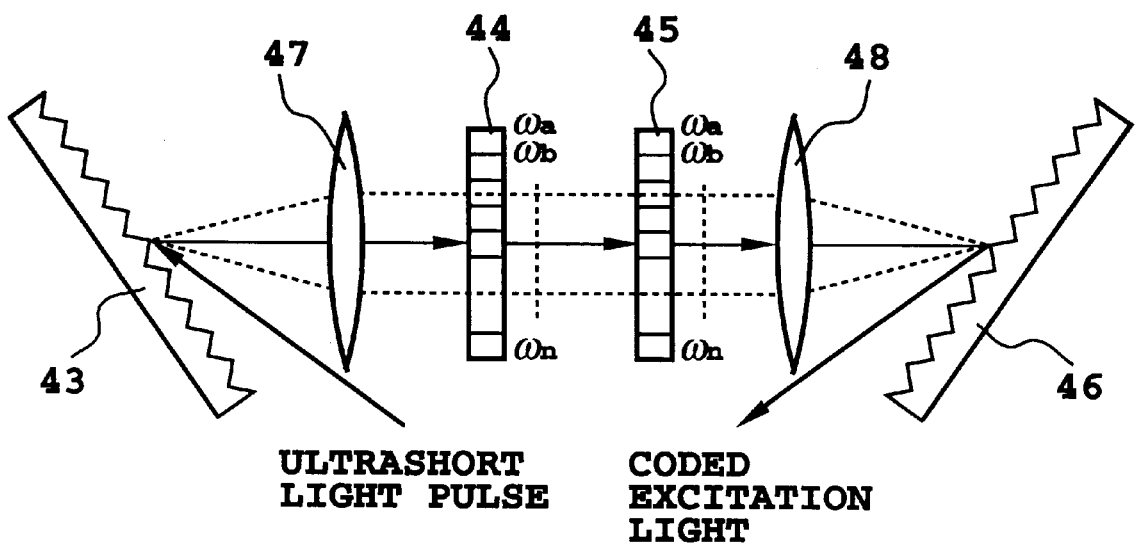

FIG. 27C shows a method using optical synthesizing technology. The frequency components of input light are spatially separated by a diffraction grating 43. An amplitude modulator 44 such as a spatial amplitude modulator, and a phase modulator (spatial phase modulator) 45 are placed at the positions where these frequency components are located. Finally, the spatially separated frequency components are combined by a diffraction grating 46 to form excitation light coded for the respective frequencies with their phases and amplitudes being controlled. The numeral 47 denotes a input lens, and the numeral 48, a output lens.

Figure 28A:
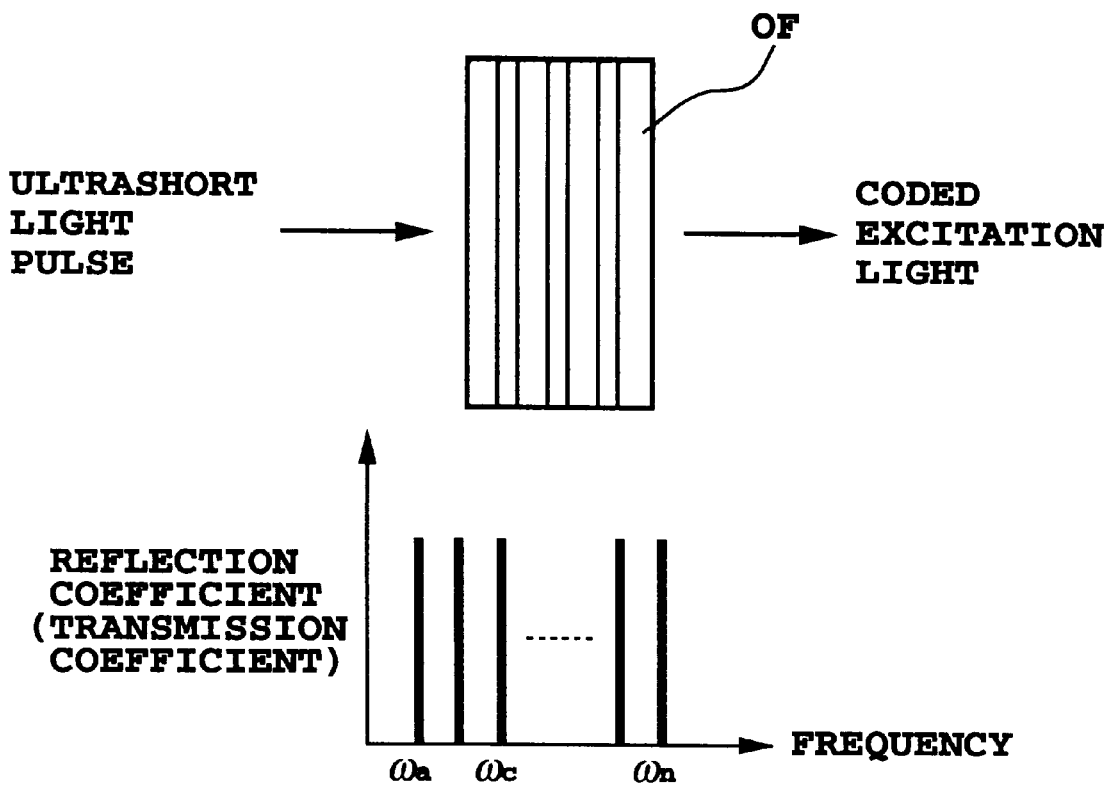
FIGS. 28A and 28B are diagrams illustrating the methods of phase- and amplitude-modulation by means of an optical frequency filter or a three-dimensional diffraction grating.
Figure 28B:
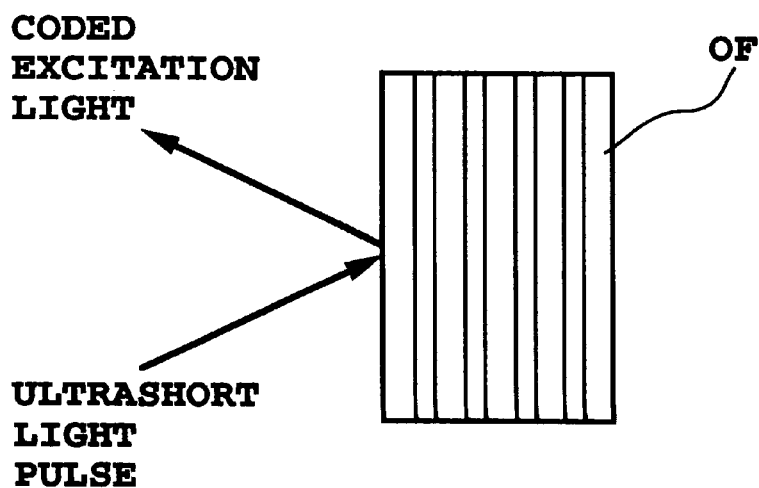

FIGS. 28A and 28B show the generation of coded excitation light by amplitude/phase modulating an ultrashort light pulse according to the respective frequencies with the use of a transmission type or reflection type optical frequency filter OF, typified by a Fabry-Pérot interferemeter or a diffraction grating. FIG. 28A shows the transmission type, and FIG. 28B, the reflection type. Reflecting mirrors reflective to light of specific frequencies, and transmissive to light of other frequencies are prepared for the frequencies ranging from $\omega 1$ to $\omega n$. By combining these mirrors, arbitrary amplitude modulation can take place. As for phase modulation, filters with different refractive indexes are combined for the respective wavelengths. Alternatively, since phase changes near the refractive index peak are great, a reflecting mirror with a slight detuning for Wi is used, thereby permitting phase modulation.

Furthermore, periodic mirrors comprising a periodic structure of the order of a wavelength formed in a semiconductor or a dielectric, i.e., two-dimensional periodic mirrors providing periodical changes in refractive index in a two-dimensional spatial direction, or three-dimensional periodic mirrors providing periodical changes in refractive index in a three-dimensional spatial direction, can also achieve arbitrary optical frequency filters by suitably selecting the periods. Thus, phase/amplitude modulation can be realized using the two-dimensional periodic mirror or the three-dimensional periodic mirror instead of the aforementioned filter.

Figure 29:
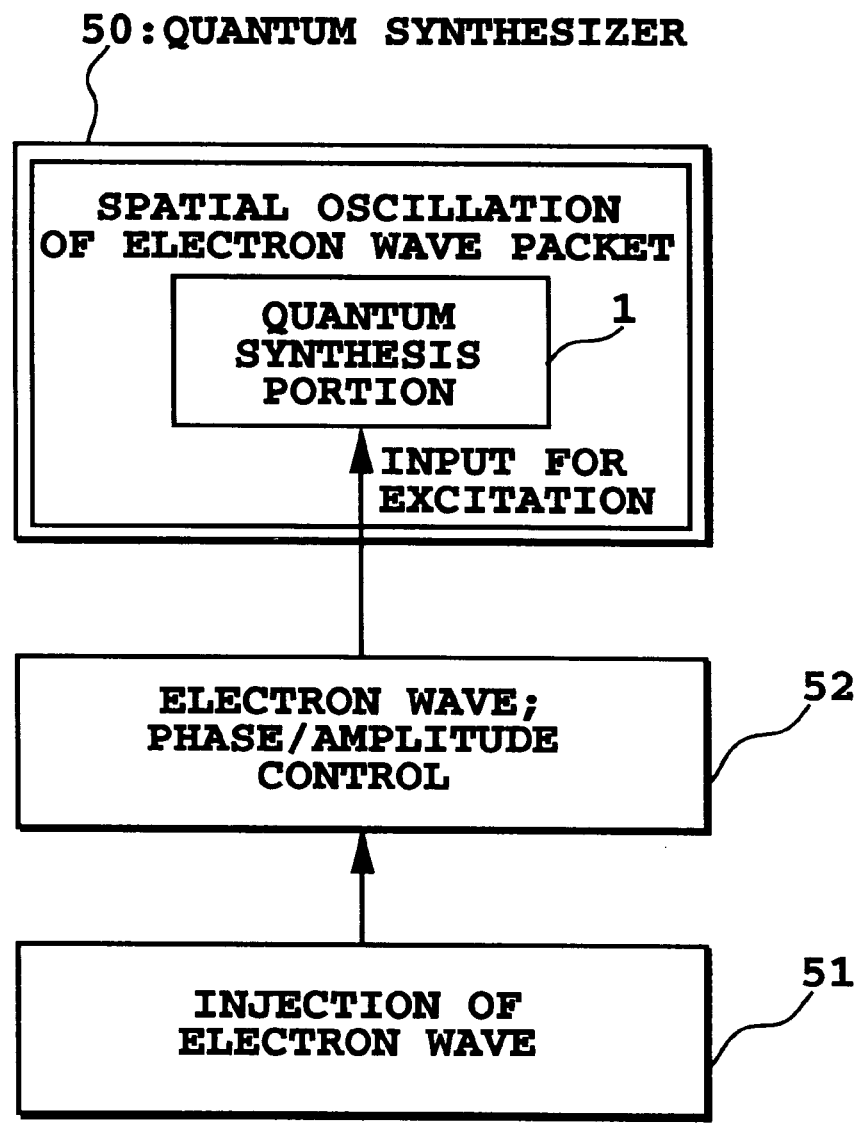
FIG. 29 is a block diagram illustrating a quantum synthesizer relying on electron wave excitation.

Quantum synthesizer, THz Electromagnetic Wave Generation and Electromagnetic Modulation by Electron Wave Excitation FIG. 29 is a block diagram illustrating an embodiment of a quantum synthesizer by injection of an electron wave. An electron wave from an electron wave source 51 is phase- and amplitude-controlled at a phase/amplitude control portion 52. The phase/amplitude-controlled electron wave is injected into a quantum synthesizer 50 having a quantum synthesis portion 1 to generate an arbitrary electron wave.

Figure 30:
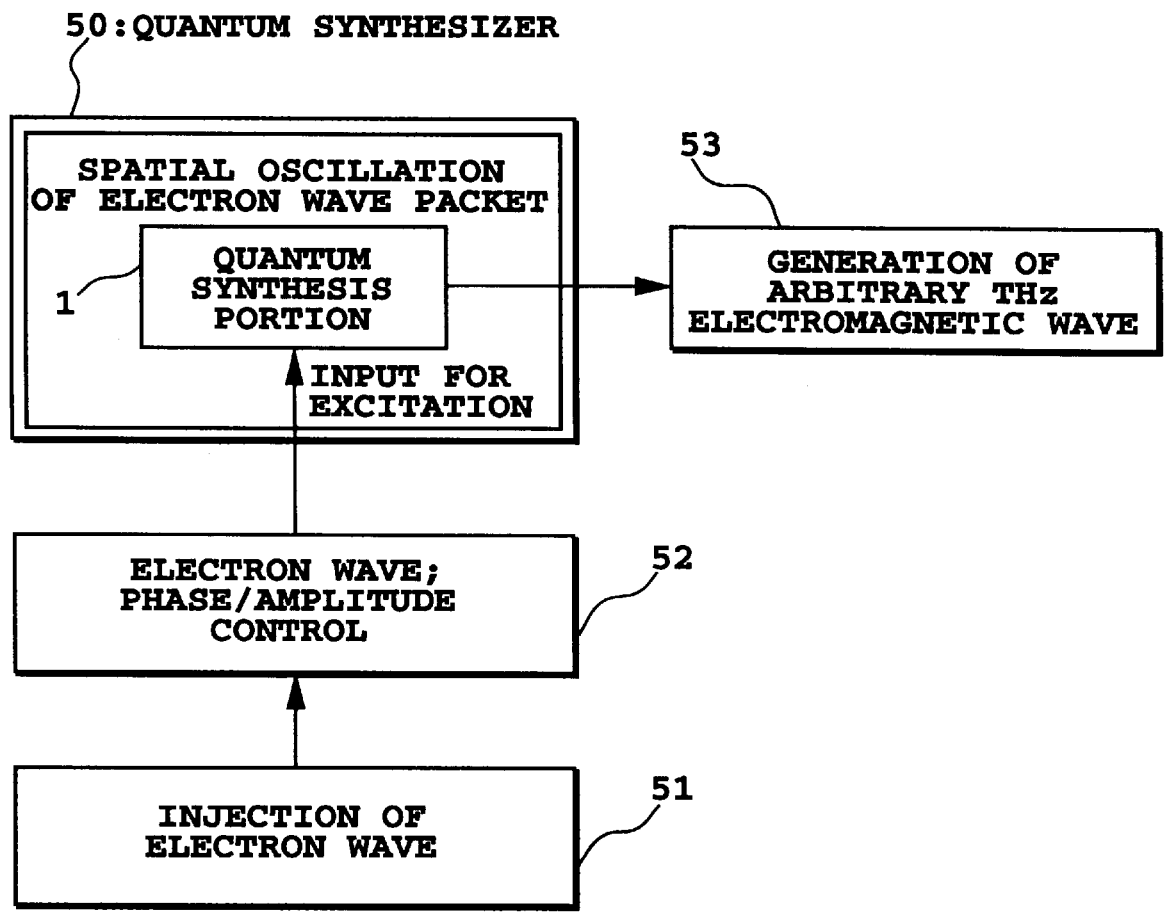
FIG. 30 is a block diagram illustrating the THz electromagnetic wave generation by electron wave excitation or injection.

FIG. 30 is a block diagram illustrating an embodiment of the generation of a THz electromagnetic wave by injection of an electron wave. An electron wave from an electron wave source 51 is phase- and amplitude-controlled at a phase/amplitude control portion 52. The phase/amplitude-controlled electron wave is injected into a quantum synthesizer 50 having a quantum synthesis portion 1 to generate an arbitrary THz electromagnetic wave 53.

Figure 31A:
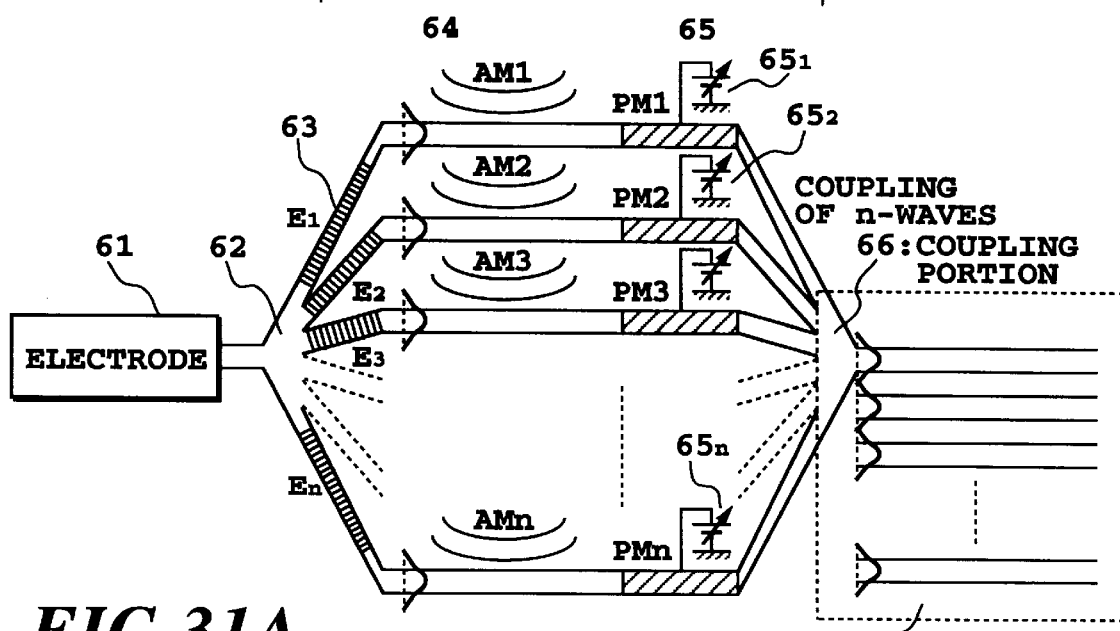
Figure 31B:
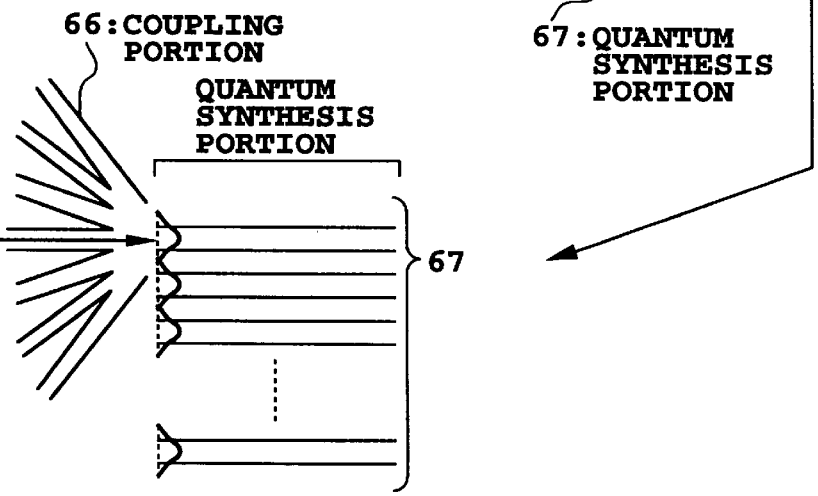
Figure 32A:
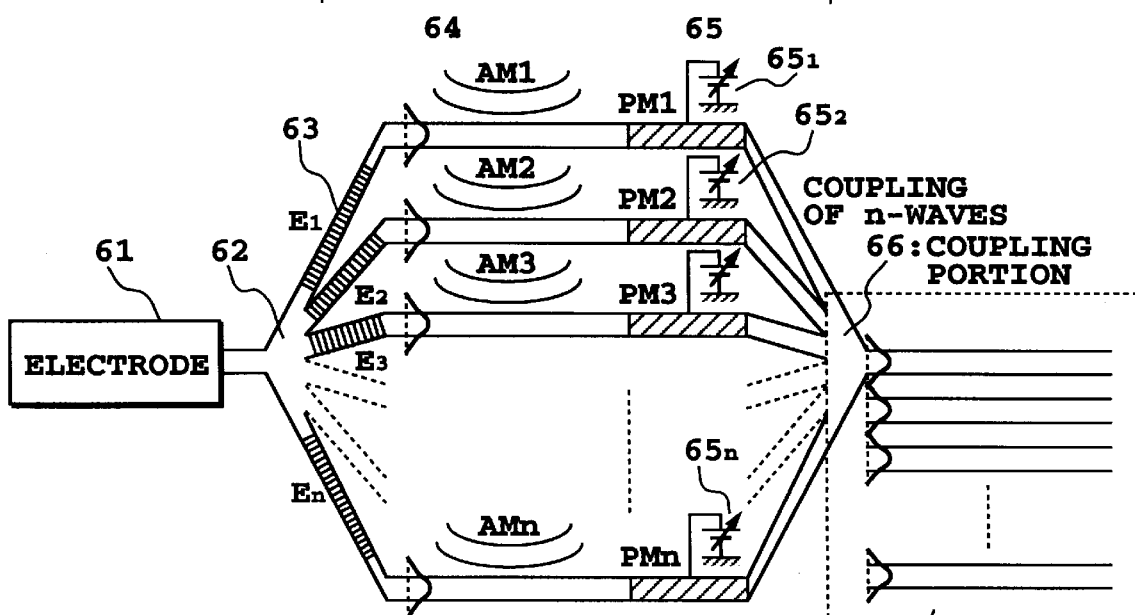
Figure 32B:
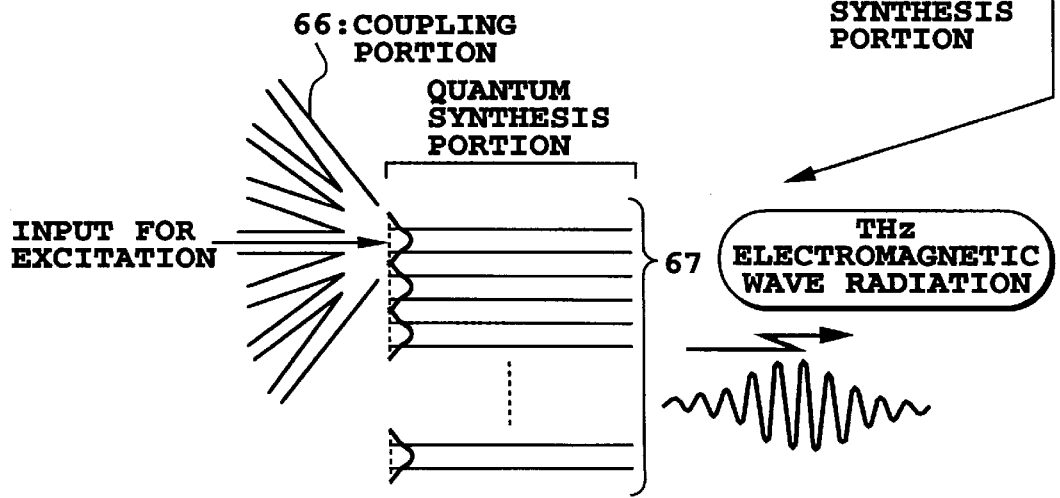

FIGS. 31A, 31B, 32A and 32B show embodiments of a quantum synthesizer and a THz electromagnetic wave generation device, respectively, by the electron wave excitation. FIG. 31A and FIG. 32A are schematic top views illustrating the entire structures of the two devices, respectively. FIG. 31B and FIG. 32B are schematic top views illustrating the quantum synthesis portions of the two devices, respectively. An electron wave with a broad energy distribution from an electrode 61 is injected into an n-branched electron waveguide 62. The electron waveguide is a waveguide on a semiconductor substrate or in a semiconductor for an electron wave that is confined in a two-dimensional direction by energy barriers, such as quantum wires, or depletions provided on a quantum well. The injected electron wave is divided at a band-pass filter portion 63 into electron waves $\psi_1, \psi_2, \ldots \psi_n$) corresponding to energies E1, E2, ... En. The electron waves of these energies are amplitude- and phase-modulated at amplitude modulation portions 64 (AM1, AM2, ... AMn) using electron wave directional couplers, and at modulation portions 65 (PM1, PM2, ... PMn) where electric fields are applied to give gradients to energy bands, thereby changing the confinement of electrons or the effective mass, thus resulting in changes in the phases of electrons. Then, the amplitude/phase modulated electron waves are combined at a combining portion 66, and fed into a coupled electron waveguide 67. The coupled electron waveguide 67, a quantum synthesis portion, comprises an n number of electron waveguides quantum-mechanically coupled together. Like multicoupled quantum wires, the respective electron waveguides each have the n number of levels. It suffices for the combined electron wave to input any one of these electron waveguides. This makes it possible to excite the electron wave in the coupled electron waveguide while controlling its phase and amplitude.

Assuming that the complex modulation constant for the electron wave with the energy Ei be ci, the combined wave function will be expressed as follows:

$$\psi = c_1(\omega_1)\psi_1 + c_2(\omega_2)\psi_2 + c_3(\omega_3)\psi_3 + \ldots + c_n(\omega_n)\psi_n \quad (7)$$

as in the case of optical excitation. By selecting its complex modulation vector $C=(c_1, c_2, \ldots c_i \ldots, c_n)$, spatial oscillation of an electron packet responsive to the synthesized wave function $\psi$ occurs in the electron waveguide. That is, an arbitrary wave function can be synthesized as with optical excitation. As a result of the spatial oscillation of the wave packet associated with the synthesis of the arbitrary wave function, it becomes possible to generate an electromagnetic wave having an arbitrary waveform and an arbitrary frequency, and generate an electromagnetic wave of a variable frequency.

In the foregoing description, the electron wave with the broad energy distribution from the electrode 61 can be obtained by utilizing electron emission from the emitter of a hot electron transistor or a tunnel transistor. To provide a phase correlation between the energies, an electron is emitted in an ultrashort time, as with optical excitation. As a result, an ultrashort electron wave pulse is formed on the time axis, which gives an electron wave with same phases and broadening energies on the frequency axis. In principle, an ultrashort electron wave pulse can be generated by switching on or off an optical gate type ultrafast transistor or switches with an ultrashort light pulse.

The band-pass filter can be realized by forming a diffraction grating corresponding to the wavelength of the electron wave on the electron waveguide, and utilizing its Bragg reflection. The amplitude modulation portion can be realized by use of an electron wave directional coupler. The phase modulation portion can be realized by giving a gradient to the band structure of the quantum wires under an electric field owing to the electric field effect, thereby changing the confinement or effective mass of electrons, thus equivalently causing a change in the propagation constant of the electron wave. Based on the assumption of the optical waveguide, an electron wave can be synthesized by merging the n number of electron waveguides into one guide, while a coupled waveguide can be formed by coupling together the n number of electron waveguides.

Figure 33:
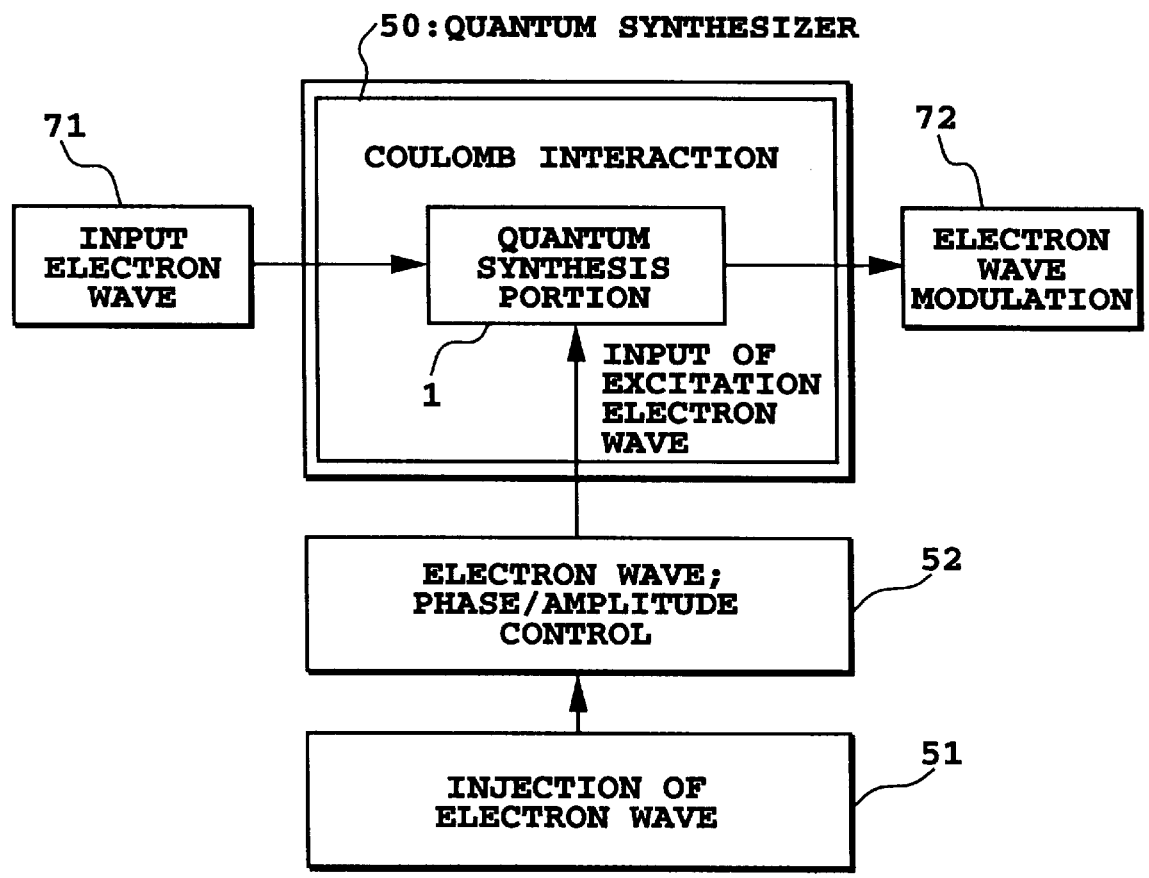
FIG. 33 is a block diagram illustrating the modulation of an electron wave according to the present invention.

FIG. 33 is a block diagram illustrating the modulation of an electron wave according to the present invention. A signal input electron wave 71 is inputted into a quantum synthesizer 50. Separately, an electron wave from an electron wave source 51 is phase- and amplitude-controlled at a phase/amplitude control portion 52. The phase/amplitude-controlled electron wave is injected into the quantum synthesizer 50 to obtain a modulated electron wave 72.

Figure 34:
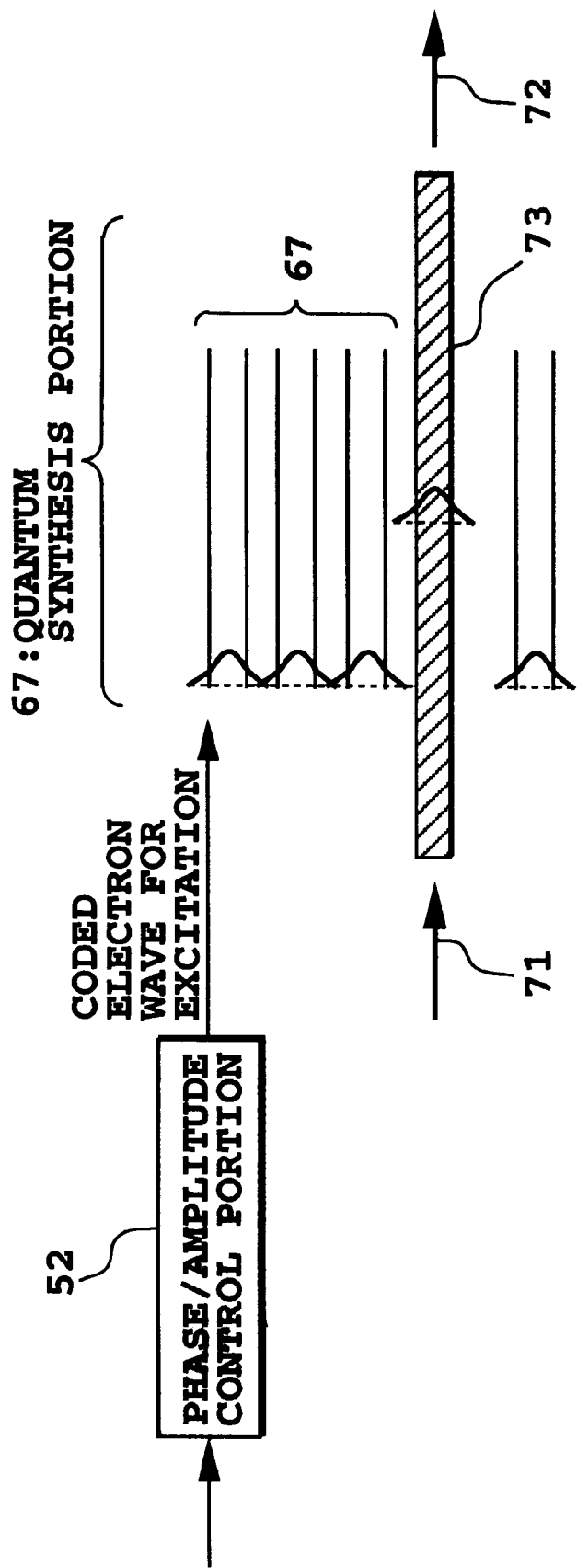
FIG. 34 is a diagram illustrating an embodiment of electron wave modulation.

FIG. 34 shows an embodiment of electron wave modulation. A signal input electron wave 71 is inputted into a signal electron waveguide 73. Separately, a phase/amplitude-controlled electron wave is inputted into the aforementioned coupled electron waveguide (quantum synthesis portion) 67. At the quantum synthesis portion 67, spatial oscillation (charge oscillation) of an arbitrary controllable electron wave occurs.

The resulting Coulomb interaction between the charge oscillation and the charge of the input electron results in the modulation of the signal electron wave, and a modulated electron wave 72 is produced from the signal electron waveguide 73.

(II) Examples of Integrated Type Quantum Synthesizer

An embodiment of an integrated quantum synthesizer according to the invention will be described.

Figure 35:
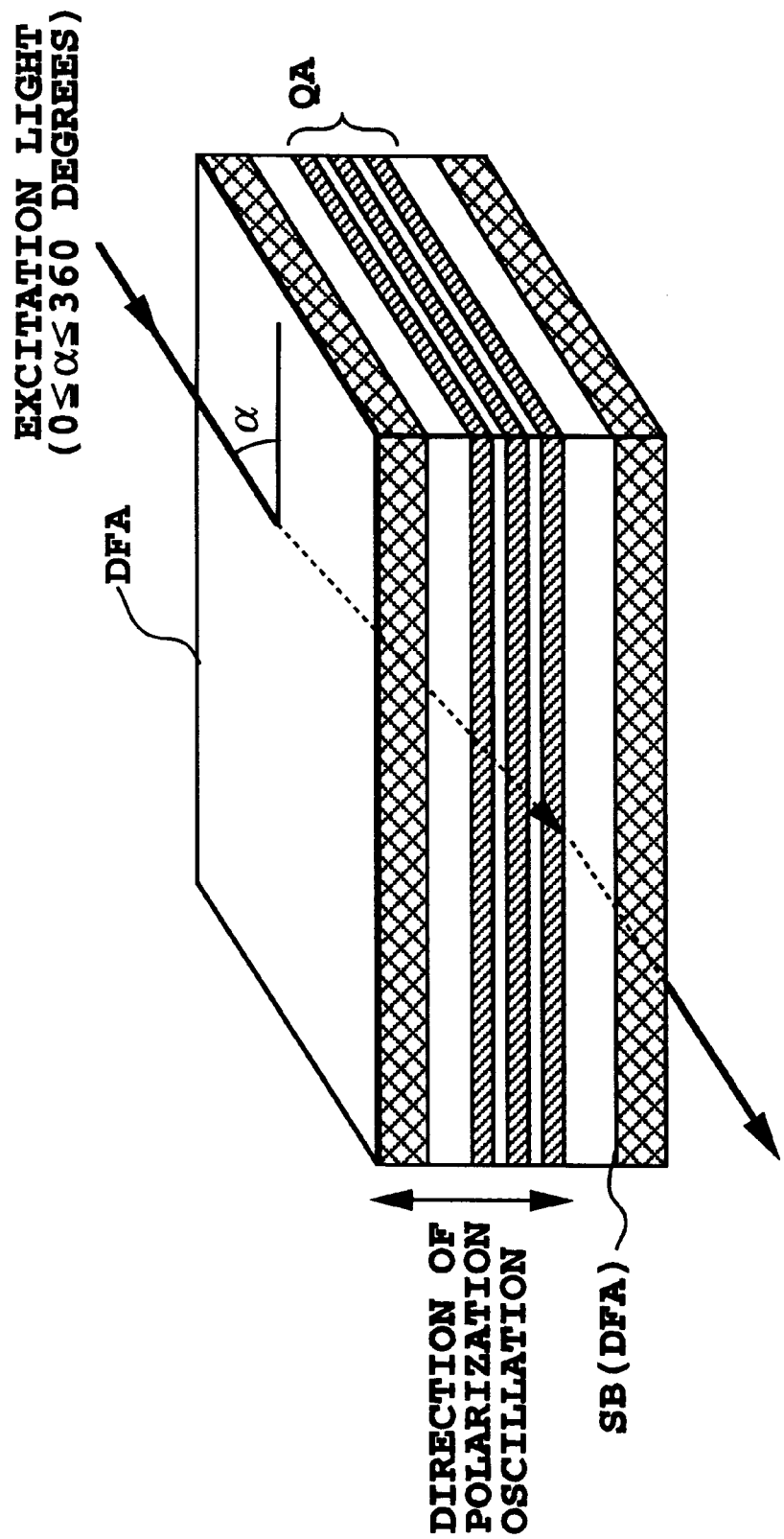
FIG. 35 is a perspective view of an embodiment of an integrated quantum synthesizer according to the invention.
Figure 36C:
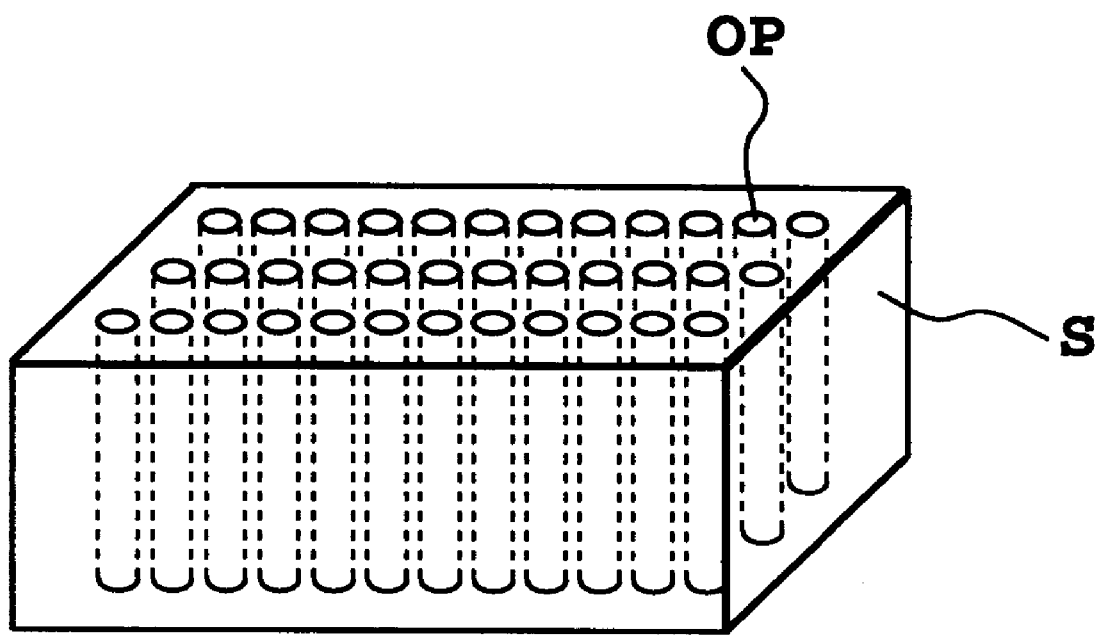

In the quantum synthesizers shown in FIGS. 6 and 23A to 23C, the quantum synthesizer portion and the coded excitation light generation portion are independently constructed (independent type). However, an integrated quantum synthesizer having these portions integrally constructed is also achievable. Its embodiment is shown in FIGS. 35 and 36A to 36C. FIG. 35 shows an integrated quantum synthesizer comprising an integrated phase/amplitude modulation mirror (e.g., a one-dimensional periodic mirror having the periodicity of a refractive index distribution in a one-dimensional direction, such as a multi-layer dielectric mirror; a two-dimensional periodic mirror having the periodicity of a refractive index distribution in a two-dimensional direction; a three-dimensional periodic mirror having the periodicity of a refractive index distribution in a three-dimensional direction) DFA (DFB) on the face of, or on the face and back of, a quantum synthesizer having a quantum synthesis portion QA. FIG. 36A shows an integrated optically controlled optical modulation device. The quantum synthesis portion can be produced, for example, as shown in FIGS. 15A and 15B. The input of excitation light into the integrated device can be performed in the same manner as for the independent type. That is, excitation light is inputted at angle $\alpha$ ($0° \leq \alpha \leq 360°$), then light is modulated and coded through integrated phase/amplitude modulation mirror, and this coded light inputs into quantum synthesis portion, and a polarization is synthesized at the quantum synthesis portion. With the optically controlled optical modulation device, signal light is inputted at $\beta$ ($0° \leq \beta \leq 360°$) to the three-dimensional periodic mirror on the substrate surface, then light is modulated and coded through integrated phase/amplitude modulation mirror, and this coded light inputs into quantum synthesis portion, and is modulated by the synthetic polarization. FIG. 36B shows an integrated THz electromagnetic wave generation device comprising a three-dimensional periodic mirror DFA (DFB) integrated on the face of, or on the face and back of, a quantum synthesis portion. An ultrashort light pulse or phase-locked multi-wavelength light is inputted from the surface of the device to generate a THz electromagnetic wave. In FIGS. 35, 36A and 36B, the three-dimensional periodic mirror DFA acts as a coded excitation light generation portion, with the result that coded excitation light occurs after output from the three-dimensional periodic mirror and input in quantum synthesis portion. The quantum synthesis portion is excited with this excitation light. The underside of the quantum synthesizer is a substrate SB in the case of the passing type, but the three-dimensional periodic mirror DFB in the case of the resonator type. Their structures and actions will follow.

[Single Pass Type]

The three-dimensional diffraction grating DFA is integrated only on top of the quantum synthesizer, and the underside of the device is only the substrate SB. Light inputting from the device surface is converted into coded excitation light by the three-dimensional periodic mirror DFA. This excitation light passes through the quantum synthesis portion only once.

[Resonator Type]

Three-dimensional period mirrors DFA are integrated on top of and on the underside of the quantum synthesizer. Light inputting from the device surface passes through the three-dimensional periodic mirror DFA, and inputs the quantum synthesis portion. Further, this light is reflected by the lower periodic mirror DFB, and returned to the upper diffraction grating DFA. That is, the excitation light after passing through the three-dimensional periodic mirror DFA reciprocates several times between the upper and lower periodic mirrors DFA and DFB, periodically exciting the quantum synthesis portion. This translates into the placement of the quantum synthesis portion in the resonator composed of the three-dimensional periodic mirrors DFA and DFB. Since the coded excitation light is determined by the transmission characteristics of the resonator, precise control of phase/amplitude modulation (high resolution in frequency domain) on the frequency axis becomes possible.

FIG. 36C shows an example of a photonic band, as a three-dimensional periodic mirror, prepared by periodically forming holes OP of the order of a wavelength in a semiconductor or a dielectric S. A photonic crystal, a crystal having a periodic structure of the order of a wavelength, is also usable.

Figure 37:
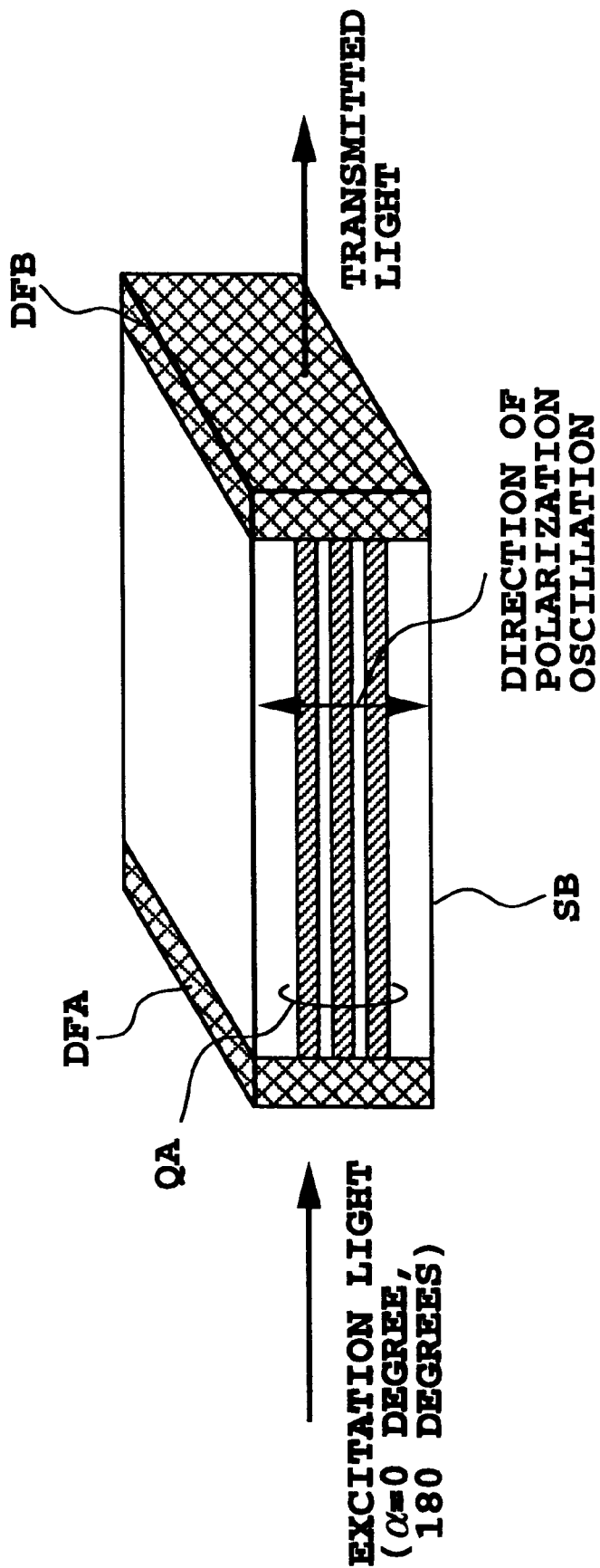
FIG. 37 is a perspective view of an embodiment of an integrated quantum synthesizer according to the invention.
Figure 38B:
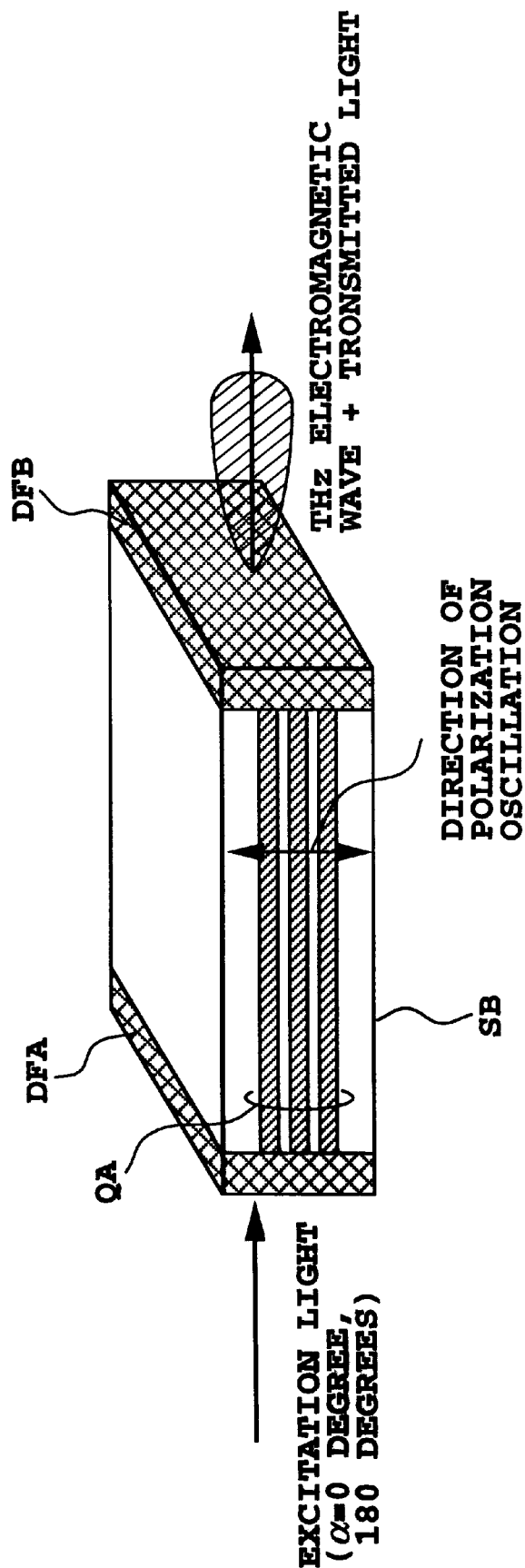

FIG. 37 shows an embodiment of a quantum synthesizer of the end-faceted input type having periodic mirrors DFA and DFB on the end facets. FIG. 38A shows an embodiment of an end-faceted input type optically controlled optical modulation device, while FIG. 38B shows an embodiment of an end-faceted incidence type THz electromagnetic wave generation device. In the embodiments shown in FIGS. 37, 38A and 38B, too, a transmission type structure having a periodic mirror only on the input side, and a resonator type structure having periodic mirrors on both of the input side and the exit side are feasible.

The methods of integration include a method of growing a crystal layer for a diffraction grating on a quantum synthesizer, and processing it three-dimensionally, and a method of preparing a periodic mirror separately, and then bonding the periodic mirror together.

As described above, the present invention permits the synthesis of an arbitrary wave function that has been impossible. Thus, the invention makes it possible to form an arbitrary polarization, generate an electromagnetic wave having an arbitrary waveform and an arbitrary frequency, and generate an electromagnetic wave of a variable frequency. Furthermore, the use of a time evolution and a spatial change in the arbitrary wave function, and the use of changes in refractive index and light absorption associated therewith, make it possible to achieve an optical modulation device and an electron wave modulation device, of the light-control type.

While the present invention has been described with reference to the preferred embodiments, it is to be understood that the invention is not limited thereby, but any changes and modifications are possible without departing from the spirit and scope of the invention.

What is claimed is:

1. A quantum synthesizer having a quantum synthesis portion comprising a number, n (n=an integer of 3 or more), of quantum wells provided in proximity to each other so as to be coupled together quantum-mechanically, said quantum synthesis portion having the n number or number larger than n of coupled levels as a result of coupling, said quantum synthesizer being adapted to excite and synthesize the electron waves or polarizations of each of said coupled levels, while controlling the phase and amplitude of the electron wave or polarization in each of said coupled levels, by means of coded light with phases and amplitudes controlled for predetermined frequencies.

2. The quantum synthesizer as claimed in claim 1, wherein each of said n number (n=an integer of 3 or more) of quantum wells is a quantum wire, a quantum box, an atom or a molecule.

3. A THz electromagnetic wave generation device comprising a quantum synthesizer having a quantum synthesis portion including a number, n (n=an integer of 3 or more), of quantum wells provided in proximity to each other so as to be coupled together quantum-mechanically, said quantum synthesis portion having the n number or number larger than n of coupled levels as a result of coupling, said quantum synthesizer being adapted to excite and synthesize the electron waves or polarizations of each of said coupled levels, while controlling the phase and amplitude of the electron wave or polarization in each of said coupled levels, by means of coded light with phases and amplitudes controlled for predetermined frequencies, thereby generating a THz electromagnetic wave having a frequency distribution or waveform corresponding to said coded light.

4. The THz electromagnetic wave generation device as claimed in claim 3, wherein each of said n number of quantum wells is a quantum wire, a quantum box, an atom or a molecule.

5. An optical modulation device comprising a quantum synthesizer having a quantum synthesis portion including a number, n (n=an integer of 3 or more), of quantum wells provided in proximity to each other so as to be coupled together quantum-mechanically, said quantum synthesis portion having the n number of number larger than n of coupled levels as a result of coupling, said quantum synthesizer being adapted to excite and synthesize the electron waves or polarizations of each of said coupled levels, while controlling the phase and amplitude of the electron wave or polarization in each of said coupled levels, by means of coded light with phases and amplitudes controlled for predetermined frequencies; means for inputting signal light into said quantum synthesizer; and means for inputting control light for modulating said signal light into said quantum synthesizer, said control light being a coded ultrashort light pulse or a coded phase-locked multi-wavelength light.

6. The optical modulation device as claimed in claim 5, wherein each of said n number of quantum wells is a quantum wire, a quantum box, an atom or a molecule.

7. A wave generation device comprising:
   control means for selectively modulating the amplitude and phase of discrete energy levels of an electron wave so as to produce a coded electron wave; and
   a quantum synthesizer having a quantum synthesis portion including a number, n (n=an integer of 3 or more), of electron waveguides provided in proximity to each other so as to be coupled together quantum-mechanically, said quantum synthesis portion having the n number or number larger than n of coupled levels as a result of coupling, said quantum synthesizer being configured to receive said coded electron wave into at least one of said electron waveguides of said quantum synthesis portion and then synthesize said coded electron wave so as to produce a wave having a predetermined wave form and frequency controlled by said coded electron wave.

8. A THz electromagnetic wave generation device comprising:

control means for selectively modulating the amplitude and phase of discrete energy levels of an electron wave so as to produce a coded electron wave; and a quantum synthesizer including a quantum synthesis portion having a number, n (n=an integer of 3 or more), of electron waveguides provided in proximity to each other so as to be coupled together quantum-mechanically, said quantum synthesis portion having the n number or number larger than n of coupled levels as a result of coupling, said quantum synthesizer being configured to receive said coded electron wave into at least one of said electron waveguides of said quantum synthesis portion and then synthesize said coded electron wave so as to generate a THz electromagnetic wave.

9. A THz electromagnetic wave generation device as recited in claim 8, wherein the quantum synthesizer is configured such that the generated THz electromagnetic wave has a predetermined wave form and frequency controlled by said coded electron wave.

10. An electron wave modulation device comprising:

a quantum synthesizer having a quantum synthesis portion comprising a number, n (n=an integer of 3 or more), of electron waveguides provided in proximity to each other so as to be coupled together quantum-mechanically, each of said n number of electron waveguides having the n number or number larger than n of coupled levels as a result of coupling, the quantum synthesizer being adapted to input excitation electron waves with phases and amplitudes controlled for predetermined energies into at least one of said electron waveguides of said quantum synthesis portion and then synthesize said excitation electron waves;

means for inputting an electron wave as a signal wave into said quantum synthesizer; and means for inputting a control electron wave for modulating said signal electron wave into said quantum synthesis portion, said control electron wave being an electron wave with controlled phases and amplitudes.

* * * * *

UNITED STATES PATENT AND TRADEMARK OFFICE
CERTIFICATE OF CORRECTION

PATENT NO. : 5,937,118
DATED : Aug. 10, 1999
INVENTOR(S) : Kazuhiro Komori

It is certified that error appears in the above-identified patent and that said Letters Patent is hereby corrected as shown below:

Cover Page, Title, line 1, after "SYNTHESIZER," change "THZ" to --THz--

Cover Page, References Cited, right column, line 2, after "of" change "aLight" to --a Light--

Col. 1, line 50, after "width" change "wB" to --$w_B$--

Col. 2, line 20, after "example" insert --of--

Col. 2, line 32, after "applied" insert --to--

Col. 2, line 48, before "an" delete "by"

Col. 3, line 20, after "having" change "an" to --a--

Col. 3, line 24, after "has" insert --been--

Col. 13, line 67, after "atoms" change "needs" to --need--

Col. 18, line 5, after "denotes" change "a" to --an--

Signed and Sealed this

Eighth Day of August, 2000

*Attest:*

Q. TODD DICKINSON

*Attesting Officer*    *Director of Patents and Trademarks*